United States Patent
Chang et al.

(10) Patent No.: US 8,749,022 B2
(45) Date of Patent: Jun. 10, 2014

(54) CAPACITOR DEVICE AND METHOD OF FABRICATING THE SAME

(75) Inventors: Dong-Ryul Chang, Suwon-si (KR); Hwa-Sook Shin, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 250 days.

(21) Appl. No.: 13/156,371

(22) Filed: Jun. 9, 2011

(65) Prior Publication Data

US 2012/0043595 A1 Feb. 23, 2012

(30) Foreign Application Priority Data

Aug. 19, 2010 (KR) .................. 10-2010-0080407

(51) Int. Cl.
  *H01L 21/02* (2006.01)
(52) U.S. Cl.
  USPC ............ 257/532; 257/E27.034; 257/E27.048; 327/537; 327/390; 327/391; 327/594; 361/306.2; 438/381; 438/393; 438/394; 438/396; 438/957
(58) Field of Classification Search
  USPC ................. 257/532, 534, 535, 734, 773, 774, 257/E27.016, E27.034, E27.048, E25.014, 257/E25.025; 361/306.2; 327/537, 594, 327/390, 391; 438/381, 393, 394, 396, 957
  See application file for complete search history.

(56) References Cited

U.S. PATENT DOCUMENTS

| | | | | | |
|---|---|---|---|---|---|
| 5,386,135 | A | * | 1/1995 | Nakazato et al. | 257/369 |
| 5,914,505 | A | * | 6/1999 | Hisada et al. | 257/207 |
| 6,175,136 | B1 | * | 1/2001 | Okamura | 257/369 |
| 6,528,842 | B1 | * | 3/2003 | Luich et al. | 257/315 |
| 7,301,217 | B2 | * | 11/2007 | Chung | 257/532 |
| 2004/0217426 | A1 | * | 11/2004 | Lee | 257/369 |
| 2007/0252217 | A1 | * | 11/2007 | Oki | 257/369 |

FOREIGN PATENT DOCUMENTS

| | | |
|---|---|---|
| JP | 2006-115185 A | 4/2006 |
| JP | 2008-244403 A | 10/2008 |
| KR | 10-2001-0038008 A | 5/2001 |
| KR | 10-2004-0053844 A | 6/2004 |

* cited by examiner

*Primary Examiner* — Eduardo A Rodela
(74) *Attorney, Agent, or Firm* — Lee & Morse, P.C.

(57) ABSTRACT

A capacitor device includes a substrate including a first well having a first conductivity type and a first voltage applied thereto and a second well having a second conductivity type and a second voltage applied thereto; and a gate electrode disposed on an upper portion of the first well or an upper portion of the second well in such a way that the gate electrode is insulated from the first well or the second well, wherein capacitances of the capacitor device include a first capacitance between the first well and the second well and a second capacitance between the first well or the second well and the gate electrode.

61 Claims, 29 Drawing Sheets

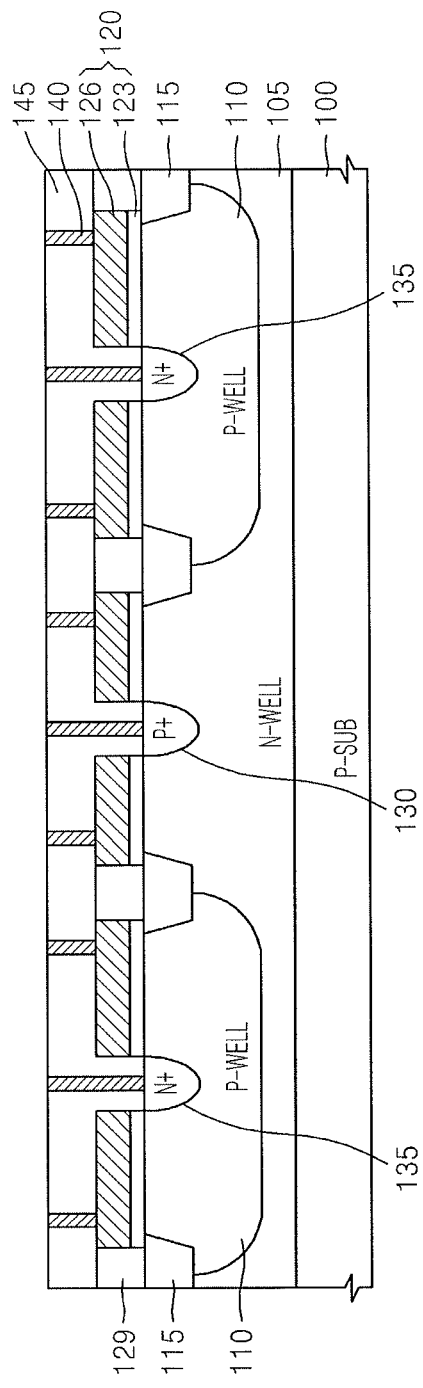
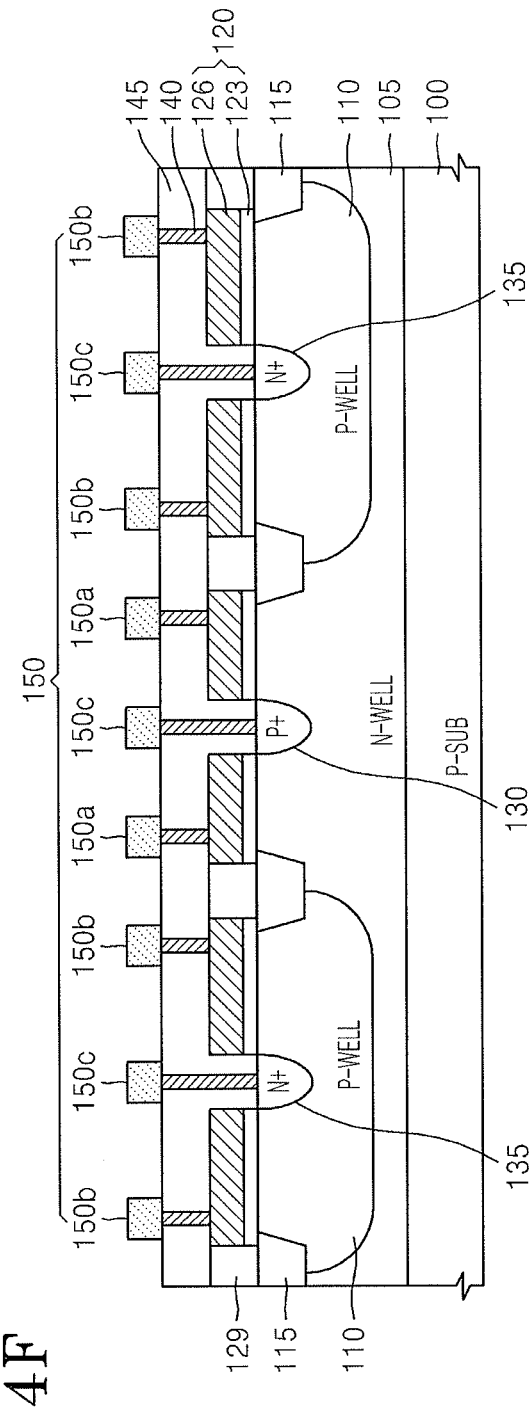

CAPACITOR DEVICE AND METHOD OF FABRICATING THE SAME

BACKGROUND

1. Field

Embodiments relate to a semiconductor device, and more particularly, to a capacitor device and a method of fabricating the capacitor device.

2. Description of the Related Art

In a region of a peripheral circuit, such as a system large scale integration (LSI) circuit, a fast processing speed or a large number of embedded elements may cause parasitic inductance, etc. Thus, electromagnetic interference (EMI) or variation of a power voltage, i.e., power noise, may occur, which seriously affects reliability of products. To solve such problems, a capacitor element may be inserted between a power wiring and a ground wiring.

SUMMARY

An embodiment is directed to a capacitor device having a plurality of capacitances, the capacitor device including a substrate including a first well and a second well, the first well having a first conductivity type and having a first voltage applied thereto, and the second well having a second conductivity type and having a second voltage applied thereto; and a gate electrode disposed on an upper portion of the first well or an upper portion of the second well such that the gate electrode is insulated from the first well or the second well. The plurality of capacitances may include a first capacitance and a second capacitance, the first capacitance being between the first well and the second well, and the second capacitance being between the first well or the second well and the gate electrode.

The gate electrode may includes at least one first gate electrode disposed over the upper portion of the first well and having the second voltage applied thereto; and at least one second gate electrode disposed over the upper portion of the second well and having the first voltage applied thereto. The plurality of capacitances may include the first capacitance, the second capacitance, and a third capacitance, the third capacitance being between the at least one first gate electrode and the at least one second gate electrode.

The at least one first gate electrode may include at least two first gate electrodes, and the at least one second gate electrode includes at least two second gate electrodes, and a gap between the at least one second gate electrode and the at least one first gate electrode may be smaller than a gap between the at least two first gate electrodes and may be smaller than a gap between the at least two second gate electrodes.

The capacitor device may further include a first conductive layer, the first conductive layer including at least one first wiring electrically connected to the at least one first gate electrode and at least one second wiring electrically connected to the at least one second gate electrode, The plurality of capacitances may include the first through third capacitances and a fourth capacitance, the fourth capacitance being between the at least one first wiring and the at least one second wiring.

The capacitor device may further include a first impurity region disposed in the first well and having the second conductivity type; and a second impurity region disposed in the second well and having the first conductivity type.

The second voltage may be applied to the first impurity region and the first voltage is applied to the second impurity region, and the plurality of capacitances may include the first through fourth capacitances and a fifth capacitance, the fifth capacitance being a sum of a capacitance between the first well and the first impurity region and a capacitance between the second well and the second impurity region.

The first conductive layer may further include a plurality of third wirings electrically connected to the first and second impurity regions, respectively, and a gap between the at least one second wiring and the at least one first wiring may be smaller than a gap between the at least one first wiring or the at least one second wiring and one of the plurality of third wirings which is adjacent to the at least one first wiring or the at least one second wiring.

The first voltage may be applied to the first impurity region and the second voltage may be applied to the second impurity region, and the plurality of capacitances may include the first through fourth capacitances.

The first conductive layer may further include a plurality of third wirings electrically connected to the first and second impurity regions, respectively, and the plurality of capacitances may include the first through fourth capacitances, the fourth capacitance being a sum of the capacitance between the at least one first wiring and the at least one second wiring and a capacitance between the at least one first wiring or the at least one second wiring and the plurality of third wirings.

A gap between the at least one second wiring and the at least one first wiring may be substantially the same as a gap between the at least one first wiring or the at least one second wiring and one of the plurality of third wirings which is adjacent to the at least one first wiring or the at least one second wiring.

The first conductive layer may include a plurality of third wirings electrically connected to the first and second impurity regions, respectively; and a plurality of fourth wirings disposed on upper portions of the at least one first gate electrode and the at least one second gate electrode such that the plurality of fourth wirings is insulated from the at least one first gate electrode and the at least one second gate electrode.

The second voltage may be applied to the first impurity region and the first voltage may be applied to the second impurity region, and the plurality of capacitances may include the first through fourth capacitances and a fifth capacitance, the fourth capacitance being a sum of the capacitance between the at least one first wiring and the at least one second wiring and a capacitance between one of the at least one first wiring, the at least one second wiring, and the plurality of third wirings, and the plurality of fourth wirings, and the fifth capacitance being a sum of a capacitance between the first well and the first impurity region and a capacitance between the second well and the second impurity region.

The first voltage may be applied to the first impurity region and the second voltage may be applied to the second impurity region, and the plurality of capacitances may include the first through fourth capacitances, the fourth capacitance being a sum of the capacitance between the at least one first wiring and the at least one second wiring and a capacitance between the at least one first wiring or the at least one second wiring and the plurality of third wirings.

Gaps between adjacent two wirings among the at least one first wiring, the at least one second wiring, the plurality of third wirings, and the plurality of fourth wirings may be substantially the same.

The capacitor device may further include at least one metal-insulator-metal (MIM) capacitor disposed on an upper portion of the first conductive layer. The plurality of capacitances may include the first through fourth capacitances and a sixth capacitance, the sixth capacitance being a capacitance of the at least one MIM capacitor.

The at least one MIM capacitor may include a plurality of lower metal lines electrically connected to the first conductive layer, a plurality of insulation layers disposed on the plurality of lower metal lines; and a plurality of upper metal lines disposed on the plurality of insulation layers.

The at least one MIM capacitor may include two MIM capacitors, and the plurality of capacitances may include the first through fourth capacitances, the sixth capacitance, and a seventh capacitance, the seventh capacitance being a sum of a capacitance between the plurality of lower metal lines included in each of the two MIM capacitors and a capacitance between the plurality of upper metal lines.

The capacitor device may further include a plurality of third wirings disposed on upper portions of the two MIM capacitors and electrically connected to the plurality of lower metal lines and the plurality of upper metal lines, respectively. The plurality of capacitances may include the first through fourth capacitances, the sixth and seventh capacitances, and an eighth capacitance, the eighth capacitance being between the plurality of third wirings.

The capacitor device may further include a second conductive layer disposed on an upper portion of the first conductive layer and including the plurality of third wirings electrically connected to the at least one first wiring and the at least one second wiring, respectively. The plurality of capacitances may include the first through fourth capacitances and a ninth capacitance, the ninth capacitance being between the plurality of third wirings.

The capacitor device may further include a second conductive layer disposed on the first conductive layer and including the plurality of third wirings electrically insulated from the at least one first wiring and the at least one second wiring, respectively. The plurality of capacitances may include the first through fourth capacitances and a tenth capacitance, the tenth capacitance being a sum of a capacitance between the plurality of third wirings and a capacitance between the at least one first wiring or the at least one second wiring and one of the plurality of third wirings which is below and above the at least one first wiring or the at least one second wiring.

The plurality of gate electrodes may include at least one first upper gate electrode disposed on an upper portion of the at least one first gate electrode and having the first voltage applied thereto; and at least one second upper gate electrode disposed on an upper portion of the at least one second gate electrode and having the second voltage applied thereto, and the plurality of capacitances may include the first through third capacitances and an eleventh capacitance, the eleventh capacitance being a sum of a capacitance between the at least one first gate electrode and the at least one first upper gate electrode and a capacitance between the at least one second gate electrode and the at least one second upper gate electrode.

The substrate may have the second conductivity type, and the second well may be disposed in the first well, and the plurality of capacitances may include the first capacitance, the second capacitance, and a twelfth capacitance, the twelfth capacitance being between the substrate and the first well.

The capacitor device may be a power stabilization capacitor or an electromagnetic interference (EMI) improvement capacitor.

Another embodiment is directed to a capacitor device having a plurality of capacitances, the capacitor device including a substrate, the substrate having a first conductivity type and having a first voltage applied thereto; a first well disposed in the substrate, the first well having a second conductivity type and having second voltage applied thereto; and a gate electrode disposed on an upper portion of the substrate or on an upper portion of the first well such that the gate electrode is insulated from the substrate or the first well. The plurality of capacitances may include a first capacitance and a second capacitance, the first capacitance being between the substrate and the first well, and the second capacitance being between the substrate or the first well and the gate electrode.

The plurality of gate electrodes may include at least one first gate electrode disposed over the upper portion of the substrate and having the second voltage applied thereto; and at least one second gate electrode disposed over an upper portion of the first well and having the first voltage applied thereto, and the plurality of capacitances may include the first capacitance, the second capacitance, and a third capacitance, the third capacitance being between the at least one first gate electrode and the at least one second gate electrode.

The at least one first gate electrode may include at least two first gate electrodes, and the at least one second gate electrode includes at least two second gate electrodes, and a gap between the at least one second gate electrode and the at least one first gate electrode may be smaller than a gap between the at least two first gate electrodes and may be smaller than a gap between the at least two second gate electrodes.

The capacitor device may further include a first conductive layer, the first conductive layer including at least one first wiring electrically connected to the at least one first gate electrode and at least one second wiring electrically connected to the at least one second gate electrode. The plurality of capacitances may include the first through third capacitances and a fourth capacitance, the fourth capacitance being between the at least one first wiring and the at least one second wiring.

The capacitor device may further include a first impurity region disposed in the substrate and having the second conductivity type; and a second impurity region disposed in the first well and having the first conductivity type.

The second voltage may be applied to the first impurity region and the first voltage may be applied to the second impurity region, and the plurality of capacitances may include the first through fourth capacitances and a fifth capacitance, the fifth capacitance being a sum of a capacitance between the first well and the first impurity region and a capacitance between the first well and the second impurity region.

The first conductive layer may further include a plurality of third wirings electrically connected to the first and second impurity regions, respectively, and a gap between the at least one second wiring and the at least one first wiring may be smaller than a gap between the at least one first wiring or the at least one second wiring and one of the plurality of third wirings which is adjacent to the at least one first wiring or the at least one second wiring.

The first voltage may be applied to the first impurity region and the second voltage may be applied to the second impurity region, and the plurality of capacitances may include the first through fourth capacitances.

The first conductive layer may further include a plurality of third wirings electrically connected to the first and second impurity regions, respectively, and the plurality of capacitances may include the first through fourth capacitances, the fourth capacitance being a sum of the capacitance between the at least one first wiring and the at least one second wiring and a capacitance between the at least one first wiring or the at least one second wiring and one of the plurality of third wirings which is adjacent to the at least one first wiring or the at least one second wiring.

A gap between the at least one second wiring and the at least one first wiring may be substantially the same as a gap between the at least one first wiring or the at least one second wiring and one of the plurality of third wirings which is adjacent to the at least one first wiring or the at least one second wiring.

The first conductive layer may include a plurality of third wirings electrically connected to the first and second impurity regions, respectively; and a plurality of fourth wirings disposed on upper portions of the at least one first gate electrode and the at least one second gate electrode in such a way that the plurality of fourth wirings is insulated from the at least one first gate electrode and the at least one second gate electrode.

The second voltage may be applied to the first impurity region and the first voltage may be applied to the second impurity region, and the plurality of capacitances may include the first through fourth capacitances and a fifth capacitance, the fourth capacitance being a sum of the capacitance between the at least one first wiring and the at least one second wiring and a capacitance between one of the at least one first wiring, the at least one second wiring, and the plurality of third wirings, and the plurality of fourth wirings, and the fifth capacitance being a sum of a capacitance between the substrate and the first impurity region and a capacitance between the first well and the second impurity region.

The first voltage may be applied to the first impurity region and the second voltage may be applied to the second impurity region, and the plurality of capacitances may include the first through fourth capacitances, the fourth capacitance being a sum of the capacitance between the at least one first wiring and the at least one second wiring and a capacitance between the at least one first wiring or the at least one second wiring and one of the plurality of third wirings which is adjacent to the at least one first wiring or the at least one second wiring.

Gaps between adjacent two wirings among the at least one first wiring, the at least one second wiring, the plurality of third wirings, and the plurality of fourth wirings may be substantially the same.

The capacitor device may further include at least one metal-insulator-metal (MIM) capacitor disposed on an upper portion of the first conductive layer. The plurality of capacitances may include the first through fourth capacitances and a sixth capacitance, the sixth capacitance being a capacitance of the at least one MIM capacitor.

The at least one MIM capacitor may include a plurality of lower metal lines electrically connected to the first conductive layer; a plurality of insulation layers disposed on the plurality of lower metal lines; and a plurality of upper metal lines disposed on the plurality of insulation layers.

The at least one MIM capacitor may include two MIM capacitors, and the plurality of capacitances may include the first through fourth capacitances, the sixth capacitance, and a seventh capacitance, the seventh capacitance being a sum of a capacitance between the plurality of lower metal lines included in each of the two MIM capacitors and a capacitance between the plurality of upper metal lines.

The capacitor device may further include a plurality of third wirings disposed on upper portions of the two MIM capacitors and electrically connected to the plurality of lower metal lines and the plurality of upper metal lines, respectively. The plurality of capacitances may include the first through fourth capacitances, the sixth and seventh capacitances, and an eighth capacitance, the eighth capacitance being between the plurality of third wirings.

The capacitor device may further include a second conductive layer disposed on the first conductive layer and including the plurality of third wirings electrically connected to the at least one first wiring and the at least one second wiring, respectively. The plurality of capacitances may include the first through fourth capacitances and a ninth capacitance, the ninth capacitance being between the plurality of third wirings.

The capacitor device may further include a second conductive layer disposed on the first conductive layer and including the plurality of third wirings electrically insulated from the at least one first wiring and the at least one second wiring, respectively. The plurality of capacitances may include the first through fourth capacitances and a tenth capacitance, the tenth capacitance being a sum of a capacitance between the plurality of third wirings and a capacitance between the at least one first wiring or the at least one second wiring and one of the plurality of third wirings which is below and above the at least one first wiring or the at least one second wiring.

The plurality of gate electrodes may include at least one first upper gate electrode disposed on an upper portion of the at least one first gate electrode and having the first voltage applied thereto; and at least one second upper gate electrode disposed on an upper portion of the at least one second gate electrode and having the second voltage applied thereto, and the plurality of capacitances may include the first through third capacitances and an eleventh capacitance, the eleventh capacitance being a sum of a capacitance between the at least one first gate electrode and the at least one first upper gate electrode and a capacitance between the at least one second gate electrode and the at least one second upper gate electrode.

The capacitor device may be a power stabilization capacitor or an EMI improvement capacitor.

Another embodiment is directed to a method of fabricating a capacitor device having a plurality of capacitances, the method including forming a first well and a second well in a substrate, the first well having a first conductivity type and the second well having a second conductivity type; forming first and second gate electrodes on an upper portion of the first well and an upper portion of the second well, respectively, such that the first and second gate electrodes are insulated from the first well and the second well; and forming connections for a first voltage to be applied to the first well and the second gate electrodes, and connections for a second voltage to be applied to the second well and the first gate electrodes. The plurality of capacitances may include a first capacitance, a second capacitance, and a third capacitance, the first capacitance being between the first well and the second well, the second capacitance being a sum of a capacitance between the first well and the first gate electrode and a capacitance between the second well and the second gate electrodes, and the third capacitance being between the first gate electrodes and the second gate electrodes.

The method may further include forming a first conductive layer, the first conductive layer including a plurality of first wirings electrically connected to the first gate electrodes and a plurality of second wirings electrically connected to the second gate electrodes. The plurality of capacitances may include the first through third capacitances and a fourth capacitance, the fourth capacitance being between the plurality of first wirings and the plurality of second wirings.

The method may further include forming a first impurity region having the second conductivity type in the first well; and forming a second impurity region having the first conductivity type in the second well.

The method may further include forming a connection for the second voltage to be applied to the first impurity region, and a connection for the first voltage to be applied to the second impurity region. The plurality of capacitances may include the first through fourth capacitances and a fifth capacitance, the fifth capacitance being a sum of a capacitance between the first well and the first impurity region and a capacitance between the second well and the second impurity region.

The method may further include forming a connection for the first voltage to be applied to the first impurity region, and a connection for the second voltage to be applied to the second impurity region. The plurality of capacitances may include the first through fourth capacitances.

The forming of the first conductive layer may include forming a plurality of third wirings electrically connected to the plurality of first and second wirings and the first and second impurity regions, respectively, and forming a plurality of fourth wirings in upper portions of the first gate electrodes and the second gate electrodes in such a way that the plurality of fourth wirings is insulated from the first gate electrodes and the second gate electrodes.

The method may further include forming at least one metal-insulator-metal (MIM) capacitor on an upper portion of the first conductive layer. The plurality of capacitances may include the first through fourth capacitances and a sixth capacitance, the sixth capacitance being a capacitance of the at least one MIM capacitor.

The method may further include forming a second conductive layer on an upper portion of the first conductive layer, the second conductive layer including the plurality of third wirings electrically connected to the plurality of first wirings and the plurality of second wirings, respectively. The plurality of capacitances may include the first through fourth capacitances and a seventh capacitance, the seventh capacitance being between the plurality of third wirings.

The method may further may include forming a second conductive layer on the upper portion of the first conductive layer, the second conductive layer including the plurality of third wirings electrically insulated from the plurality of first wirings and the plurality of second wirings, respectively. The plurality of capacitances may include the first through fourth capacitances and an eighth capacitance, the eighth capacitance being a sum of a capacitance between the plurality of third wirings and a capacitance between the at least one first wiring or the at least one second wiring and one of the plurality of third wirings which is below and above the plurality of first wirings or the plurality of second wirings.

The method may further include forming a plurality of first upper gate electrodes on upper portions of the plurality of first gate electrodes; forming a plurality of second upper gate electrodes on upper portions of the plurality of second gate electrodes; and forming connections for the first voltage to be applied to the plurality of first upper gate electrodes, and forming connections for the second voltage to be applied to the plurality of second upper gate electrodes. The plurality of capacitances may include the first through third capacitances and a ninth capacitance, the ninth capacitance being a sum of a capacitance between the plurality of first gate electrodes and the plurality of first upper gate electrodes and a capacitance between the plurality of second gate electrodes and the plurality of second upper gate electrodes.

The substrate may have the second conductivity type, and the second well may be disposed in the first well, and the plurality of capacitances may include the first through third capacitances and a tenth capacitance, the tenth capacitance being between the substrate and the first well.

Another embodiment is directed to a method of fabricating a capacitor device having a plurality of capacitances, the method including providing a substrate having a first conductivity type; forming a first well having a second conductivity type in the substrate; forming a plurality of first and second gate electrodes on an upper portion of the substrate and on an upper portion of the first well in such a way that the plurality of first and second gate electrodes are insulated from the substrate and the first well; and forming connections for a first voltage to be applied to the substrate and the plurality of second gate electrodes, and forming connections for a second voltage to be applied to the first well and the plurality of first gate electrode. The plurality of capacitances may include a first capacitance, a second capacitance, and a third capacitance, the first capacitance being between the substrate and the first well, the second capacitance being a sum of a capacitance between the substrate and the plurality of first gate electrodes and a capacitance between the first well and the plurality of second gate electrodes, and the third capacitance being between the plurality of first and second gate electrodes.

The method may further include forming a first conductive layer, the first conductive layer including a plurality of first wirings electrically connected to the plurality of first gate electrodes and a plurality of second wirings electrically connected to the plurality of second gate electrodes. The plurality of capacitances may include the first through third capacitances and a fourth capacitance, the fourth capacitance being between the plurality of first wirings and the plurality of second wirings.

The method may further include forming a first impurity region having the second conductivity type in the first well; and forming a second impurity region having the first conductivity type in the second well.

Another embodiment is directed to a semiconductor device, including a first power line configured to provide a first voltage; a second power line configured to provide a second voltage different from the first voltage, the first power line and the second power line having a capacitance therebetween provided by a capacitor structure, the capacitor structure being configured to receive the first and second voltages from the first power line and the second power line, respectively, the capacitor structure including a first junction capacitor formed between a first well and a second well, the first well being disposed in a semiconductor substrate and the second well being disposed in the first well, the first well being a first conductivity type, the semiconductor substrate being a second conductivity type opposite to the first conductivity type, and the second well being the second conductivity type, the first well receiving the first voltage and the second well receiving the second voltage; a second junction capacitor formed between the semiconductor substrate and the first well, the semiconductor substrate receiving the second voltage; a third junction capacitor formed between a first impurity region and the first well, the first impurity region being the second conductivity type and being disposed in the first well, the first impurity region receiving the second voltage; a fourth junction capacitor formed between a second impurity region and the second well, the second impurity region being the first conductivity type and being disposed in the second well, the second impurity region receiving the first voltage; a first MOS capacitor formed between the first well and a first gate electrode disposed on the first well, the first gate electrode receiving the second voltage, the first MOS capacitor including an insulation layer interposed between the first well and the first gate electrode so as to insulate therebetween; and a second MOS capacitor formed between the second well and a second gate electrode disposed on the second well, the second gate electrode receiving the first voltage, the second MOS capacitor including an insulation layer interposed between the second well and the second gate electrode so as to insulate therebetween. The capacitance may include the sum of capacitances of the first junction capacitor, the second junction capacitor, the third junction capacitor, the fourth junction capacitor, the first MOS capacitor, and the second MOS capacitor.

The capacitor structure may further include a first MIM capacitor, the first MIM capacitor being formed between the first gate electrode and the second gate electrode, an insulation layer being interposed between the first gate electrode and the second gate electrode so as to insulate therebetween, and the capacitance may include the sum of capacitances of the first junction capacitor, the second junction capacitor, the third junction capacitor, the fourth junction capacitor, the first MOS capacitor, the second MOS capacitor, and the first MIM capacitor.

The capacitor structure may further include a second MIM capacitor, the second MIM capacitor being formed between a first wiring and a second wiring, the first wiring being disposed on a layer above the first gate electrode, the first wiring being electrically connected to the first gate electrode and receiving the second voltage, the second wiring being disposed on a layer above the second gate electrode, the second wiring being electrically connected to the second gate electrode and receiving the first voltage, and the capacitance may include the sum of capacitances of the first junction capacitor, the second junction capacitor, the third junction capacitor, the fourth junction capacitor, the first MOS capacitor, the second MOS capacitor, the first MIM capacitor, and the second MIM capacitor.

BRIEF DESCRIPTION OF THE DRAWINGS

The above and other features and advantages will become more apparent to those of skill in the art by describing in detail example embodiments with reference to the attached drawings, in which:

FIGS. 4A through 4F illustrate cross-sectional views of stages in a method of fabricating the capacitor device of FIG. 2 according to an example embodiment;

DETAILED DESCRIPTION

Figure 1:
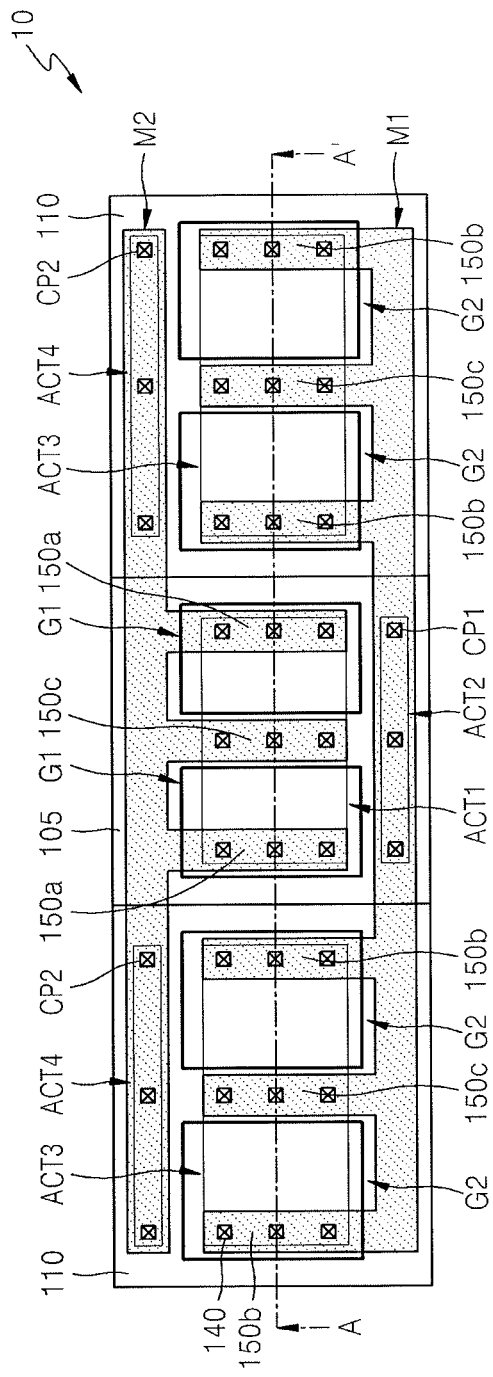
FIG. 1 illustrates a schematic layout of a part of a capacitor device according to an example embodiment.

Korean Patent Application No. 10-2010-0080407, filed on Aug. 19, 2010, in the Korean Intellectual Property Office, and entitled: "Capacitor Device and Method of Fabricating the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

In the drawings, the lengths and sizes of layers and regions may be exaggerated for clarity. As used herein, the term "and/or" includes any and all combinations of one or more of the associated listed items.

The terminology used herein is for the purpose of describing particular embodiments only and is not intended to be limiting. As used herein, the singular forms 'a', 'an', and 'the' are intended to include the plural forms as well, unless the context clearly indicates otherwise. It will be further understood that the terms 'comprises' and/or 'comprising,' when used in this specification, specify the presence of stated features, integers, operations, elements, and/or components, but do not preclude the presence or addition of one or more other features, integers, operations, elements, components, and/or groups thereof.

It will be understood that, although the terms 'first', 'second', 'third', etc., may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the example embodiments.

Embodiments are described herein with reference to cross-section illustrations that are schematic illustrations of idealized embodiments and intermediate structures. As such, variations from the shapes of the illustrations (as a result, for example, of manufacturing techniques and/or tolerances) are to be expected. Thus, embodiments should not be construed as limited to the particular shapes of regions illustrated herein, but are to include deviations in shapes that result, for example, from manufacturing. Like numbers refer to like elements throughout.

FIG. 1 illustrates a schematic layout of a part of a capacitor device 10 according to an example embodiment. Referring to FIG. 1, the capacitor device 10 may be implemented as a metal-oxide-silicon (MOS) capacitor using an accumulation mode. The capacitor device 10 may be formed on a substrate including a first well 105 and a second well 110. Four active regions ACT1, ACT2, ACT3, and ACT4 may be defined by isolation layers in the first and second wells 105 and 110. For example, the first and second active regions ACT1 and ACT2 may be defined by the isolation layers in the first well 105, and the third and fourth ACT3 and ACT4 may be defined by the isolation layers in the second well 110.

A plurality of gate electrodes G1 may be disposed on an upper portion of the first active region ACT1, so that MOS capacitors may be formed in the first active region ACT1. A plurality of gate electrodes G2 may be disposed on an upper portion of the third active region ACT3, so that MOS capacitors may be formed in the third active region ACT3. Although the two gate electrodes G1 are disposed on the upper portion of the first active region ACT1 and the two gate electrodes G2 are disposed on the upper portion of the third active region ACT3 in the present embodiment, embodiments are not limited thereto. For example, in another embodiment, one gate electrode may be disposed on the upper portion of each active region. In another embodiment, three or more gate electrodes may be disposed on the upper portion of each active region.

A first conductive line M1 extending in a horizontal direction may be disposed on an upper portion of the second active region ACT2. The first conductive line M1 is connected to the second active region ACT2 through a contact plug CP1, so that a voltage of the first conductive line M1 may be applied to the second active region ACT2. A second conductive line M2 extending in a horizontal direction may be disposed on an upper portion of the fourth active region ACT4. The second conductive line M2 is connected to the fourth active region ACT4 through a contact plug CP2, so that a voltage of the second conductive line M2 may be applied to the fourth active region ACT4.

Wirings connected in common to the second conductive line M2 may be disposed in parallel on the upper portion of the first active region ACT1. For example, a plurality of first wirings 150a may be disposed on upper portions of the gate electrodes G1 of the first active region ACT1, and a third wiring 150c may be disposed on a region between the gate electrodes G1 of the first active region ACT1. Wirings connected in common to the first conductive line M1 may be disposed in parallel on the upper portion of the third active region ACT3. For example, a plurality of second wirings 150b may be disposed on upper portions of the gate electrodes G2 of the third active region ACT3, and another third wiring 150c may be disposed on a region between the gate electrodes G2 of the third active region ACT3.

In the present embodiment, the capacitor device 10 realizes a MOS capacitor by using the accumulation mode, and a voltage between a gate and source included in the MOS capacitor is below 0. Thus, a voltage applied to the region between the two gate electrodes G1 of the first active region ACT1 is the same as a voltage applied to the gate electrodes G1, and thus the first and third wirings 150a and 150c of the first active region ACT1 are connected in common to the second conductive line M2. Likewise, a voltage applied to the region between the two gate electrodes G2 of the third active region ACT3 is the same as a voltage applied to the two gate electrodes G2, and thus the second and third wirings 150b and 150c of the third active region ACT3 are connected in common to the first conductive line M1.

Figure 2:
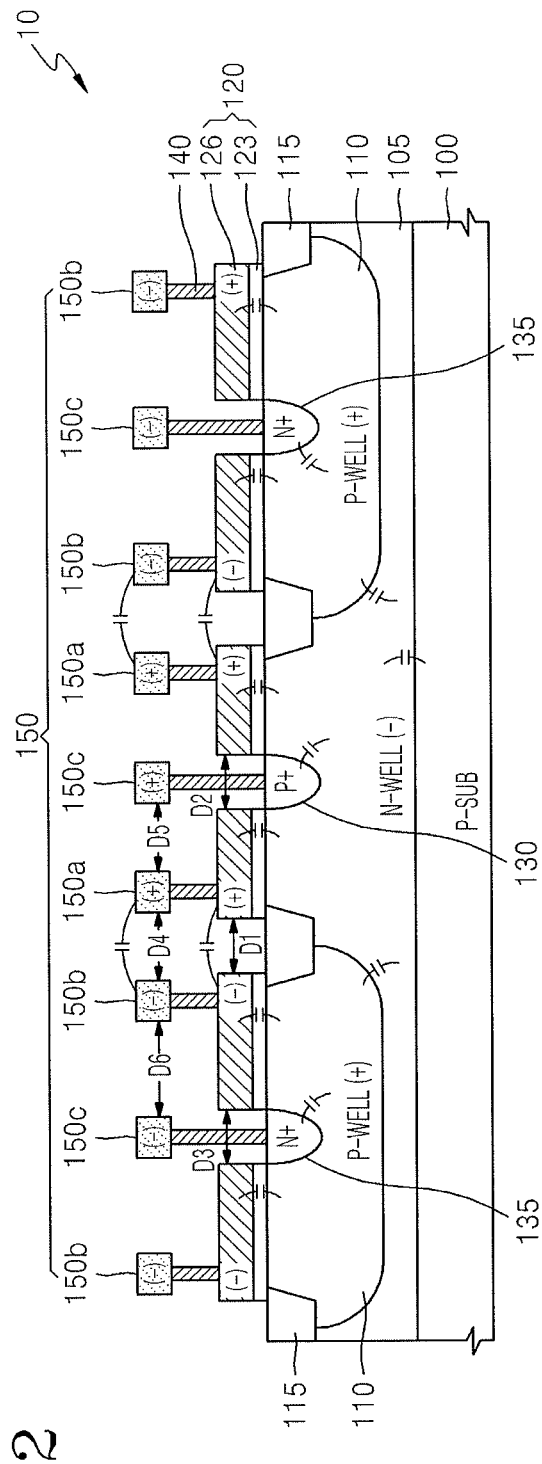
FIG. 2 illustrates a cross-sectional view of the capacitor device taken along a line A-A' of FIG. 1.
Figure 3:
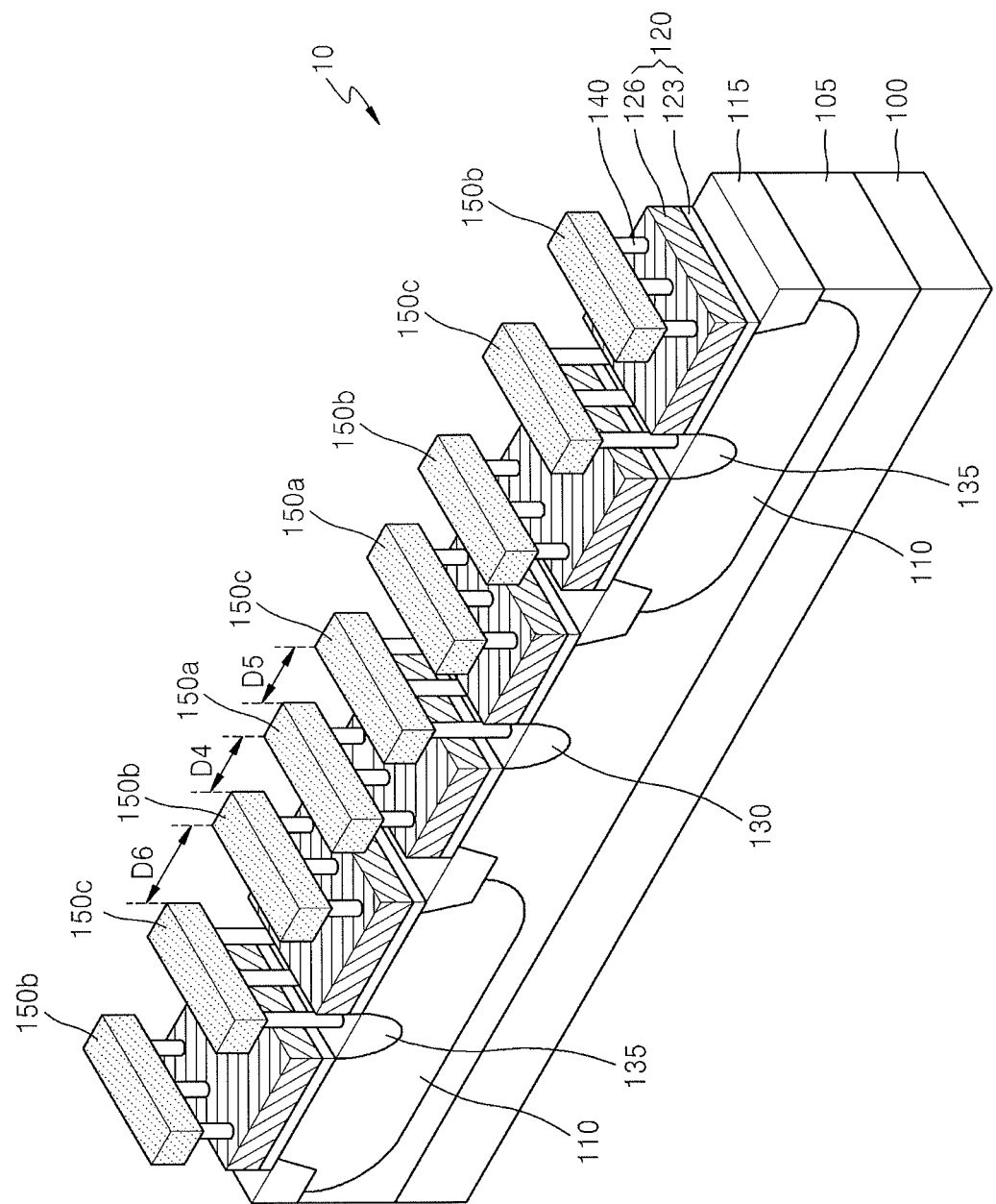
FIG. 3 illustrates a perspective view of the capacitor device of FIG. 2.

FIG. 2 illustrates a cross-sectional view of the capacitor device 10 taken along a line A-A' of FIG. 1. FIG. 3 illustrates a perspective view of the capacitor device 10 of FIG. 2.

Referring to FIGS. 2 and 3, the first well 105 and the second well 110 may be formed in a substrate 100. For example, the first well 105 may be formed in the substrate 100, and the second well 110 may be formed in the first well 105. Thus, the substrate 100, the first well 105, and the second well 110 may form a triple well structure. Isolation layers 115 may be disposed in a boundary region between the first well 105 and the second well 110, and may be used to define active regions.

The first well 105 may have a first conductivity type. The second well 110 and the substrate 100 may have a second conductivity type. In the present embodiment, the first conductivity type is an N type, and the second conductivity type is a P type. In this regard, the substrate 100 is illustrated as a P type substrate P-SUB, the first well 105 is illustrated as an N well N-WELL, and the second well 110 is illustrated as a P well P-WELL. However, embodiments are not limited thereto. For example, in another embodiment, the first conductivity type may be the P type, and the second conductivity type may be the N type. In this regard, the substrate 100 is an N type substrate, the first well 105 is a P well, and the second well 110 is an N well.

A plurality of gate structures 120 may be disposed over the first well 105 and the second well 110, and each may include a gate insulation layer 123 and a gate electrode 126 that are sequentially formed. In this regard, the gate electrodes 126 disposed over the first well 105 may correspond to the gate electrodes G1 of FIG. 1, and the gate electrodes 126 disposed over the second well 110 may correspond to the gate electrodes G2 of FIG. 1.

In the present embodiment, a gap D1 between the gate electrodes 126 disposed over the first well 105 and the gate electrodes 126 disposed over the second well 110 may be smaller than a gap D2 between the gate electrodes 126 disposed over the first well 105. The gap D1 between the gate electrodes 126 disposed over the first well 105 and the gate electrodes 126 disposed over the second well 110 may be smaller than a gap D3 between the gate electrodes 126 disposed over the second well 110. Furthermore, the gap D2 between the gate electrodes 126 disposed over the first well 105 may be substantially the same as the gap D3 between the gate electrodes 126 disposed over the second well 110.

A first impurity region 130 may be disposed between the two gate structures 120 disposed over the first well 105, and may include second conductivity type impurities. A second impurity region 135 may be disposed between the two gate structures 120 disposed over the second well 110, and may include first conductivity type impurities.

In the present embodiment, the first conductivity type is the N type, and the second conductivity type is the P type. Thus, the first impurity region 130 may be a P type impurity region, and the second impurity region 135 may be an N type impurity region. Further, although one first impurity region 130 is disposed in the first well 105 and one second impurity region 135 is disposed in the second well 110 in the present embodiment, embodiments are not limited thereto. For example, in another embodiment, two or more impurity regions may be disposed in each well.

A first conductive layer 150 including the first wirings 150*a*, the second wirings 150*b*, and the third wirings 150*c* may be disposed on upper portions of the gate electrodes 126 and upper portions the first and second impurity regions 130 and 135. For example, the first wirings 150*a*, respectively, may be disposed on the upper portions of the gate electrodes 126 disposed over the first well 105, the second wirings 150*b*, respectively, may be disposed on the upper portions of the gate electrodes 126 disposed over the second well 110, and the third wirings 150*c*, respectively, may be disposed on the upper portions of the first and second impurity regions 130 and 135. The first, second, and third wirings 150*a*, 150*b*, and 150*c* may be connected to the gate electrodes 126, the first impurity region 130, and the second impurity region 135 through contact plugs 140.

A gap D4 between the first wirings 150*a* and the second wirings 150*b* may be smaller than a gap D5 between the first wirings 150*a* and the third wirings 150*c*. Further, the gap D4 between the first wirings 150*a* and the second wirings 150*b* may be smaller than a gap D6 between the second wirings 150*b* and the third wirings 150*c*. Furthermore, the gap D5 between the first wirings 150*a* and the third wirings 150*c* may be substantially the same as the gap D6 between the second wirings 150*b* and the third wirings 150*c*.

The first wirings 150*a* and the third wirings 150*c* disposed over an upper portion of the first well 105 may be connected to the second conductive line M2 of FIG. 1 so that a second voltage may be applied to the first wirings 150*a* and the third wirings 150*c* disposed over the upper portion of the first well 105. The second wirings 150*b* and the third wirings 150*c* disposed over an upper portion of the second well 110 may be connected to the first conductive line M1 of FIG. 1 so that a first voltage may be applied to the second wirings 150*b* and the third wirings 150*c* disposed over the upper portion of the second well 110. In the present embodiment, the first voltage may be a negative voltage (−), and the second voltage may be a positive voltage (+). Hereinafter, the first voltage is referred to as the negative voltage (−), and the second voltage is referred to as the positive voltage (+). However, embodiments are not limited thereto. For example, in another embodiment, the first voltage may be a positive voltage (+), and the second voltage may be a negative voltage (−).

Referring to FIG. 2, the negative voltage (−) may be applied to the first well 105, and the positive voltage (+) may be applied to the second well 110. The positive voltage (+) may be applied to the first impurity region 130, and the negative voltage (−) may be applied to the second impurity region 135. The positive voltage (+) may be applied to the gate electrodes 126 disposed over the first well 105, and the negative voltage (−) may be applied to the gate electrodes 126 disposed over the second well 110.

Therefore, since different voltages may be applied to the first well 105 and the second well 110 adjacent to the first well 105, a first junction capacitor may be formed, and since different voltages may be applied to the substrate 100 and the first well 105 adjacent to the substrate 100, a second junction capacitor may be formed. Furthermore, since different voltages may be applied to the first impurity region 130 and the first well 105 adjacent to the first impurity region 130, a third junction capacitor may be formed, and since different voltages may be applied to the second impurity region 135 and the second well 110 adjacent to the second impurity region 135, a fourth junction capacitor may be formed.

As different voltages may be applied to the first well 105 and the gate electrodes 126 disposed over the first well 105, and the gate insulation layers 123 are disposed therebetween, a first MOS capacitor may be formed. Also, since different voltages may be applied to the second well 110 and the gate electrodes 126 disposed over the second well 110, and the gate insulation layers 123 are disposed therebetween, a second MOS capacitor may be formed.

Since different voltages may be applied to the gate electrodes 126 disposed over the first well 105 and the gate electrodes 126 disposed over the second well 110, and an insulation material may exist therebetween, a first metal-insulator-metal (MIM) capacitor may be formed. Since different voltages may be applied to the first wirings 150*a* and the second wirings 150*b*, and an insulation material may exist therebetween, a second MIM capacitor may be formed.

The capacitance of the capacitor device 10 may include the sum of the capacitances of the first through fourth junction capacitors, the first and second MOS capacitors, and the first and second MIM capacitors.

By way of review, a general capacitor device may be formed with a plurality of gate electrodes formed on a substrate, thereby forming a plurality of MOS capacitors, and achieving a predetermined capacitance by connecting the MOS capacitors in parallel. Thus, when a mass-storage capacitance is required, a greater number of MOS capacitors would need to be connected in parallel to each other, such that a larger area for the greater number of MOS capacitors would be needed, which would increase the manufacturing costs of the general capacitor device. Further, the general capacitor device may use a high-k dielectric material to form a gate insulation layer so as to improve the capacitances of MOS capacitors in the same area without having to increase an area for the MOS capacitors. However, when the general capacitor device needs a thick gate insulation layer to endure a high voltage, the general capacitor device would use the high-k dielectric material to form the thick gate insulation layer, which would further increase the manufacturing costs of the conventional capacitor device.

In contrast, in the present embodiment, the first and second wells 105 and 110 are formed in the substrate 100 to have different conductivity types and have different voltages applied thereto, and different voltages are applied to the gate electrodes 126 formed over the first and second wells 105 and 110. Thus, the capacitor device 10 can obtain a junction capacitance between the first and second wells 105 and 110 and MOS capacitances between the first and second wells 105 and 110 and the gate electrodes 126 as well.

Further, in the present embodiment, the first and second impurity regions 130 and 135 are, respectively, formed in the first and second wells 105 and 110 to have different conductivity types and have different voltages applied thereto, and thus the capacitor device 10 can further obtain a junction capacitance between the first well 105 and the first impurity region 130 and a junction capacitance between the second well 110 and the second impurity region 135.

Further, in the present embodiment, the gate electrodes 126 over the first well 105 and the gate electrodes 126 over the second well 110 are formed to have different voltages applied thereto, and thus the capacitor device 10 can further obtain an MIM capacitance between the gate electrodes 126 formed over the first well 105 and the gate electrodes 126 formed over the second well 110 without having to provide room for an additional capacitor. The first and second wirings 150a and 150b have different voltages applied thereto, and thus the capacitor device 10 can further obtain an MIM capacitance between the first and second wirings 150a and 150b without having to provide room for an additional capacitor.

As described above, the capacitor device 10 of the present embodiment may achieve a relatively large capacitance in the same area without having to use additional capacitors and without using a high-k dielectric material to form a gate insulation layer (in contrast to a general capacitor device), thereby increasing efficiency and integration and lowering costs.

FIGS. 4A through 4F illustrate cross-sectional views of stages in a method of fabricating the capacitor device 10 of FIG. 2 according to an example embodiment.

Figure 4A:
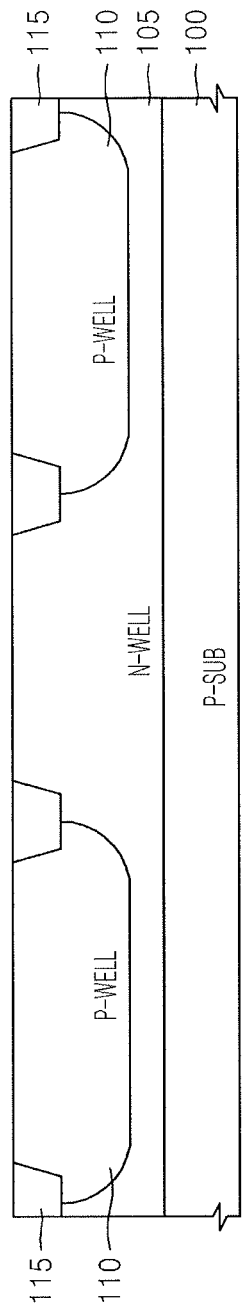

Referring to FIG. 4A, the substrate 100 is prepared. In this regard, the substrate 100 may be a semiconductor substrate, for example, formed of any one of silicon, silicon-on-insulator, silicon-on-sapphire, germanium, and gallium-arsenide. In the present embodiment, the substrate 100 may be a P type semiconductor substrate.

The first well 105 is formed by injecting first conductivity type impurities into all parts of a surface of the substrate 100. Thereafter, the second well 110 is formed by injecting second conductivity type impurities into a partial region of the first well 105 by using, for example, a photoresist process. In the present embodiment, the first conductivity type may be the N type, and the second conductivity type may be the P type. Thus, the first conductivity type impurities may be N type impurities, for example, phosphorus (P), arsenic (As), or antimony (Sb), and the second conductivity type impurities may be P type impurities, for example, boron (B), gallium (B), or indium (In).

The isolation layers 115 for defining active regions are formed in the substrate 100 in which the first and second wells 105 and 110 are formed. In this regard, the isolation layers 115 may be formed by, for example, a shallow trench isolation (STI) process.

Figure 4B:
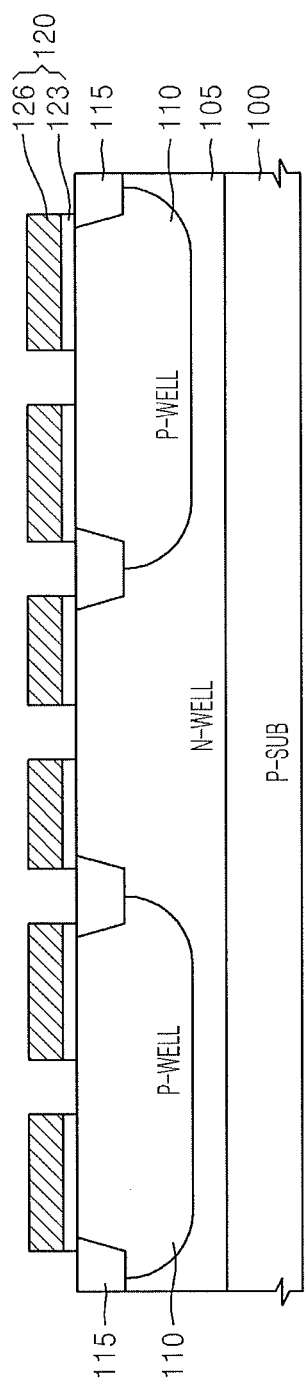

Referring to FIG. 4B, the gate structures 120 are formed by sequentially depositing the gate insulation layers 123 and the gate electrodes 126 over the first and second wells 105 and 110 and patterning the sequentially deposited layers. In this regard, the gate insulation layers 123 may each be a single layer or a composite layer including, for example, one or more of silicon oxide ($SiO_2$), silicon nitride ($Si_3N_4$), silicon oxynitride (SiON), hafnium oxide ($HfO_2$), hafnium silicon oxide ($HfSi_xO_y$), aluminum oxide ($Al_2O_3$), and zirconium oxide ($ZrO_2$).

Further, the gate electrodes 126 may each be a single layer or a composite layer including, for example, one or more of polysilicon, aluminum (Al), gold (Au), beryllium (Be), bismuth (Bi), cobalt (Co), hafnium (Hf), indium (In), manganese (Mn), molybdenum (Mo), nickel (Ni), lead (Pb), palladium (Pd), platinum (Pt), rhodium (Rh), rhenium (Re), tantalum (Ta), tellurium (Te), titanium (Ti), tungsten (W), zinc (Zn), zirconium (Zr), nitrides thereof, and silicides thereof.

Figure 4C:
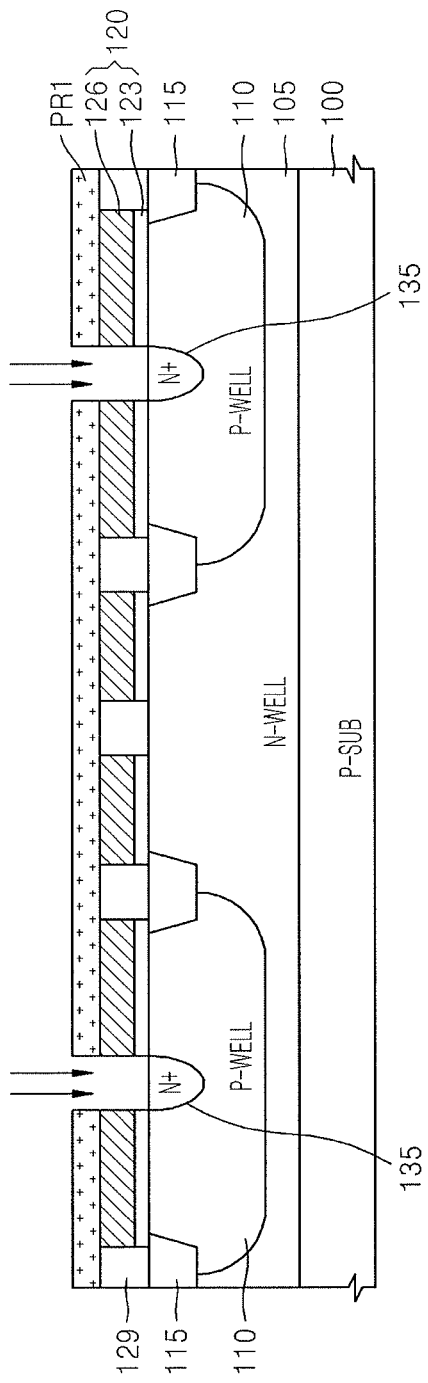

Referring to FIG. 4C, a first insulation layer 129 is formed on all parts of the surface of the substrate 100 on which the gate structures 120 are formed, and a first photoresist (PR1) pattern (through which a region between the two gate structures 120 disposed over the second well 110 is exposed) is formed on an upper portion of the first insulation layer 129. Thereafter, the second impurity region 135 is formed by etching a portion of the first insulation layer 129 that is exposed by the first photoresist (PR1) pattern, and injecting high density N type impurities. Thereafter, the first photoresist (PR1) pattern is removed. In this regard, the N type impurities may be, for example, phosphorus (P), arsenic (As), or antimony (Sb).

Figure 4D:
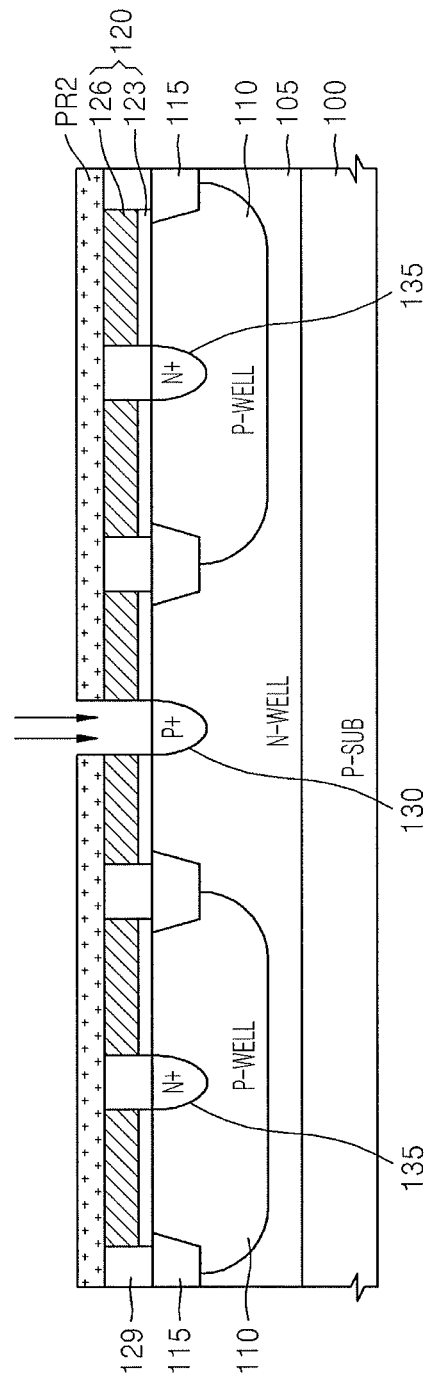

Referring to FIG. 4D, the first insulation layer 129 is again formed on all parts of the surface of the substrate 100 on which the gate structures 120 are formed. A second photoresist (PR2) pattern (through which a region between the two gate structures 120 disposed over the first well 105 is exposed) is formed on another upper portion of the first insulation layer 129. Thereafter, the first impurity region 130 is formed by etching a portion of the first insulation layer 129 exposed by the second photoresist (PR2) pattern, and injecting high density P type impurities. Thereafter, the second photoresist (PR2) pattern is removed. In this regard, the P type impurities may be, for example, boron (B), gallium (B), or indium (In).

As described above, in the present embodiment, the second impurity region 135 is first formed, and then the first impurity region 130 is formed. However, embodiments are not limited thereto. For example, in another embodiment, the first impurity region 130 is first formed, and then the second impurity region 135 is formed.

Referring to FIG. 4E, a second insulation layer 145 is formed on all parts of the surface of the substrate 100 in which the first and the second impurity regions 130 and 135 are formed. Thereafter, the contact plugs 140 are formed by forming contact holes (not shown) through which the first and the second impurity regions 130 and 135 are partially exposed, and burying the contact holes by using a metal material. In this regard, the metal material may include, for example, tungsten (W).

Referring to FIG. 4F, the first conductive layer 150 (including the first wirings 150a, the second wirings 150b, and the third wirings 150 connected, respectively, to the contact plugs 140) is formed. In this regard, the first wirings 150a and the third wiring 150c disposed over the upper portion of the first well 105 may be connected to the second conductive line M2 of FIG. 1 so that the second voltage, i.e., the positive voltage (+), may be applied to the first wirings 150a and the third wiring 150c disposed over the upper portion of the first well 105, and the second wirings 150b and the third wiring 150c disposed over the upper portion of the second well 110 may be connected to the first conductive line M1 of FIG. 1 so that the first voltage, i.e., the negative voltage (−), may be applied to the second wirings 150b and the third wiring 150c disposed over the upper portion of the first well 105. In this regard, the first wirings 150a, the second wirings 150b, and the third wirings 150c may include, for example, aluminum (Al) or copper (Cu).

Figure 5:
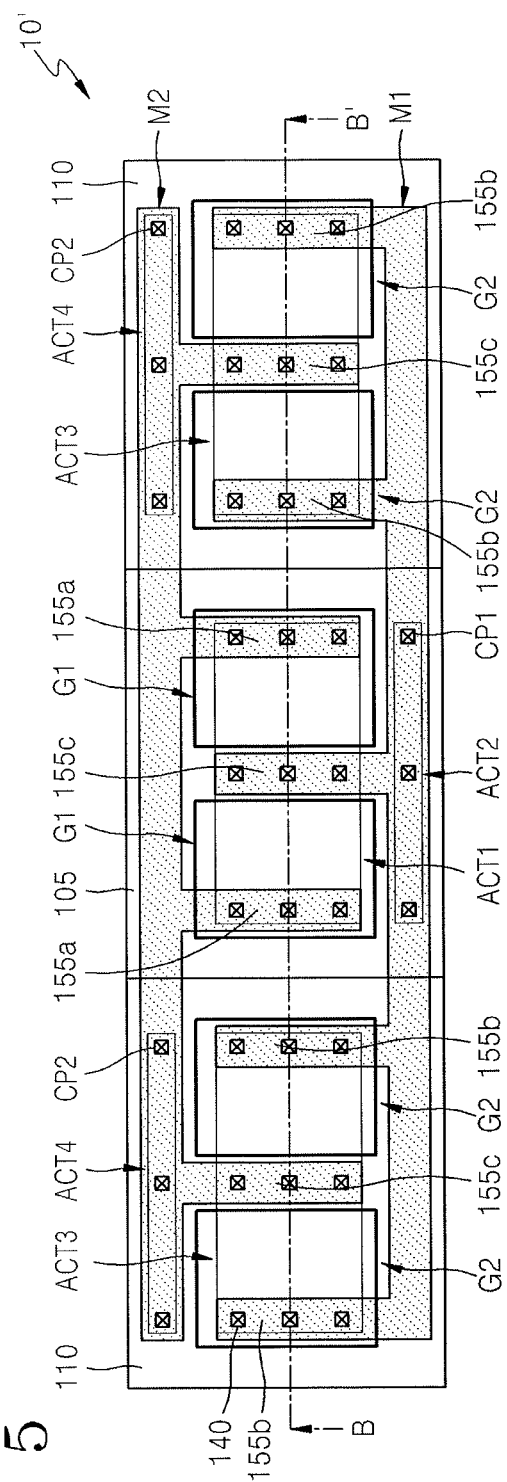
FIG. 5 illustrates a layout of a part of a capacitor device according to another example embodiment.

FIG. 5 illustrates a layout of a part of a capacitor device 10' according to another example embodiment. Referring to FIG. 5, the capacitor device 10' is a device for realizing a MOS capacitor by using an inversion mode, and may be realized in a similar manner to the capacitor device 10 of FIG. 1. Thus, each element included in the capacitor device 10' of the present embodiment uses the same reference numeral as the corresponding element of the capacitor device 10 of FIG. 1. The descriptions of the same elements between the capacitor device 10' of the present embodiment and the capacitor device 10' of FIG. 1 are not repeated here, and differences therebetween will now be described.

Wirings connected in common to the second conductive line M2 may be disposed in parallel on the upper portion of the first active region ACT1. For example, a plurality of first wirings 155a may be disposed on the upper portions of the gate electrodes G1 of the first active region ACT1, and a third wiring 155c may be disposed on the region between the gate electrodes G1 of the first active region ACT1. Wirings connected in common to the first conductive line M1 may be disposed in parallel on the upper portion of the third active region ACT3. For example, a plurality of second wirings 155b may be disposed on the upper portions of the gate electrodes G2 of the third active region ACT3, and another third wiring 155c may be disposed on the region between the gate electrodes G2 of the third active region ACT3.

In the present embodiment, the capacitor device 10' realizes a MOS capacitor by using the inversion mode, and a voltage between a gate and source included in the MOS capacitor is greater than a threshold voltage Vth. Thus, a voltage applied to the region between the two gate electrodes G1 of the first active region ACT1 is different from a voltage applied to the gate electrodes G1, and thus the first wirings 155a of the first active region ACT1 are connected in common to the second conductive line M2, and the third wiring 155c of the first active region ACT1 is connected to the first conductive line M1. Likewise, a voltage applied to the region between the two gate electrodes G2 of the third active region ACT3 is different from a voltage applied to the gate electrodes G2, and thus the second wirings 155b of the third active region ACT3 are in common connected to the first conductive line M1, and the third wiring 155c of the third active region ACT3 is connected to the second conductive line M2.

Figure 6:
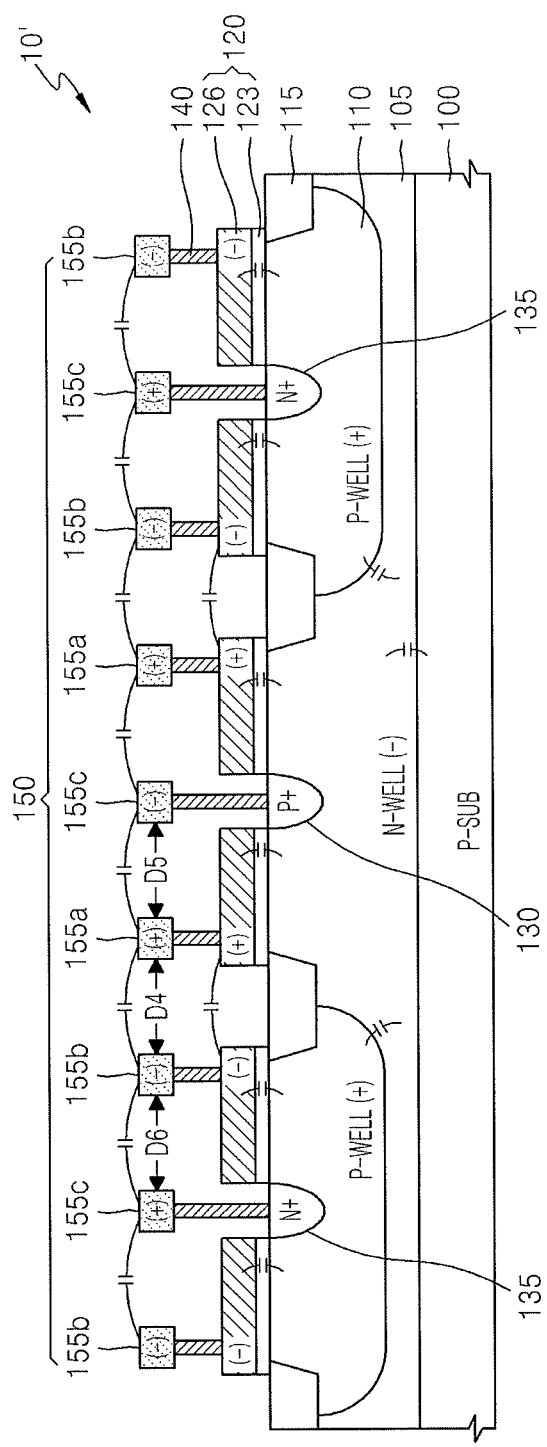
FIG. 6 illustrates a cross-sectional view of the capacitor device taken along a line B-B' of FIG. 5.

FIG. 6 illustrates a cross-sectional view of the capacitor device 10' taken along a line B-B' of FIG. 5. Referring to FIG. 6, each element included in the capacitor device 10' of the present embodiment uses the same reference numeral as the corresponding element of the capacitor device 10 of FIG. 2. The descriptions of the same elements between the capacitor device 10' of the present embodiment and the capacitor device 10 of FIG. 2 are not repeated here, and the differences therebetween will now be described.

A first conductive layer 155 including the first wirings 155a, the second wirings 155b, and the third wirings 155c may be disposed on the upper portions of the gate electrodes 126 and the upper portions of the first and second impurity regions 130 and 135. For example, the first wirings 155a may be respectively disposed on the upper portions of the gate electrodes 126 disposed over the first well 105, the second wirings 155b may be respectively disposed on the upper portions of the gate electrodes 126 disposed over the second well 110, and the third wirings 155c may be respectively disposed on the upper portions of the first and second impurity regions 130 and 135. The first, second, and third wirings 155a, 155b, and 155c may be connected to the gate electrodes 126, the first impurity region 130, and the second impurity region 135 through the contact plugs 140. In the present embodiment, the gap D4, here between the first wiring 155a and the second wiring 155b, may be substantially the same as the gap D5, here between the first wiring 155a and the third wiring 155c, and the gap D6, here between the second wiring 155b and the third wiring 155c.

The first wirings 155a and the third wiring 155c connected to the second impurity region 135 may be connected to the second conductive line M2 of FIG. 5 so that a second voltage may be applied to the first wirings 155a and the third wiring 155c connected to the second impurity region 135. The second wirings 155b and the third wiring 155c connected to the first impurity region 130 may be connected to the first conductive line M1 of FIG. 5 so that a first voltage may be applied to the second wirings 155b and the third wiring 155c connected to the first impurity region 130. In the present embodiment, the first voltage may be a negative voltage (−), and the second voltage may be a positive voltage (+). Hereinafter, the first voltage is referred to as the negative voltage (−), and the second voltage is referred to as the positive voltage (+). However, embodiments are not limited thereto. For example, in another embodiment, the first voltage may be a positive voltage (+), and the second voltage may be a negative voltage (−).

Referring to FIG. 6, the negative voltage (−) may be applied to the first well 105, and the positive voltage (+) may be applied to the second well 110. The negative voltage (−) may be applied to the first impurity region 130, and the positive voltage (+) may be applied to the second impurity region 135. The positive voltage (+) may be applied to the gate electrodes 126 disposed over the first well 105, and the negative voltage (−) may be applied to the gate electrodes 126 disposed over the second well 110.

Therefore, since different voltages may be applied to the first well 105 and the second well 110 adjacent to the first well 105, a first junction capacitor may be formed, and since different voltages may be applied to the substrate 100 and the first well 105 adjacent to the substrate 100, a second junction capacitor may be formed. Meanwhile, since the same voltage may be applied to the first impurity region 130 and the first well 105, a junction capacitor may not be formed, and since the same voltage may be applied to the second impurity region 135 and the second well 110, a junction capacitor may not be formed.

Further, since different voltages may be applied to the first well 105 and the gate electrodes 126 disposed over the first well 105, and the gate insulation layers 123 is disposed therebetween, a first MOS capacitor may be formed. Further, since different voltages may be applied to the second well 110 and the gate electrodes 126 disposed over the second well 110, and the gate insulation layers 123 is disposed therebetween, a second MOS capacitor may be formed.

Since different voltages may be applied to the gate electrode 126 disposed over the first well 105 and the gate electrode 126 disposed over the second well 110, and an insulation material may exist therebetween, a first MIM capacitor may be formed. Similarly, since different voltages may be applied to two adjacent wirings among the first wirings 155a, the second wirings 155b, and the third wirings 155c, and an insulation material may exist therebetween, a second MIM capacitor may be formed.

Therefore, the capacitance of the capacitor device 10' may include the sum of the capacitances of the first and second junction capacitors, the first and second MOS capacitors, and the first and second MIM capacitors.

Figure 7:
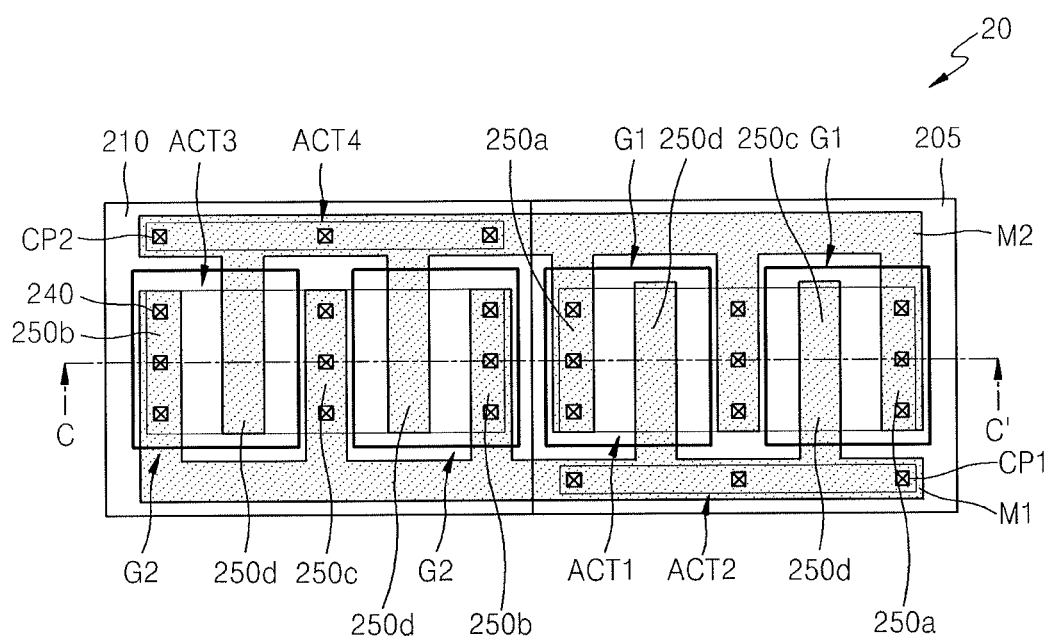
FIG. 7 illustrates a layout of a part of a capacitor device according to another example embodiment.

FIG. 7 illustrates a layout of a part of a capacitor device 20 according to another example embodiment. Referring to FIG. 7, the capacitor device 20 is a device for realizing a MOS capacitor by using an accumulation mode, and may be formed on a substrate including a first well 205 and a second well 210. Active regions ACT1, ACT2, ACT3, and ACT4 may be defined by isolation layers in the first and second wells 205 and 210. For example, the first and second active regions ACT1 and ACT2 may be defined by the isolation layers in the first well 205, and the third and fourth ACT3 and ACT4 may be defined by the isolation layers in the second well 210.

A plurality of gate electrodes G1 may be disposed on an upper portion of the first active region ACT1, so that MOS capacitors may be formed in the first active region ACT1. A plurality of gate electrodes G2 may be disposed on an upper portion of the third active region ACT3, so that MOS capacitors may be formed in the third active region ACT3. Although the two gate electrodes G1 are disposed on the upper portion of the first active region ACT1 and the two gate electrodes G2 are disposed on the upper portion of the third active region ACT3 in the present embodiment, embodiments are not limited thereto. For example, in another embodiment, one gate electrode may be disposed on the upper portion of each active region. In another embodiment, three or more gate electrodes may be disposed on the upper portion of each active region.

A first conductive line M1 extending in a horizontal direction may be disposed on an upper portion of the second active region ACT2. The first conductive line M1 is connected to the second active region ACT2 through a contact plug CP1, so that a voltage of the first conductive line M1 may be applied to the second active region ACT2. A second conductive line M2 extending in a horizontal direction may be disposed on an upper portion of the fourth active region ACT4. The second conductive line M2 is connected to the fourth active region ACT4 through a contact plug CP2, so that a voltage of the second conductive line M2 may be applied to the fourth active region ACT4.

Wirings may be disposed in parallel on the upper portion of the first active region ACT1. For example, a plurality of first wirings 250a connected in common to the second conductive line M2 and a plurality of fourth wirings 250d connected in common to the first conductive line M1 may be disposed on upper portions of the gate electrodes G1 of the first active region ACT1, and a third wiring 250c connected to the second conductive line M2 may be disposed on a region between the gate electrodes G1 of the first active region ACT1. In this regard, the first wirings 250a and the third wiring 250c of the first active region ACT1 may be respectively connected to the gate electrodes G1 and the region between the gate electrodes G1 through contact plugs 240, and the fourth wirings 250d of the first active region ACT1 may be insulated from the gate electrodes G1.

Wirings may be disposed in parallel on the upper portion of the third active region ACT3. For example, another plurality of second wirings 250b connected in common to the first conductive line M1 and another plurality of the fourth wirings 250d connected in common to the second conductive line M2 may be disposed on upper portions of the gate electrodes G2 of the third active region ACT3, and another third wiring 250c connected to the first conductive line M1 may be disposed on a region between the gate electrodes G2 of the third active region ACT3. In this regard, the first wirings 250a and the third wiring 250c of the third active region ACT3 may be respectively connected to the gate electrodes G2 and the region between the gate electrodes G2 through the contact plugs 240, and the fourth wirings 250d of the third active region ACT3 may be insulated from the gate electrodes G2.

In the present embodiment, the capacitor device 20 realizes a MOS capacitor by using the accumulation mode, and a voltage between a gate and source included in the MOS capacitor is below 0. Thus, a voltage applied to the region between the two gate electrodes G1 of the first active region ACT1 is the same as a voltage applied to the gate electrodes G1, and thus the first wirings 250a and the third wiring 250c of the first active region ACT1 are connected in common to the second conductive line M2. Likewise, a voltage applied to the region between the two gate electrodes G2 of the third active region ACT3 is the same as a voltage applied to the gate electrodes G2, and thus the second wirings 250b and the third wiring 250c of the third active region ACT3 are connected in common to the first conductive line M1.

Figure 8:
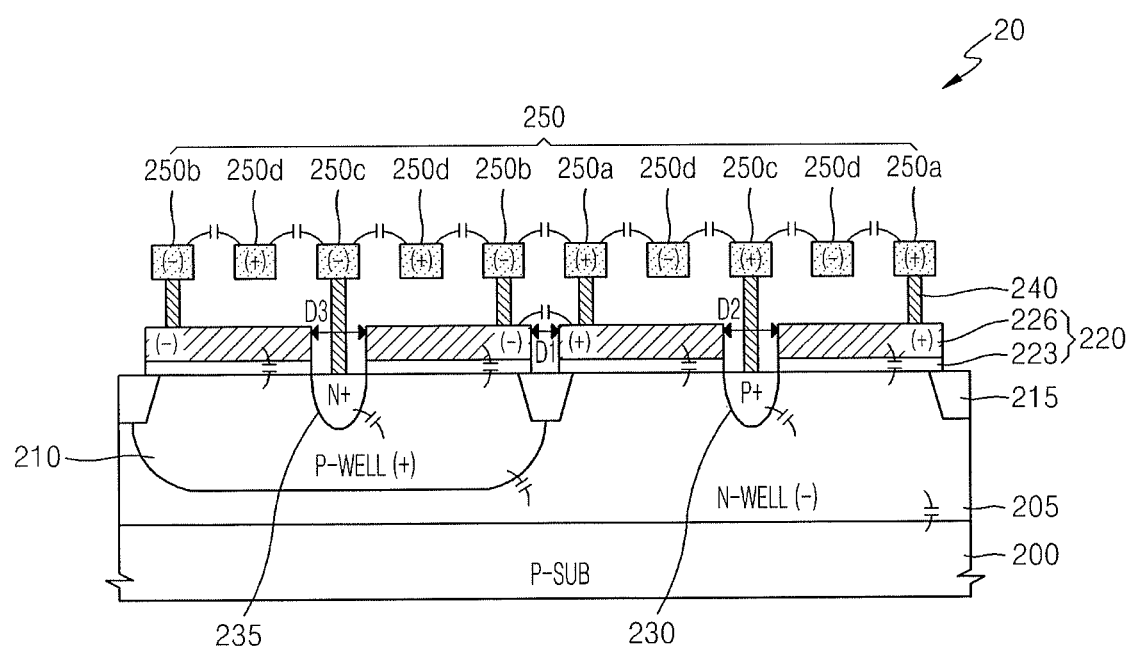
FIG. 8 illustrates a cross-sectional view of the capacitor device taken along a line C-C' of FIG. 7.
Figure 9:
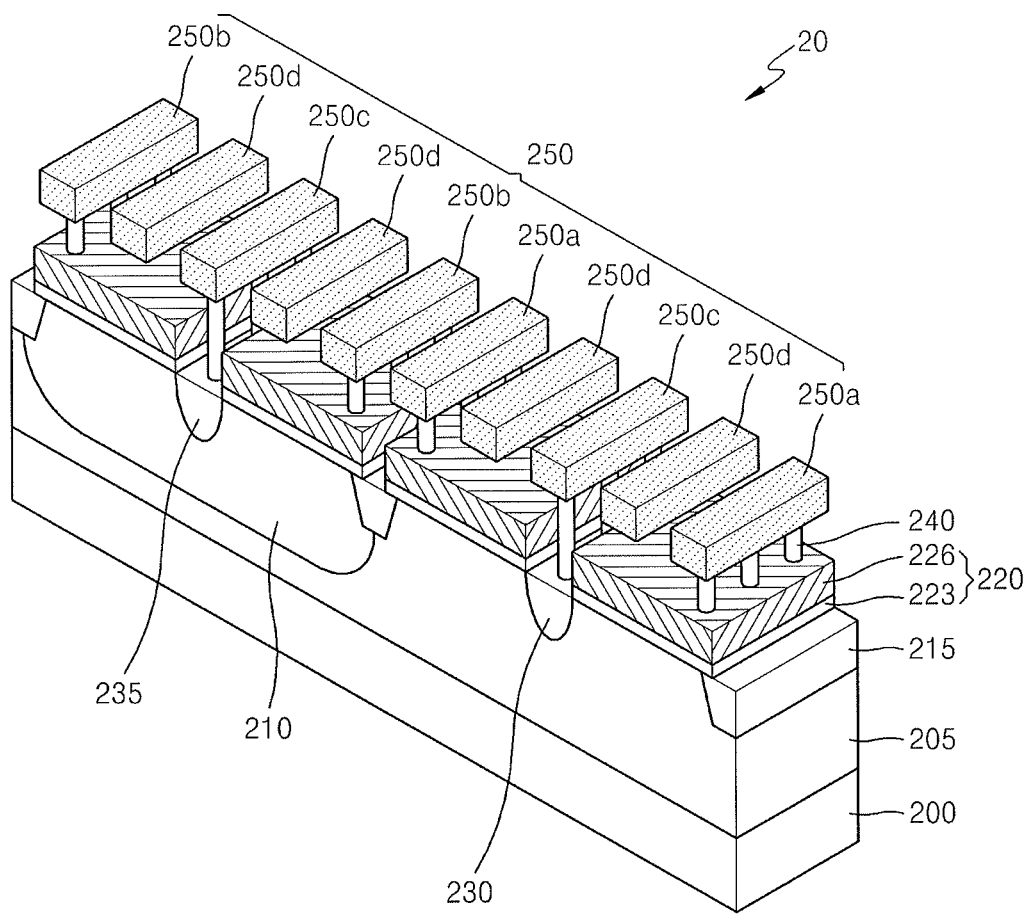
FIG. 9 illustrates a perspective view of the capacitor device of FIG. 8.

FIG. 8 illustrates a cross-sectional view of the capacitor device 20 taken along a line C-C' of FIG. 7. FIG. 9 illustrates a perspective view of the capacitor device 20 of FIG. 8. Referring to FIGS. 8 and 9, the first well 205 and the second well 210 are formed in a substrate 200. For example, the first well 205 may be formed in the substrate 200, and the second well 210 may be formed in the first well 205. Thus, the substrate 200, the first well 205, and the second well 210 may form a triple well structure. Isolation layers 215 may be disposed in a boundary region between the first well 205 and the second well 210, and may be used to define active regions.

The first well 205 may have a first conductivity type. The second well 210 and the substrate 200 may have a second conductivity type. In the present embodiment, the first conductivity type is an N type, and the second conductivity type is a P type. In this regard, the substrate 200 is illustrated as a P type substrate P-SUB, the first well 205 is illustrated as an N well N-WELL, and the second well 210 is illustrated as a P well P-WELL. However, embodiments are not limited thereto. For example, in another embodiment, the first conductivity type may be the P type, and the second conductivity type may be the N type. In this regard, the substrate 200 is an N type substrate, the first well 205 is a P well, and the second well 210 is an N well.

Referring to FIGS. 8 and 9, a plurality of gate structures 220 may be disposed over the first well 205 and the second well 210, and each may include a gate insulation layer 223 and a gate electrode 226 that are sequentially formed. The gate electrodes 226 disposed over the first well 205 may correspond to the gate electrodes G1 of FIG. 7, and the gate electrodes 226 disposed over the second well 210 may correspond to the gate electrodes G2 of FIG. 7.

In the present embodiment, a gap D1 between the gate electrode 226 disposed over the first well 205 and the gate electrode 226 disposed over the second wells 210 may be smaller than the gap D2 between the gate electrodes 226 disposed over the first well 205. The gap D1 between the gate electrode 226 disposed over the first well 205 and the gate electrode 226 disposed over the second well 210 may be smaller than a gap D3 between the gate electrodes 226 disposed over the second well 210. Furthermore, the gap D2 between the gate electrodes 226 disposed over the first well 205 may be substantially the same as the gap D3 between the gate electrodes 226 disposed over the second well 210.

A first impurity region 230 may be disposed between the two gate structures 220 disposed over the first well 205, and may include second conductivity type impurities. A second impurity region 235 may be disposed between the two gate structures 220 disposed over the second well 210, and may include first conductivity type impurities.

In the present embodiment, since the first conductivity type is the N type, and the second conductivity type is the P type, the first impurity region 230 may be a P type impurity region, and the second impurity region 235 may be an N type impurity region. Further, although one first impurity region 230 is disposed in the first well 205 and one second impurity region 235 is disposed in the second well 210 in the present embodiment, embodiments are not limited thereto. For example, in another embodiment, two or more impurity regions may be disposed in each well.

A first conductive layer 250 including the first wirings 250a, the second wirings 250b, the third wirings 250c, and the fourth wirings 250d may be disposed on upper portions of the gate electrodes 226 and upper portions of the first and second impurity regions 230 and 235. For example, the first wirings 250a, respectively, may be disposed on the upper portions of the gate electrodes 226 disposed over the first well 205, the second wirings 250b, respectively, may be disposed on the upper portions of the gate electrodes 226 disposed over the second well 210. The third wirings 250c, respectively, may be disposed on the upper portions of the first and second impurity regions 230 and 235. The first, second, and third wirings 250a, 250b, and 250c may be connected to the gate electrodes 226, the first impurity region 230, and the second impurity region 235 through the contact plugs 240. Further, the fourth wirings 250d connected to the first conductive line M1 may be disposed between the first wiring 250a and the third wiring 250c on an upper portion of the first well 205, and the fourth wirings 250d connected to the second conductive line M2 between the second wiring 250b and the third wiring 250c on an upper portion of the second well 210. In this regard, the fourth wirings 250d are not electrically connected to the gate electrodes 226. In the present embodiment, gaps between the first through fourth wirings 250a, 250b, 250c, and 250d may be substantially the same.

The first wirings 250a and the third wirings 250c disposed over the upper portion of the first well 205 and the fourth wirings 250d disposed over the upper portion of the second well 210 may be connected to the second conductive line M2 of FIG. 7 so that a second voltage may be applied thereto. The second wirings 250b and the third wirings 250c disposed over the upper portions of the second well 210 and the fourth wirings 250d disposed over the upper portion of the first well 205 may be connected to the first conductive line M1 of FIG. 7 so that a first voltage may be applied thereto. In the present embodiment, the first voltage may be a negative voltage (−), and the second voltage may be a positive voltage (+). Hereinafter, the first voltage is referred to as the negative voltage (−), and the second voltage is referred to as the positive voltage (+). However, embodiments are not limited thereto. For example, in another embodiment, the first voltage may be a positive voltage (+), and the second voltage may be a negative voltage (−).

Thus, the negative voltage (−) may be applied to the first well 205, and the positive voltage (+) may be applied to the second well 210. The positive voltage (+) may be applied to the first impurity region 230, and the negative voltage (−) may be applied to the second impurity region 235. The positive voltage (+) may be applied to the gate electrodes 226 disposed over the first well 205, and the negative voltage (−) may be applied to the gate electrodes 226 disposed over the second well 210.

Therefore, since different voltages may be applied to the first well 205 and the second well 210 adjacent to the first well 205, a first junction capacitor may be formed, and since different voltages may be applied to the substrate 200 and the first well 205 adjacent to the substrate 200, a second junction capacitor may be formed. Furthermore, since different voltages may be applied to the first impurity region 230 and the first well 205 adjacent to the first impurity region 230, a third junction capacitor may be formed, and since different voltages may be applied to the second impurity region 235 and the second well 210 adjacent to the second impurity region 235, a fourth junction capacitor may be formed.

Further, since different voltages may be applied to the first well 205 and the gate electrodes 226 disposed over the first well 205, and the gate insulation layers 223 are disposed therebetween, a first MOS capacitor may be formed. Further, since different voltages may be applied to the second well 210 and the gate electrodes 226 disposed over the second well 210, and the gate insulation layers 223 are disposed therebetween, a second MOS capacitor may be formed.

Since different voltages may be applied to the gate electrodes 226 disposed over the second well 210 and the gate electrodes 226 disposed over the first well 205, and an insulation material may exist therebetween, a first MIM capacitor may be formed. Since different voltages may be applied to two adjacent wirings among the first through fourth wirings 250a, 250b, 250c, and 250d, and an insulation material may exist therebetween, a second MIM capacitor may be formed.

Therefore, the capacitance of the capacitor device 20 may include the sum of the capacitance of the first through fourth junction capacitors, the first and second MOS capacitors, and the first and second MIM capacitors. Unlike the capacitor device 10 of FIG. 2, the capacitor device 20 of the present embodiment includes the fourth wirings 250d that are formed between the third wiring 250c connected to the first impurity region 230 and the first wirings 250a connected to the gate electrodes 226, and have different voltages applied thereto, and includes the fourth wirings 250d that are formed between the third wiring 250c connected to the second impurity region 235 and the second wirings 250b connected to the gate electrodes 226, and have different voltages applied thereto, thereby further increasing a second MIM capacitance between the wirings included in the first conductive layer 250.

Figure 10A:
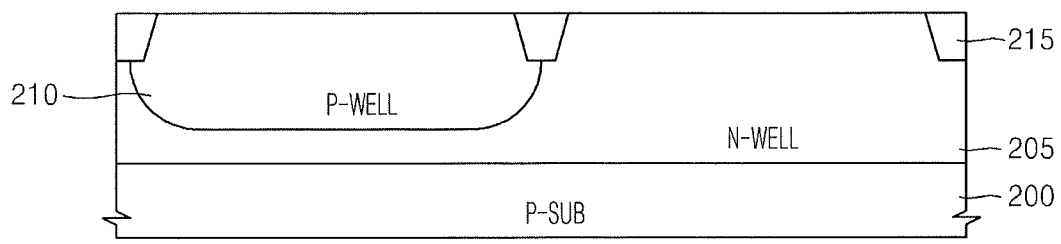
FIGS. 10A through 10F illustrate cross-sectional views of stages in a method of fabricating the capacitor device of FIG. 8 according to another example embodiment.

FIGS. 10A through 10F illustrate cross-sectional views of stages in a method of fabricating the capacitor device 20 of FIG. 8 according to another example embodiment. Referring to FIG. 10A, the substrate 200 is prepared. In this regard, the substrate 200 may be a semiconductor substrate, for example, formed of any one of silicon, silicon-on-insulator, silicon-on-sapphire, germanium, and gallium-arsenide. In the present embodiment, the substrate 200 may be a P type semiconductor substrate.

The first well 205 is formed by injecting first conductivity type impurities into all parts of a surface of the substrate 200. Thereafter, the second well 210 is formed by injecting second conductivity type impurities into a partial region of the first well 205 by using, for example, a photoresist process. In the present embodiment, the first conductivity type may be the N type, and the second conductivity type may be the P type. Thus, the first conductivity type impurities may be N type impurities, for example, phosphorus (P), arsenic (As), or antimony (Sb), and the second conductivity type impurities may be P type impurities, for example, boron (B), gallium (B), or indium (In).

The isolation layers 215 for defining active regions are formed in the substrate 200 in which the first and second wells 205 and 210 are formed. In this regard, the isolation layers 215 may be formed by, for example, an STI process.

Figure 10B:
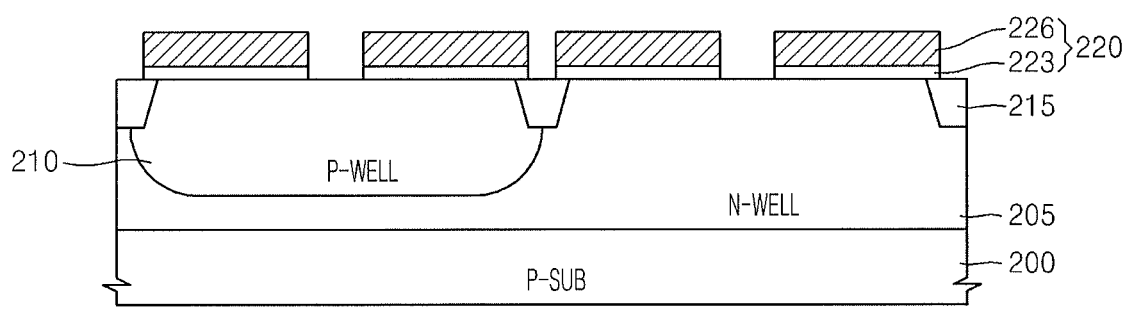

Referring to FIG. 10B, the gate structures 220 are formed by sequentially depositing the gate insulation layers 223 and the gate electrodes 226 over the first and second wells 205 and 210 and patterning the sequentially deposited layers. In this regard, the gate insulation layers 223 may each be a single layer or a composite layer including, for example, one or more of silicon oxide ($SiO_2$), silicon nitride ($Si_3N_4$), silicon oxynitride (SiON), hafnium oxide ($HfO_2$), hafnium silicon oxide ($HfSi_xO_y$), aluminum oxide ($Al_2O_3$), and zirconium oxide ($ZrO_2$).

Further, the gate electrodes 226 may each be a single layer or a composite layer including, for example, one or more of polysilicon, aluminum (Al), gold (Au), beryllium (Be), bismuth (Bi), cobalt (Co), hafnium (Hf), indium (In), manganese (Mn), molybdenum (Mo), nickel (Ni), lead (Pb), palladium (Pd), platinum (Pt), rhodium (Rh), rhenium (Re), tantalum (Ta), tellurium (Te), titanium (Ti), tungsten (W), zinc (Zn), zirconium (Zr), nitrides thereof, and silicides thereof.

Figure 10C:
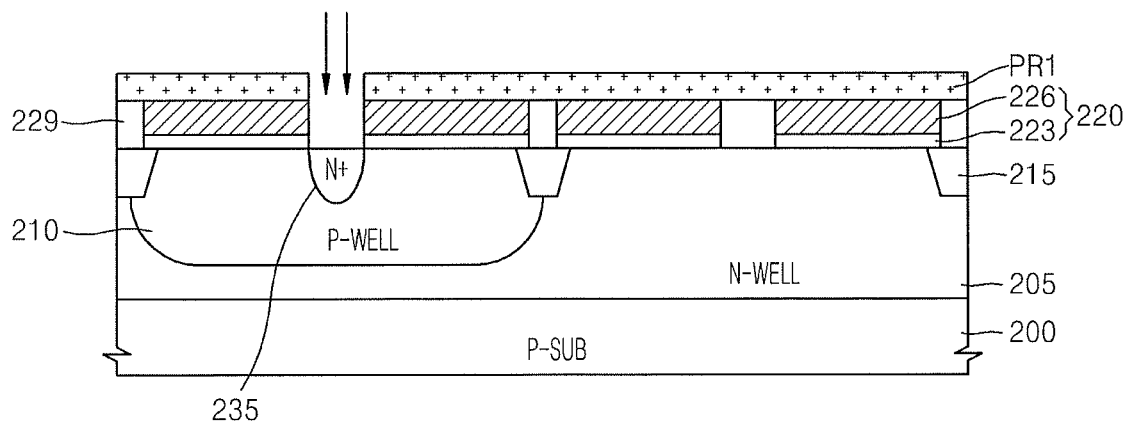

Referring to FIG. 10C, a first insulation layer 229 is formed on all parts of the surface of the substrate 200 on which the gate structures 220 are formed, and a first photoresist (PR1) pattern (through which a region between the two gate structures 220 disposed over the second well 210 is exposed) is formed on an upper portion of the first insulation layer 229. Thereafter, the second impurity region 235 is formed by etching a portion of the first insulation layer 229 exposed by the first photoresist (PR1) pattern, and injecting high density N type impurities. Thereafter, the first photoresist (PR1) pattern is removed. In this regard, the N type impurities may be, for example, phosphorus (P), arsenic (As), or antimony (Sb).

Figure 10D:
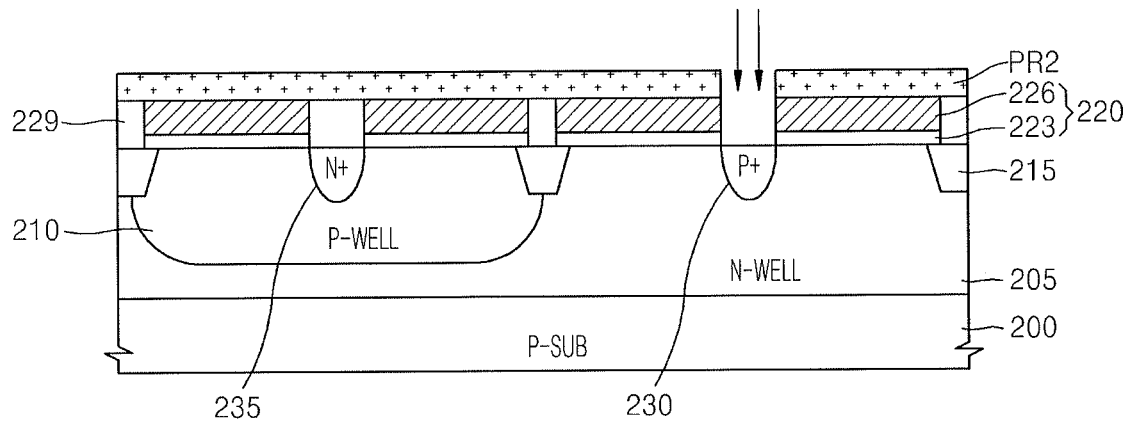

Referring to FIG. 10D, the first insulation layer 229 is again formed on all parts of the surface of the substrate 200 on which the gate structures 220 are formed, and a second photoresist (PR2) pattern (through which a region between the two gate structures 220 disposed over the first well 205 is exposed) is formed on another upper portion of the first insulation layer 229. Thereafter, the first impurity region 230 is formed by etching a portion of the first insulation layer 229 exposed by the second photoresist (PR2) pattern, and injecting high density P type impurities. Thereafter, the second photoresist (PR2) pattern is removed. In this regard, the P type impurities may be, for example, boron (B), gallium (B), or indium (In).

As described above, in the present embodiment, the second impurity region 235 is first formed, and then the first impurity region 230 is formed. However, embodiments are not limited thereto. For example, in another embodiment, the first impurity region 230 is first formed, and then the second impurity region 235 is formed.

Figure 10E:
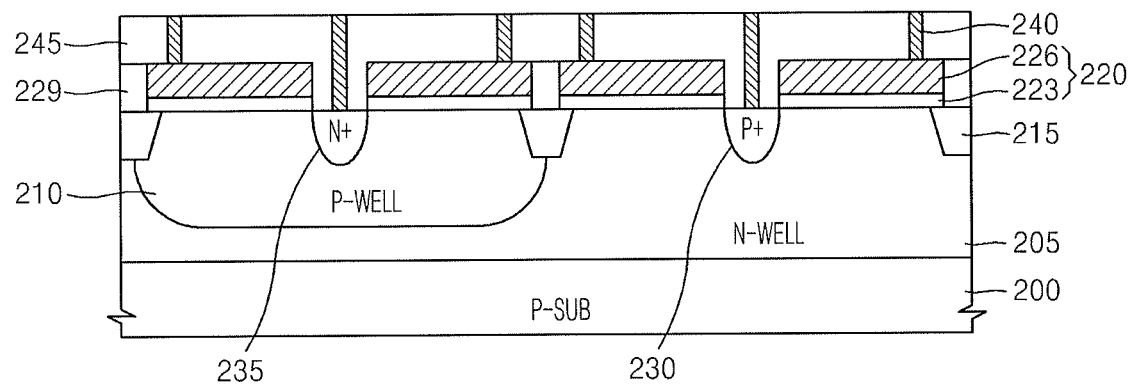

Referring to FIG. 10E, a second insulation layer 245 is formed on all parts of the surface of the substrate 200 in which the first and the second impurity regions 230 and 235 are formed. Thereafter, the contact plugs 240 are formed by forming contact holes (not shown) through which the first and the second impurity regions 230 and 235 are partially exposed, and burying the contact holes by using a metal material. In this regard, the metal material may include, for example, tungsten (W).

Figure 10F:
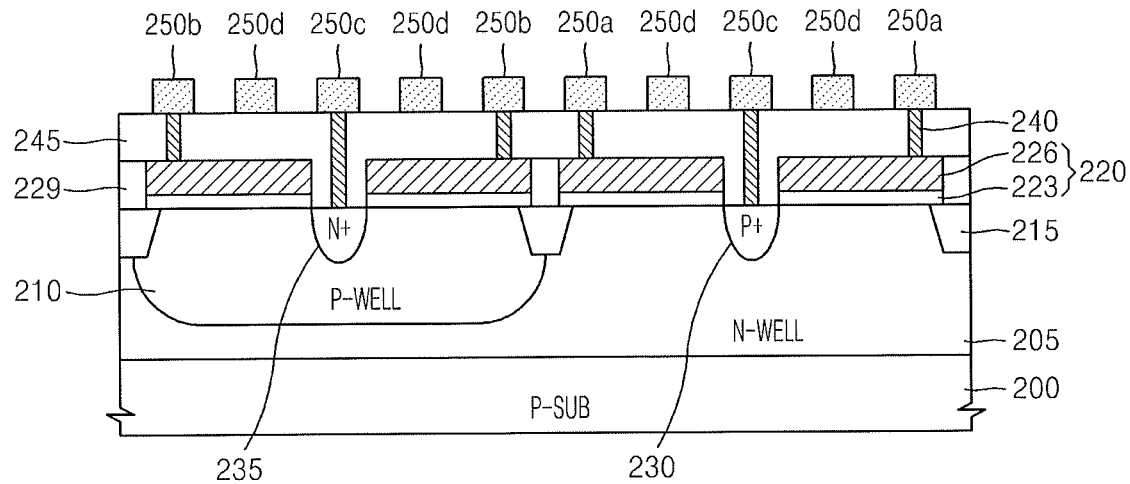

Referring to FIG. 10F, the first conductive layer 250 including the first wirings 250a, the second wirings 250b, and the third wirings 250c connected, respectively, to the contact plugs 140 and including the fourth wirings 250d insulated from the gate electrodes 226 is formed. In this regard, the first wirings 250a and the third wiring 250c disposed over the upper portion of the first well 205 and the fourth wirings 250d disposed over the upper portion of the second well 210 may be connected to the second conductive line M2 of FIG. 7 so that the second voltage, i.e., the positive voltage (+), may be applied to the first wirings 250a the third wiring 250c disposed over the upper portion of the first well 205 and the fourth wirings 250d disposed over the upper portion of the second well 210, and the second wirings 250b and the third wiring 250c disposed over the upper portion of the second well 210 and the fourth wirings 250d disposed over the upper portion of the first well 205 may be connected to the first conductive line M1 of FIG. 7 so that the first voltage, i.e., the negative voltage (−), may be applied to the second wirings 250b and the third wiring 250c disposed over the upper portion of the second well 210 and the fourth wirings 250d disposed over the upper portion of the first well 205. In this regard, the first through fourth wirings 250a, 250b, 250c, and 250d may include, for example, aluminum (Al) or copper (Cu).

Figure 11:
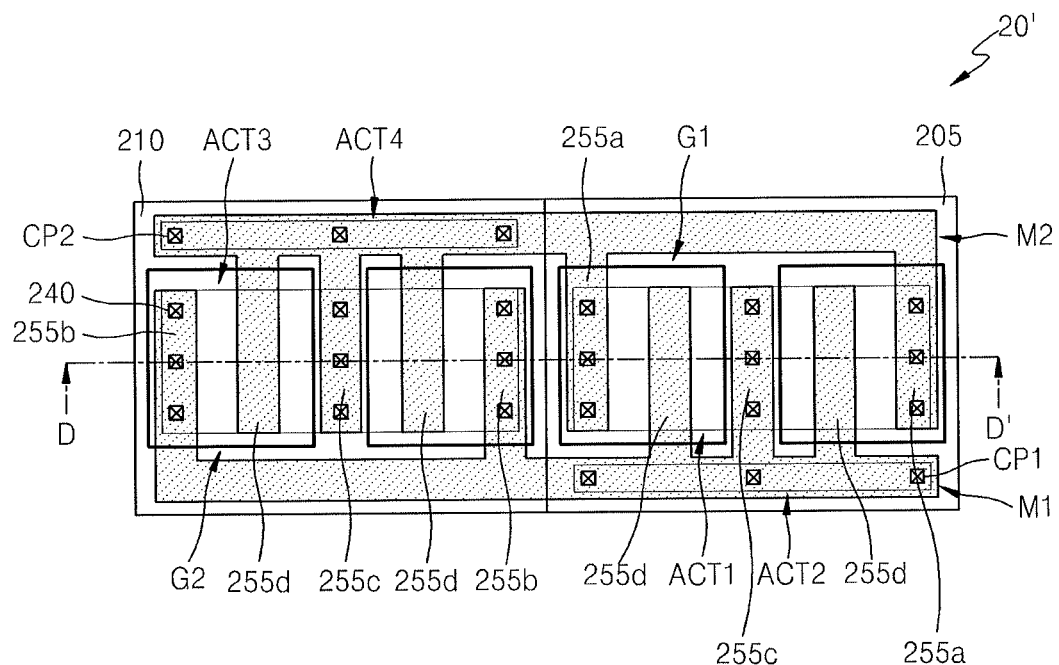
FIG. 11 illustrates a layout of a part of a capacitor device according to another example embodiment.

FIG. 11 illustrates a layout of a part of a capacitor device 20' according to another example embodiment. Referring to FIG. 11, the capacitor device 20' is a device for realizing a MOS capacitor by using an inversion mode, and may be realized in a similar manner to the capacitor device 20 of FIG. 7. Thus, each element included in the capacitor device 20' of the present embodiment uses the same reference numeral as the corresponding element of the capacitor device 20 of FIG. 7. The descriptions of the same elements between the capacitor device 20' of the present embodiment and the capacitor device 20 of FIG. 7 are not repeated here, and differences therebetween will now be described.

Wirings may be disposed in parallel on the upper portion of the first active region ACT1. For example, a plurality of first wirings 255a connected in common to the second conductive line M2 and a plurality of fourth wirings 255d connected in common to the first conductive line M1 may be disposed on the upper portions of the gate electrodes G1 of the first active region ACT1, and a third wiring 255c connected to the second conductive line M2 may be disposed on the region between the gate electrodes G1 of the first active region ACT1. In this regard, the first wirings 255a and the third wiring 255c of the first active region ACT1 may be respectively connected to the gate electrodes G1 and the region between the gate electrodes G1 through the contact plugs 240, and the fourth wirings 255d of the first active region ACT1 may be insulated from the gate electrodes G1.

Wirings may be disposed in parallel on the upper portion of the third active region ACT3. For example, another plurality of second wirings 255b connected in common to the first conductive line M1 and another plurality of the fourth wirings 255d connected in common to the second conductive line M2 may be disposed on the upper portions of the gate electrodes G2 of the third active region ACT3, and another third wiring 255c connected to the first conductive line M1 may be disposed on the region between the gate electrodes G2 of the third active region ACT3. In this regard, the first wirings 255a and the third wiring 255c of the third active region ACT3 may be respectively connected to the gate electrodes G2 and the regions between the gate electrodes G2 through the contact plugs 240, and the fourth wirings 255d of the third active region ACT3 may be insulated from the gate electrodes G2.

In the present embodiment, the capacitor device 20' realizes a MOS capacitor by using the inversion mode, and a voltage between a gate and source included in the MOS capacitor is greater than a threshold voltage Vth. A voltage applied to the region between the two gate electrodes G1 of the first active region ACT1 is different from a voltage applied to the gate electrodes G1, and thus the first wirings 255a of the first active region ACT1 are connected in common to the second conductive line M2, and the third wiring 255c of the first active region ACT1 is connected to the first conductive line M1. Likewise, a voltage applied to the region between the two gate electrodes G2 of the third active region ACT3 is different from a voltage applied to the gate electrodes G2, and thus the second wirings 255b of the third active region ACT3 are connected in common to the first conductive line M1, and the third wiring 255c of the third active region ACT3 is connected to the second conductive line M2.

Figure 12:
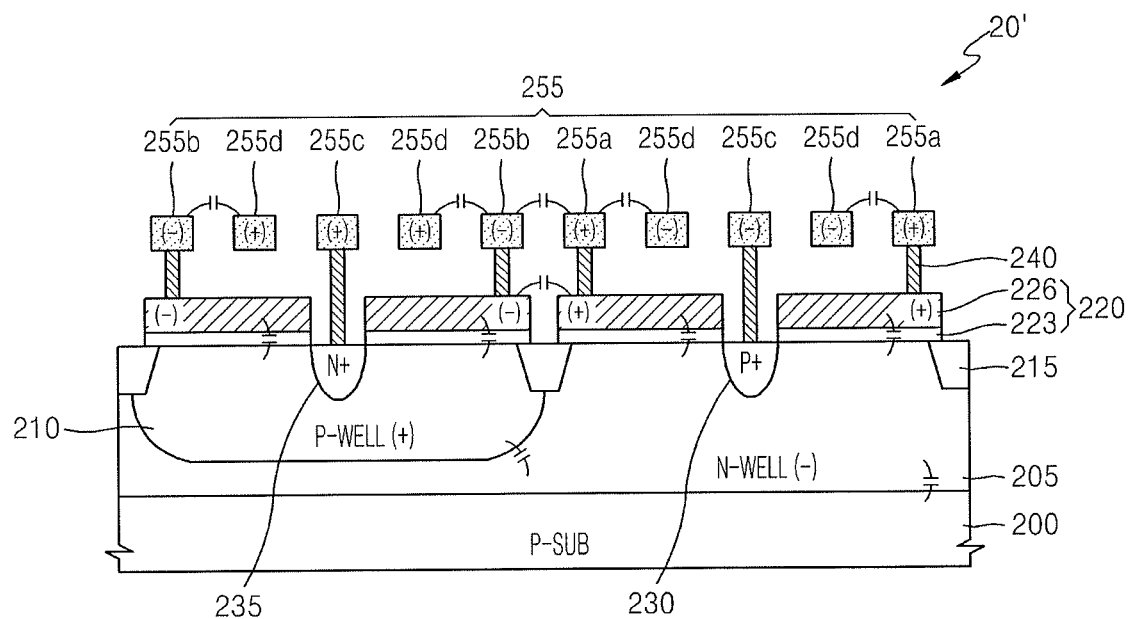
FIG. 12 illustrates a cross-sectional view of the capacitor device taken along a line D-D' of FIG. 11.

FIG. 12 illustrates a cross-sectional view of the capacitor device 20' taken along a line D-D' of FIG. 11. Referring to FIG. 12, each element included in the capacitor device 20' of the present embodiment use the same reference numeral as the corresponding element of the capacitor device 20 of FIG. 8. The descriptions of the same elements between the capacitor device 20' of the present embodiment and the capacitor device 20 of FIG. 8 are not repeated here, and the differences therebetween will now be described.

A first conductive layer 255 including the first wirings 255a, the second wirings 255b, the third wirings 255c, and the fourth wirings 255d may be disposed on the upper portions of the gate electrodes 226 and the upper portions of the first and second impurity regions 230 and 235. For example, the first wirings 255a may be respectively disposed on the upper portions of the gate electrodes 226 disposed over the first well 205, and the second wirings 255b may be respectively disposed on the upper portions of the gate electrodes 226 disposed over the second well 210. The third wirings 255c may be respectively disposed on the upper portions of the first and second impurity regions 230 and 235. The first, second, and third wirings 255a, 255b, and 255c may be connected to the gate electrodes 226, the first impurity region 230, and the second impurity region 235 through the contact plugs 240. Further, the fourth wirings 255d of the first active region ACT1 may be disposed between the first wiring 255a and the third wiring 255c on the upper portion of the second well 210, and the fourth wirings 255d of the third active region ACT3 may be disposed between the second wiring 255b and the third wiring 255c on the upper portion of the second well 210. In this regard, the fourth wirings 250d are not electrically connected to the gate electrodes 226. In the present embodiment, gaps between the first through fourth wirings 255a, 255b, 255c, and 255d may be substantially the same.

The first wirings 255a disposed over the upper portion of the first well 205 and the third wiring 255c and the fourth wirings 255d disposed on the upper portion of the second well 210 may be connected to the second conductive line M2 of FIG. 11 so that a second voltage may be applied thereto. The second wirings 255b disposed over the upper portion of the second well 210 and the third wiring 255c and the fourth wirings 255d disposed on the upper portion of the first well 205 may be connected to the first conductive line M1 of FIG. 11 so that a first voltage may be applied thereto. In the present embodiment, the first voltage may be a negative voltage (−), and the second voltage may be a positive voltage (+). Hereinafter, the first voltage is referred to as the negative voltage (−), and the second voltage is referred to as the positive voltage (+). However, embodiments are not limited thereto. For example, in another embodiment, the first voltage may be a positive voltage (+), and the second voltage may be a negative voltage (−).

Referring to FIG. 12, the negative voltage (−) may be applied to the first well 205, and the positive voltage (+) may be applied to the second well 210. The negative voltage (−) may be applied to the first impurity region 230, and the positive voltage (+) may be applied to the second impurity region 235. The positive voltage (+) may be applied to the gate electrodes 226 disposed over the first well 205, and the negative voltage (−) may be applied to the gate electrodes 226 disposed over the second well 210.

Therefore, since different voltages may be applied to the first well 205 and the second well 210 adjacent to the first well 205, a first junction capacitor may be formed, and since different voltages may be applied to the substrate 200 and the first well 205 adjacent to the substrate 200, a second junction capacitor may be formed. Meanwhile, since the same voltage may be applied to the first impurity region 230 and the first well 205 adjacent to the first impurity region 230, no junction capacitor is formed, and since the same voltage may be applied to the impurity region 235 and the second well 210 adjacent to the second impurity region 235, no junction capacitor is formed.

Further, since different voltages may be applied to the first well 205 and the gate electrodes 226 disposed over the first well 205, and the gate insulation layers 223 are disposed therebetween, a first MOS capacitor may be formed. Further, since different voltages may be applied to the second well 210 and the gate electrodes 226 disposed over the second well 210, and the gate insulation layers 223 are disposed therebetween, a second MOS capacitor may be formed.

Since different voltages may be applied to the gate electrodes 226 disposed over the second well 210 and the gate electrodes 226 disposed over the first well 205, and an insulation material may exist therebetween, a first MIM capacitor may be formed. Since different voltages may be applied to the first and second wirings 255a and 255b, the first and fourth wirings 255a and 255d of the first active region ACT1, the second and fourth wirings 255b and 255d of the third active region ACT3, and an insulation material may exist therebetween, a second MIM capacitor may be formed.

Therefore, the capacitance of the capacitor device 20' may include the sum of the capacitance of the first and second junction capacitors, the first and second MOS capacitors, and the first and second MIM capacitors.

Figure 13:
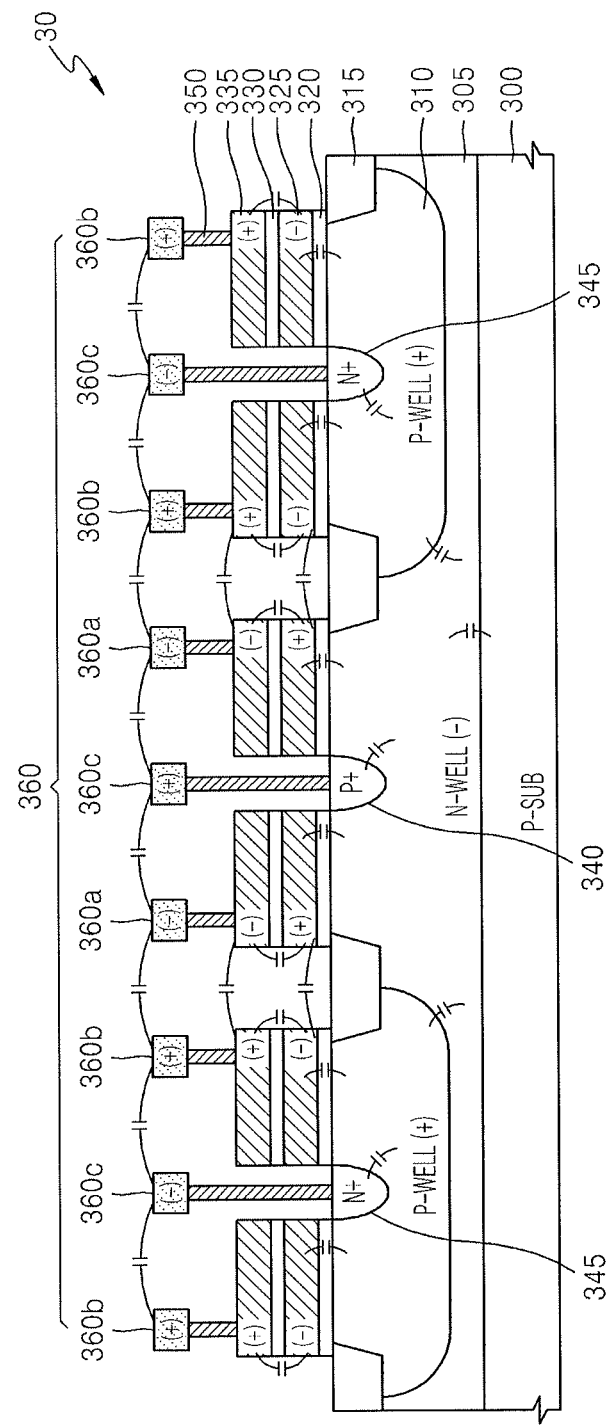
FIG. 13 illustrates a cross-sectional view of a capacitor device according to another example embodiment.
Figure 14:
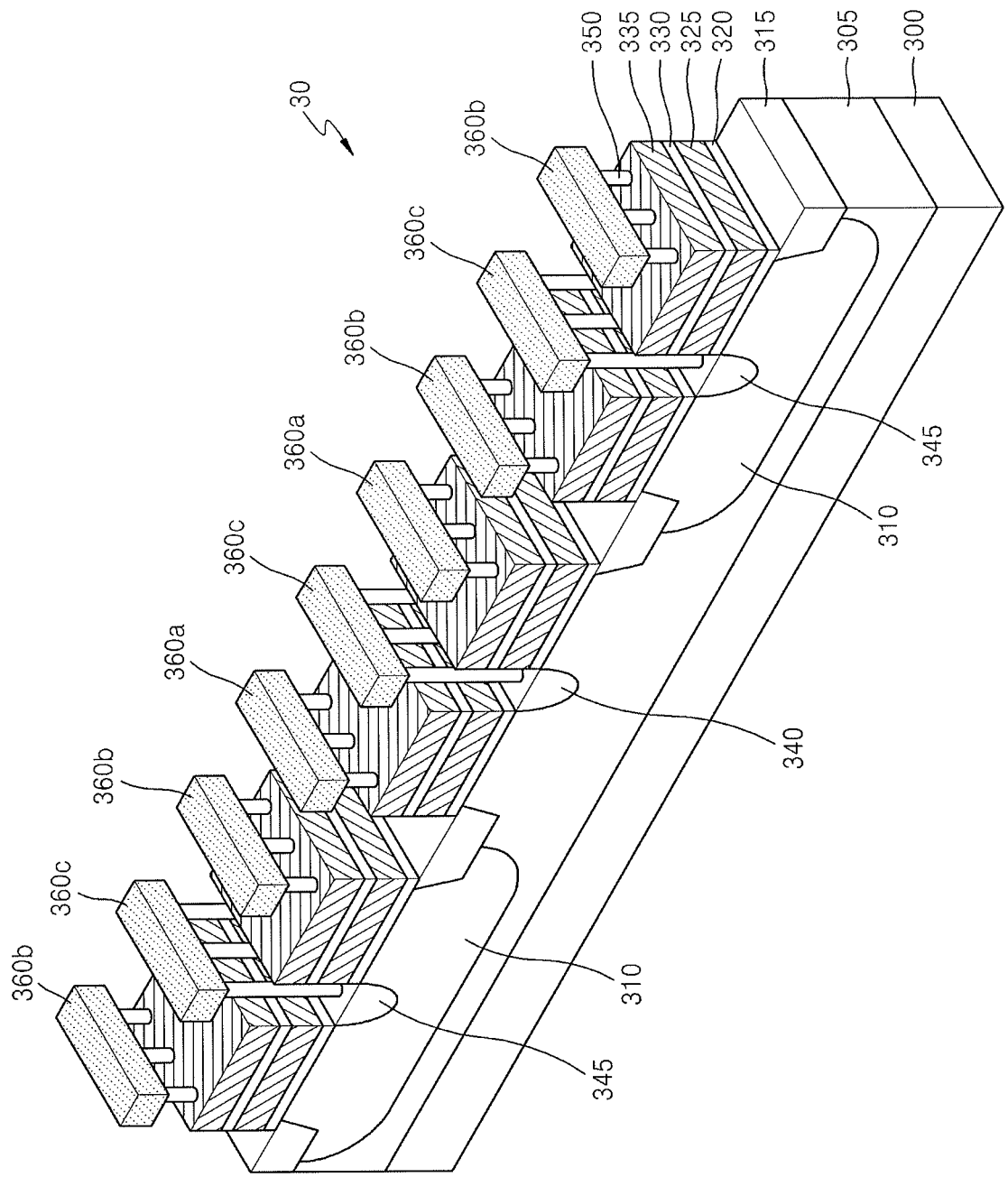
FIG. 14 illustrates a perspective view of the capacitor device of FIG. 13.

FIG. 13 illustrates a cross-sectional view of a capacitor device 30 according to another example embodiment. FIG. 14 is a perspective view of the capacitor device 30 of FIG. 13. Referring to FIGS. 13 and 14, the capacitor device 30 is a modification of the capacitor device 10 of FIG. 2, and thus the detailed descriptions of the elements corresponding to those shown in FIG. 2 will not be repeated here. For example, the capacitor device 10 of FIG. 2 has a single gate structure including the gate electrodes 126, whereas the capacitor device 30 of the present embodiment has a double gate structure including lower gate electrodes 325 and upper gate electrodes 335 that are sequentially deposited. However, embodiments are not limited thereto. For example, in another embodiment, the capacitor device 30 may have a multiple gate structure including three or more deposited gate electrodes.

In the present embodiment, a negative voltage (−) may be applied to a first well 305, and a positive voltage (+) may be applied to a second well 310. The positive voltage (+) may be applied to a first impurity region 340, and the negative voltage (−) may be applied to a second impurity region 345. The positive voltage (+) may be applied to the lower gate electrodes 325 disposed over the first well 305, and the negative voltage (−) may be applied to the upper gate electrodes 335 disposed over the first well 305. The negative voltage (−) may be applied to the lower gate electrodes 325 disposed over the second well 310, and the positive voltage (+) may be applied to the upper gate electrodes 335 disposed over the second well 310.

Therefore, since different voltages may be applied to the first well 305 and the second well 310 adjacent to the first well 305, a first junction capacitor may be formed, and since different voltages may be applied to the substrate 300 and the first well 305 adjacent to a substrate 300, a second junction capacitor may be formed. Furthermore, since different voltages may be applied to the first impurity region 330 and the first well 305 adjacent to a first impurity region 330, a third junction capacitor may be formed, and since different voltages may be applied to the second impurity region 335 and the second well 310 adjacent to the second impurity region 335, a fourth junction capacitor may be formed.

Further, since different voltages may be applied to the first well 305 and the lower gate electrodes 325 disposed over the first well 305, and a plurality of first gate insulation layers 320 are disposed therebetween, a first MOS capacitor may be formed. Further, since different voltages may be applied to the second well 310 and the lower gate electrodes 325 disposed over the second well 310, and the plurality of the first gate insulation layers 320 are disposed therebetween, a second MOS capacitor may be formed.

Further, since different voltages may be applied to the lower gate electrodes 325 disposed over the second well 310 and the lower gate electrodes 325 disposed over the first well 305, and an insulation material may exist therebetween, a first MIM capacitor may be formed. Since different voltages may be applied to the upper gate electrodes 335 disposed over the second well 310 and the upper gate electrodes 335 disposed over the first well 305, and an insulation material may exist therebetween, a second MIM capacitor may be formed. Since different voltages may be applied to the upper gate electrodes 335 and the lower gate electrodes 325, and second gate layers 330 may exist therebetween, a third MIM capacitor may be formed. Since different voltages may be applied to two adjacent wirings among first through third wirings 360a, 360b, and 360c, and an insulation material may exist therebetween, a fourth MIM capacitor 360 may be formed.

Therefore, the capacitance of the capacitor device 30 may include the sum of the capacitances of the first through fourth junction capacitors, the first and second MOS capacitors, and the first through fourth MIM capacitors. Compared to the capacitor device 10 of FIG. 2, the capacitor device 30 of the present embodiment uses the double gate structure, thereby further obtaining capacitances between the upper gate electrodes 335 and the lower gate electrodes 325 and between the upper gate electrodes 335.

Although not shown, the capacitor device 30 may be embodied as a modification of the capacitor device 10' of FIG. 6, the capacitor device 20 of FIG. 8, or the capacitor device 20' of FIG. 12.

Figure 15:
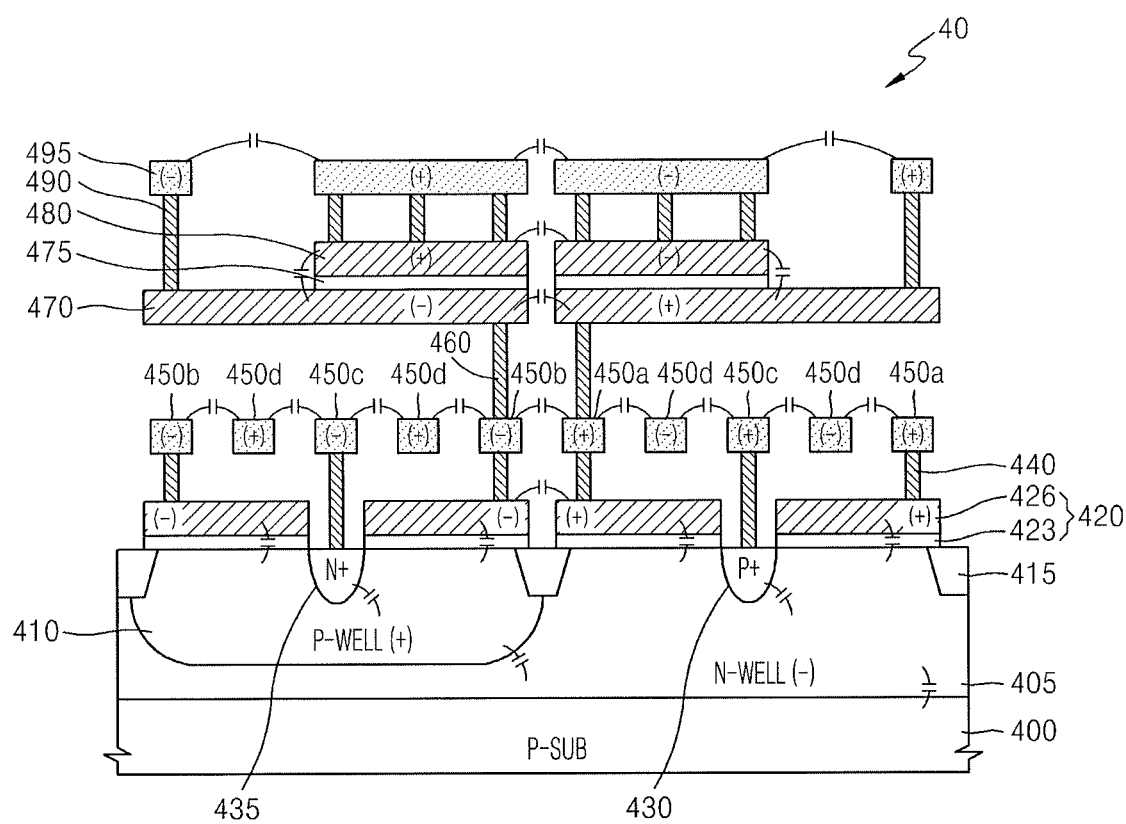
FIG. 15 illustrates a cross-sectional view of a capacitor device according to another example embodiment.
Figure 16:
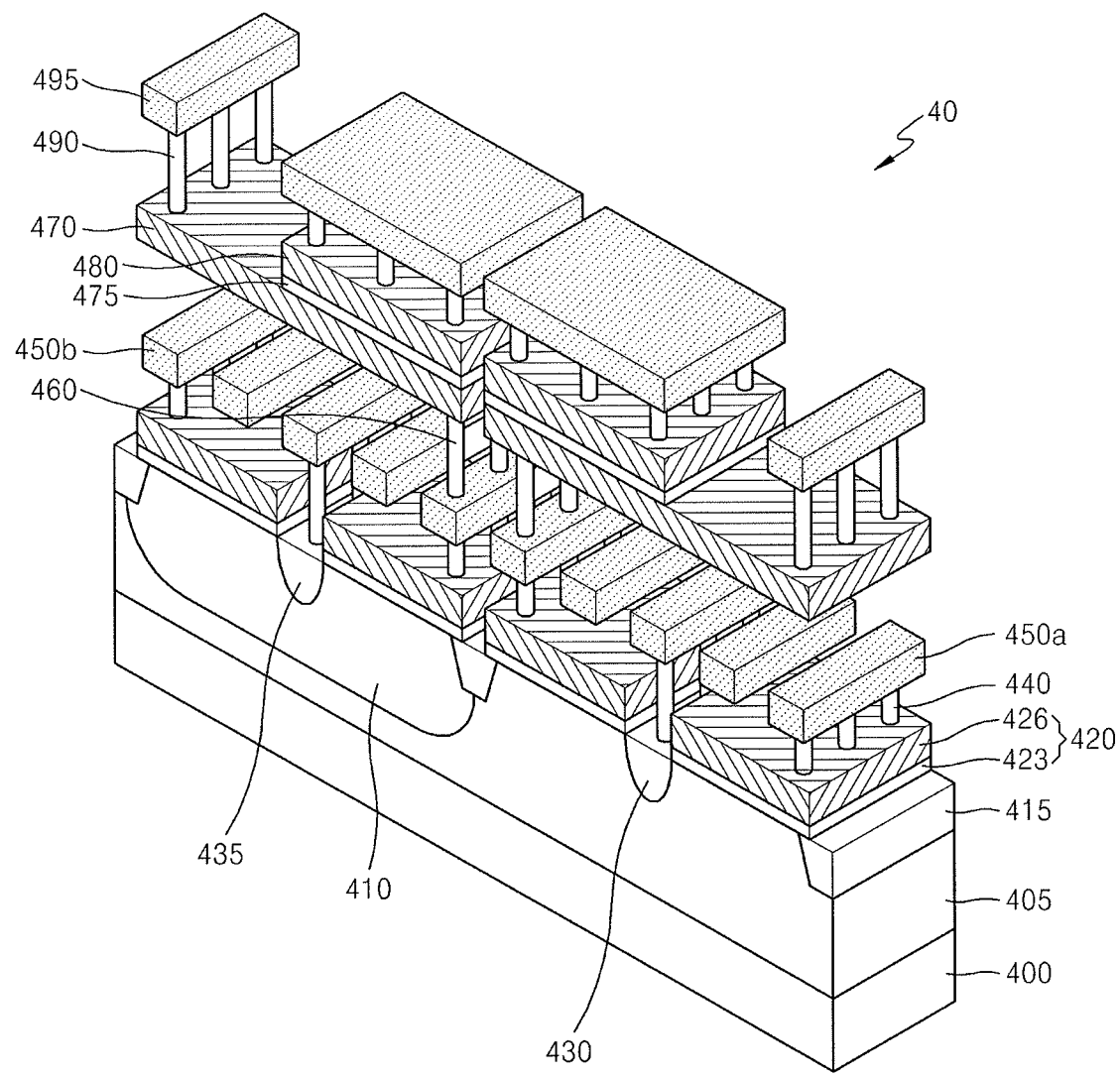
FIG. 16 illustrates a perspective view of the capacitor device of FIG. 15.

FIG. 15 illustrates a cross-sectional view of a capacitor device 40 according to another example embodiment. FIG. 16 illustrates a perspective view of the capacitor device 40 of FIG. 15.

Referring to FIGS. 15 and 16, the capacitor device 40 is a modification of the capacitor device 20 of FIG. 8, and thus the detailed descriptions of the elements corresponding to those shown in FIG. 2 will not be repeated here. For example, the capacitor device 40 of the present embodiment further includes an MIM capacitor disposed thereon compared to the capacitor device 20 of FIG. 8.

The MIM capacitor, in which lower metal lines 470, insulation layers 475, and upper metal lines 480 are sequentially deposited, may be disposed on an upper portion of a first conductive layer including first through fourth wirings 450a, 450b, 450c, and 450d. The lower metal lines 470 may be connected to the first and second wirings 450a and 450b through second contact plugs 460. Fifth wirings 495 may be disposed on an upper portion of the MIM capacitor. For example, the fifth wirings 495 may be disposed on upper portions of the lower metal lines 470 and the upper metal lines 480, and may be connected to the lower metal lines 470 and the upper metal lines 480 through third contact plugs 490.

In the present embodiment, a negative voltage (−) may be applied to a first well 405, and a positive voltage (+) may be applied to a second well 410. The positive voltage (+) may be applied to a first impurity region 430, and the negative voltage (−) may be applied to a second impurity region 435. The positive voltage (+) may be applied to a plurality of gate electrodes 426 disposed over the first well 405, and the negative voltage (−) may be applied to another plurality of the gate electrodes 426 disposed over the second well 410. The positive voltage (+) may be applied to the lower electrode lines 470 disposed over an upper portion of the first well 405, and the negative voltage (−) may be applied to the upper electrode lines 480 disposed over the upper portion of the first well 405. The negative voltage (−) may be applied to the lower electrode lines 470 disposed over an upper portion of the second well 410, and the positive voltage (+) may be applied to the upper electrode lines 480 disposed over the upper portion of the second well 410. The positive voltage (+) may be applied to the fifth wirings 495 connected to the lower electrode lines 470 disposed over the upper portion of the first well 405 and connected to the upper electrode lines 480 disposed over the upper portion of the second well 410. The negative voltage (−) may be applied to the fifth wirings 495 connected to the lower electrode lines 470 disposed over the second well 410 and connected to the upper electrode lines 480 disposed over the first well 405.

Therefore, since different voltages may be applied to the first well 405 and the second well 410 adjacent to the first well 405, a first junction capacitor may be formed, and since different voltages may be applied to a substrate 400 and the first well 405 adjacent to the substrate 400, a second junction capacitor may be formed. Furthermore, since different voltages may be applied to the first impurity region 430 and the first well 405 adjacent to the first impurity region 430, a third junction capacitor may be formed, and since different voltages may be applied to the second impurity region 435 and the second well 410 adjacent to the second impurity region 435, a fourth junction capacitor may be formed.

Further, since different voltages may be applied to the first well 405 and the gate electrodes 426 disposed over the upper portion of the first well 405, and a plurality of gate insulation layer 423 are disposed therebetween, a first MOS capacitor may be formed. Further, since different voltages may be applied to the second well 410 and the gate electrodes 426 disposed over the upper portion of the second well 410, and another plurality of the gate insulation layers 423 are disposed therebetween, a second MOS capacitor may be formed.

Further, since different voltages may be applied to the gate electrodes 426 disposed over the second well 410 and the gate electrodes 426 disposed over the upper portion of the first well 405, and an insulation material may exist therebetween, a first MIM capacitor may be formed. Since different voltages may be applied to two adjacent wirings among the first through fourth wirings 450a, 450b, 450c, and 450d, and an insulation material may exist therebetween, a second MIM capacitor may be formed. Since different voltage may be applied to the lower metal lines 470 and the upper metal lines 480, and the insulation layers 475 are disposed between the lower metal lines 470 and the upper metal lines 480, a third MIM capacitor may be formed. Since different voltages may be applied to adjacent lower metal lines 470, and an insulation material may exist therebetween, a fourth MIM capacitor may be formed. Since different voltages may be applied to adjacent upper metal lines 480, and an insulation material may exist therebetween, a fifth MIM capacitor may be formed. Since different voltages may be applied to the fifth wirings 495, and an insulation material may exist therebetween, a sixth MIM capacitor may be formed.

Therefore, the capacitance of the capacitor device 40 may include the sum of the capacitance of the first through fourth junction capacitors, the first and second MOS capacitors, and the first through sixth MIM capacitors. Compared to the capacitor device 20 of FIG. 8, the capacitor device 40 of the present embodiment further includes the third through sixth MIM capacitors, thereby further obtaining capacitances corresponding to the MIM capacitors.

Although not shown, the capacitor device 40 may be embodied as a modification of the capacitor device 10 of FIG. 2, the capacitor device 10' of FIG. 6, the capacitor device 20' of FIG. 12, or the capacitor device 30 of FIG. 13.

Figure 17A:
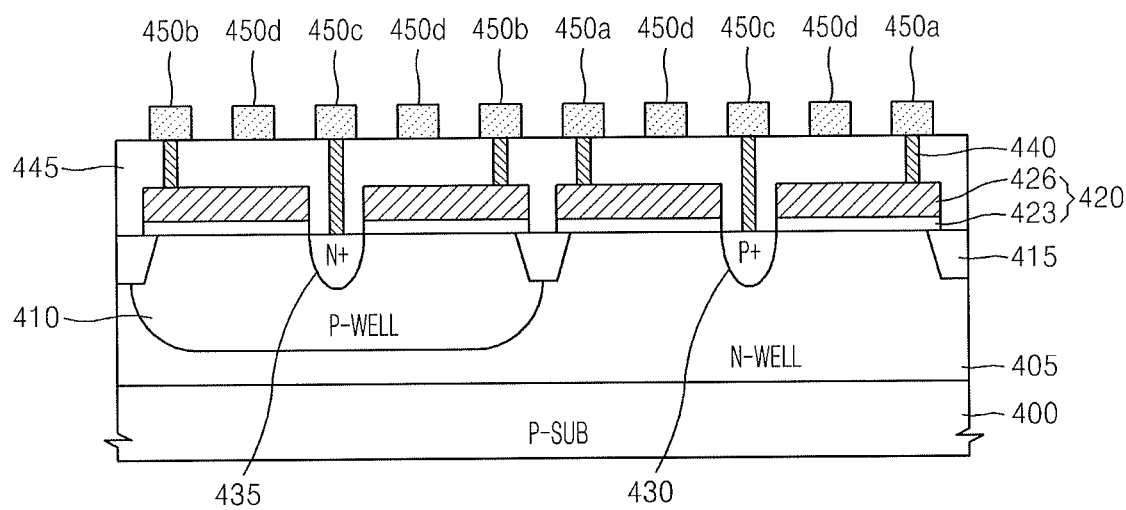
FIGS. 17A through 17F illustrate cross-sectional views of stages in a method of fabricating the capacitor device of FIG. 15 according to another example embodiment.

FIGS. 17A through 17F illustrate cross-sectional views of stages in a method of fabricating the capacitor device of FIG. 15 according to another example embodiment;

Referring to FIG. 17A, the first and second wells 405 and 410 having different conductivity types are formed in the substrate 400, and isolation layers 415 for defining active regions are formed in the substrate 400. Thereafter, gate structures 420 including the gate insulation layers 423 and the gate electrodes 426, sequentially deposited, are formed over the first and second wells 405 and 410. The first impurity region 430 is formed between the two gate structures 420 disposed over the first well 405, and the second impurity region 435 is formed between the two gate structures 420 disposed over the second well 410. A first insulation layer 445 is formed on the gate electrodes 426 and the first and second impurity regions 430 and 435, and first contact plugs 440 are formed in the first insulation layer 445. The first conductive layer including the first through fourth wirings 450a, 450b, 450c, and 450d is formed on upper portions of the first insulation layer 445 and the first contact plugs 440.

Figure 17B:
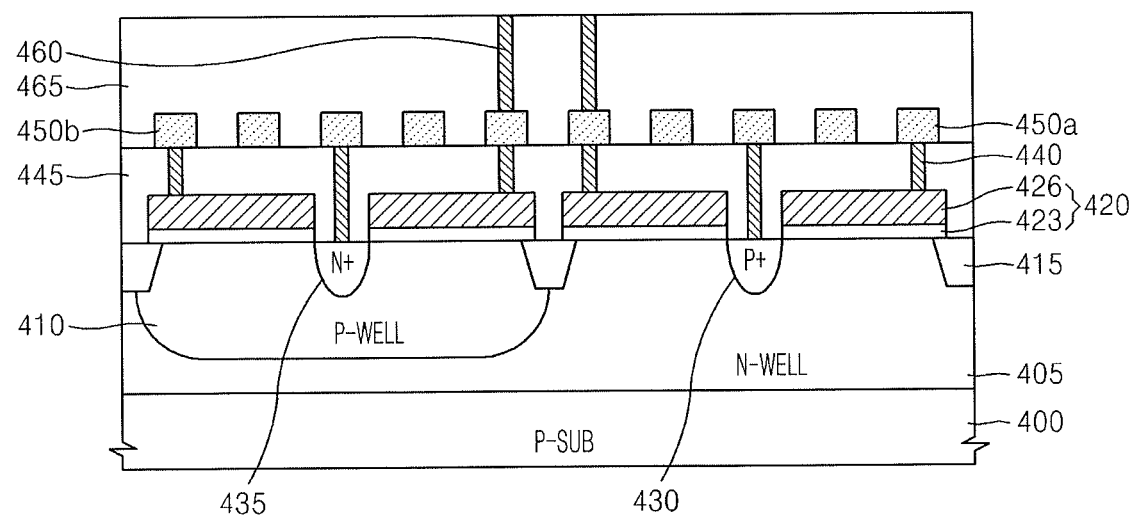

Referring to FIG. 17B, a second insulation layer 465 is formed on all parts of a surface of the resultant structure in which the first through fourth wirings 450a, 450b, 450c, and 450d are formed. Thereafter, the second contact plugs 460 are formed in the second insulation layer 465 by forming contact holes (not shown) through which the first and the second wirings 450a and 450b are partially exposed, and burying the contact holes by using a metal material. In this regard, the metal material may include, for example, tungsten (W).

Figure 17C:
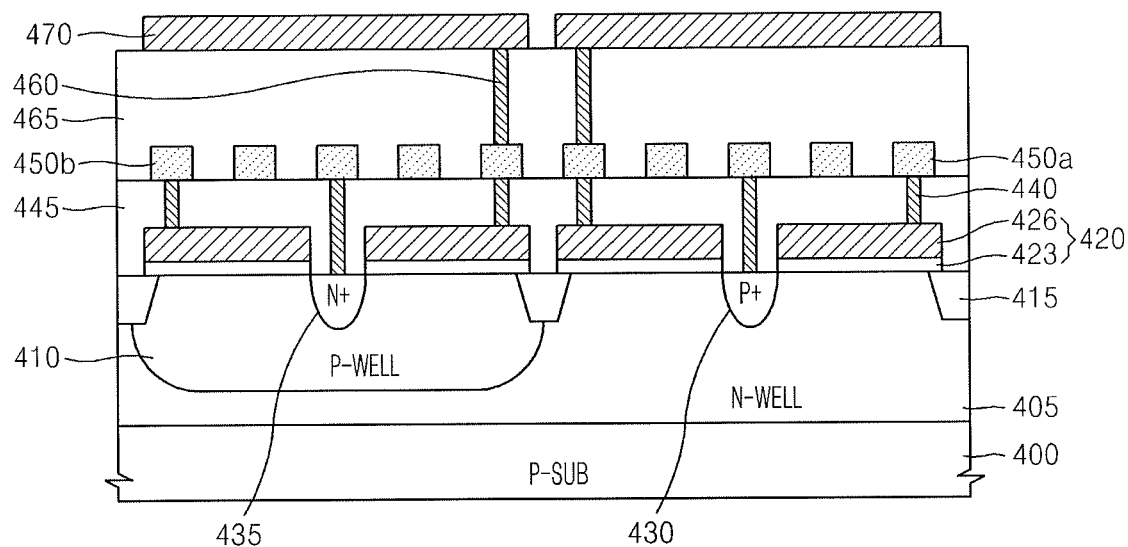

Referring to FIG. 17C, the lower metal lines 470 respectively connected to the second contact plugs 460 are formed on upper portions of the second insulation layer 465 and the second contact plugs 460.

Figure 17D:
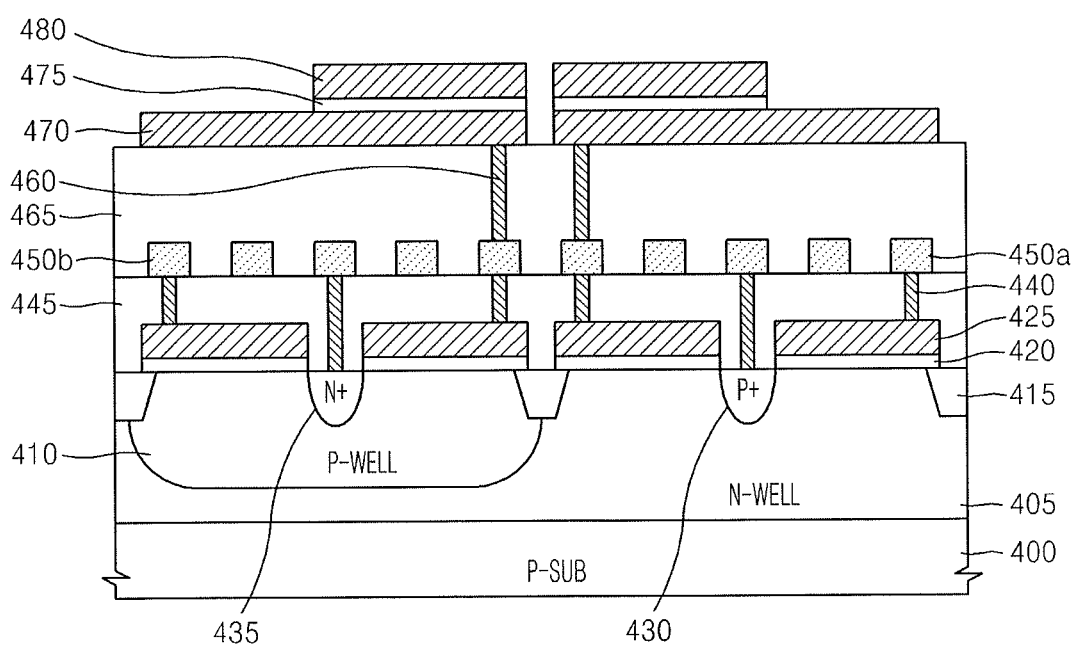

Referring to FIG. 17D, the insulation layer 475 and the upper metal lines 480 are sequentially deposited on the lower metal lines 470. Thus, the lower metal lines 470, the insulation layer 475, and the upper metal lines 480 form the MIM capacitor.

In this regard, the lower metal lines 470 and the upper metal lines 480 may each be a single layer or a composite layer including, for example one or more of polysilicon, aluminum (Al), gold (Au), beryllium (Be), bismuth (Bi), cobalt (Co), hafnium (Hf), indium (In), Manganese (Mn), molybdenum (Mo), Nickel (Ni), lead (Pb), palladium (Pd), platinum (Pt), rhodium (Rh), rhenium (Re), tantalum (Ta), tellurium (Te), titanium (Ti), tungsten (W), zinc (Zn), zirconium (Zr), nitrides thereof, and silicides thereof.

Figure 17E:
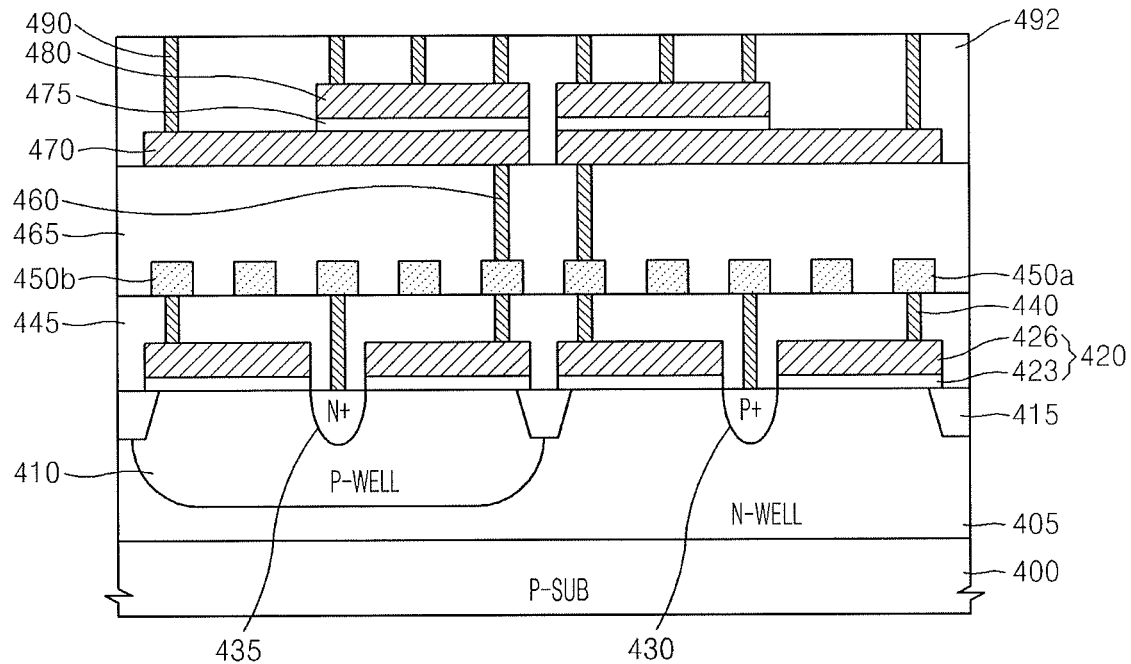

Referring to FIG. 17E, a third insulation layer 492 is formed on all parts of a surface of the resultant in which the upper metal lines 480 are formed. Thereafter, the third contact plugs 490 are formed in the third insulation layer 492 by forming second contact holes (not shown) through which the lower metal lines 470 and the upper metal lines 480 are partially exposed, and burying the second contact holes by using a metal material.

In this regard, the second and third insulation layers 465 and 492 may each be a single layer or a composite layer including, for example, one or more of silicon oxide ($SiO_2$), silicon nitride ($Si_3N_4$), silicon oxynitride (SiON), hafnium oxide ($HfO_2$), hafnium silicon oxide ($HfSi_xO_y$), aluminum oxide ($Al_2O_3$), and zirconium oxide ($ZrO_2$).

Figure 17F:
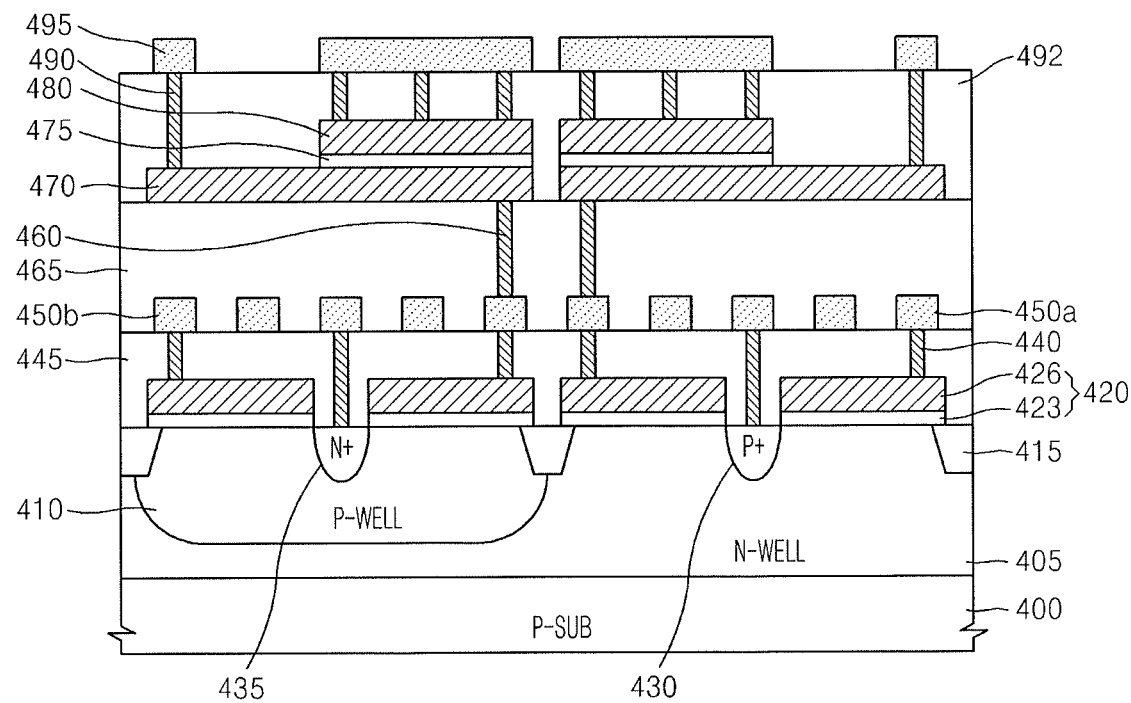

Referring to FIG. 17F, the fifth wirings 495 respectively connected to the third contact plugs 490 are formed on upper portions of the third insulation layer 492 and the third contact plugs 490. In this regard, the positive voltage (+) may be applied to the fifth wirings 495 connected to the lower metal lines 470 disposed on the upper portion of the first well 405 and connected to the upper metal lines 480 disposed on the upper portion of the second well 410. The negative voltage (−) may be applied to the fifth wirings 495 connected to the lower metal lines 470 disposed on the upper portion of the second well 410 and connected to the upper metal lines 480 disposed on the upper portion of the first well 405.

Figure 18:
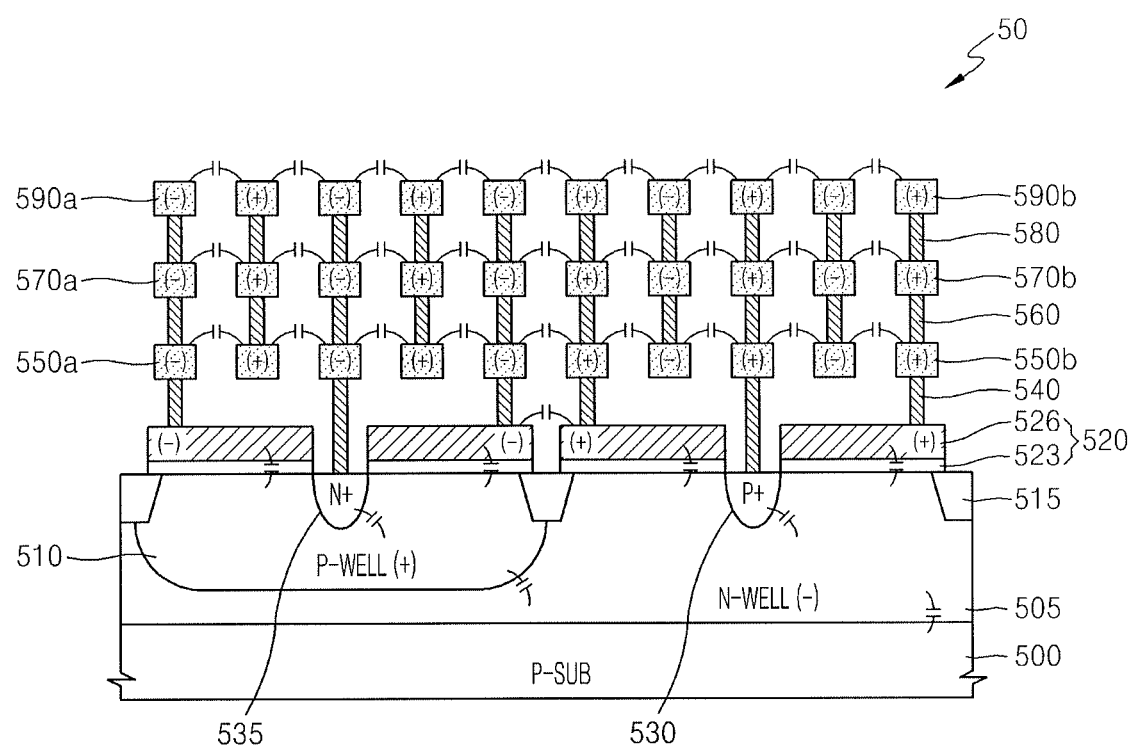
FIG. 18 illustrates a cross-sectional view of a capacitor device according to another example embodiment.
Figure 19:
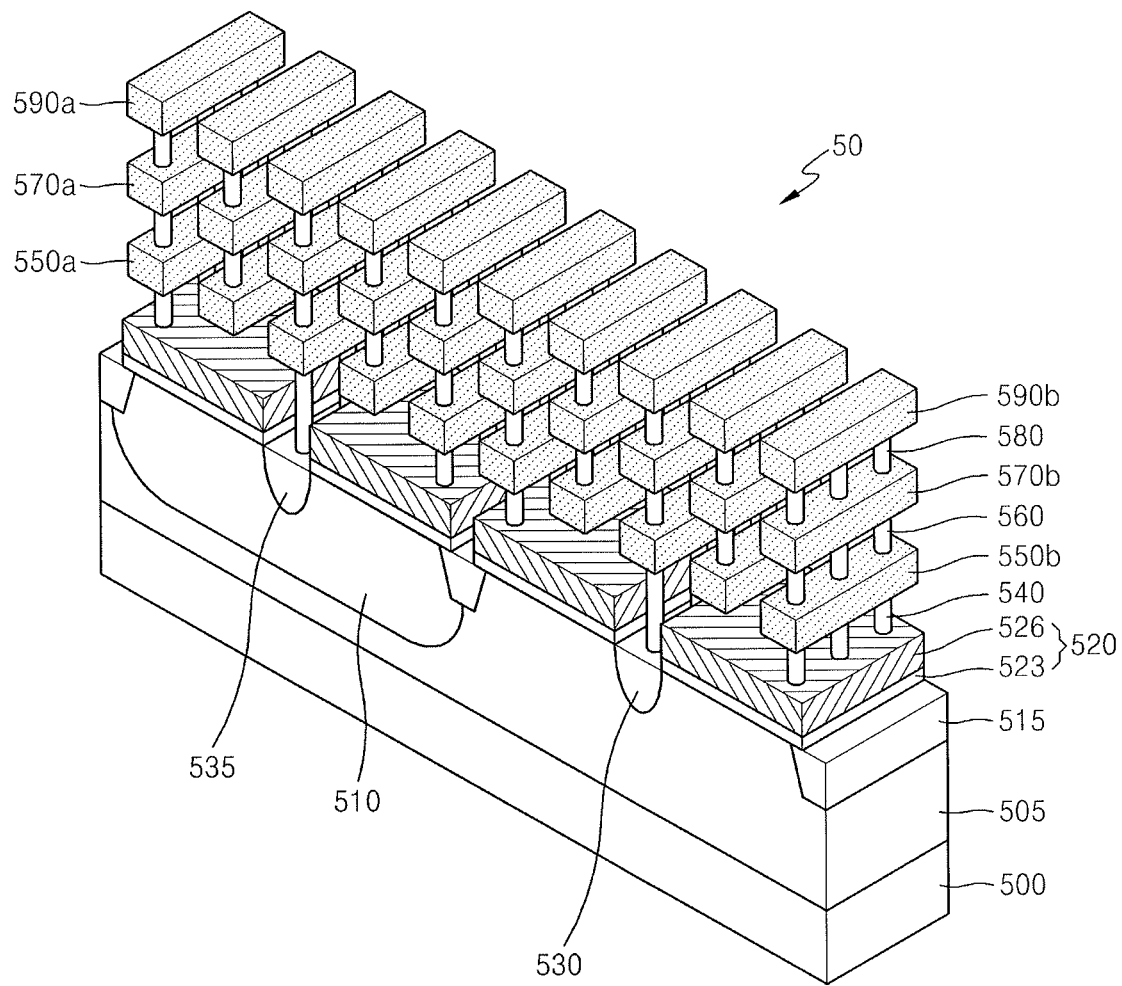
FIG. 19 illustrates a perspective view of the capacitor device of FIG. 18.

FIG. 18 illustrates a cross-sectional view of a capacitor device 50 according to another example embodiment. FIG. 19 illustrates a perspective view of the capacitor device 50 of FIG. 18.

Referring to FIGS. 18 and 19, the capacitor device 50 is a modification of the capacitor device 20 of FIG. 8, and thus the detailed descriptions of the elements corresponding to those shown in FIG. 2 will not be repeated here. For example, the capacitor device 50 of the present embodiment further includes second and third conductive layers disposed thereon in addition to a first conductive layer and the first through third conductive layers are adjacent above and below each other and are electrically connected to each other, compared to the capacitor device 20 of FIG. 8.

The first conductive layer includes first and second wirings 550a and 550b and may be disposed on upper portions of first and second wells 505 and 510. The first and second wirings 550a and 550b may be alternately disposed. The second conductive layer includes third and fourth wirings 570a and 570b and may be disposed on upper portions of the first and second wirings 550a and 550b. The third and fourth wirings 570a and 570b may be alternately disposed, and may be respectively connected to the first and second wirings 550a and 550b through second contact plugs 560.

The third conductive layer includes fifth and sixth wirings 590a and 590b and may be disposed on upper portion of the third and fourth wirings 570a and 570b. The fifth and sixth wirings 590a and 590b may be alternately disposed, and may be respectively connected to the third and fourth wirings 570a and 570b through third contact plugs 580.

In the present embodiment, a negative voltage (−) may be applied to the fifth wirings 590a, and a positive voltage (+) may be applied to the sixth wirings 590b. Thus, the negative voltage (−) may be applied to the first and third wirings 550a and 570a, and the positive voltage (+) may be applied to the second and fourth wirings 550b and 570b. Further, the negative voltage (−) may be applied to the first well 505, and the positive voltage (+) may be applied to the second well 510. The positive voltage (+) may be applied to a first impurity region 530, and the negative voltage (−) may be applied to a second impurity region 535. The positive voltage (+) may be applied to a plurality of gate electrodes 526 disposed over the first well 505, and the negative voltage (−) may be applied to another plurality of the gate electrodes 526 disposed over the second well 510.

Therefore, since different voltages may be applied to the first well 505 and the second well 510 adjacent to the first well 505, a first junction capacitor may be formed, and since different voltages may be applied to a substrate 500 and the first well 505 adjacent to the substrate 500, a second junction capacitor may be formed. Furthermore, since different voltages may be applied to the first impurity region 530 and the first well 505 adjacent to the first impurity region 530, a third junction capacitor may be formed, and since different voltages may be applied to the second impurity region 535 and the second well 510 adjacent to the second impurity region 535, a fourth junction capacitor may be formed.

Further, since different voltages may be applied to the first well 505 and the gate electrodes 526 disposed over an upper portion of the first well 505, and a plurality of gate insulation layers 523 are disposed therebetween, a first MOS capacitor may be formed. Further, since different voltages may be applied to the second well 510 and the gate electrodes 526 disposed over an upper portion of the second well 510, and another plurality of the gate insulation layers 523 are disposed therebetween, a second MOS capacitor may be formed.

Further, since different voltages may be applied to the gate electrodes 526 disposed over the second well 510 and the gate electrodes 526 disposed over the first well 505, and an insulation material may exist therebetween, a first MIM capacitor may be formed. Since different voltages may be applied to the first and second wirings 550a and 550b, and an insulation material may exist therebetween, a second MIM capacitor may be formed. Since different voltages may be applied to the third and fourth wirings 570a and 570b, and an insulation material may exist therebetween, a third MIM capacitor may be formed. Since different voltages may be applied to the fifth and sixth wirings 590a and 590b, and an insulation material may exist therebetween, a fourth MIM capacitor may be formed.

Therefore, the capacitance of the capacitor device 50 may include the sum of the capacitances of the first through fourth junction capacitors, the first and second MOS capacitors, and the first through fourth MIM capacitors. Compared to the capacitor device 20 of FIG. 8, the capacitor device 50 of the present embodiment further includes the second and third conductive layers, thereby further obtaining MIM capacitances between the wirings included in the second and third conductive layers.

Although not shown, the capacitor device 50 may be embodied as a modification of the capacitor device 10 of FIG. 2, the capacitor device 10' of FIG. 6, the capacitor device 20' of FIG. 12, or the capacitor device 30 of FIG. 13.

FIGS. 20A through 20E illustrate cross-sectional views of stages in a method of fabricating the capacitor device of FIG. 18 according to another example embodiment.

Figure 20A:
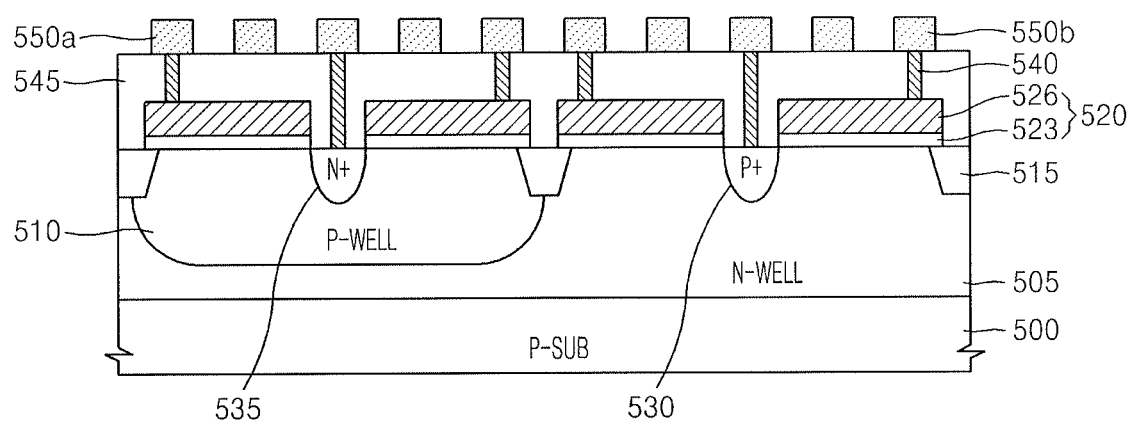
FIGS. 20A through 20E illustrate cross-sectional views of stages in a method of fabricating the capacitor device of FIG. 18 according to another example embodiment.

Referring to FIG. 20A, the first and second wells 505 and 510 having different conductivity types are formed in the substrate 500, and isolation layers 515 for defining active regions are formed in the substrate 500. Thereafter, gate structures 520 including the gate insulation layers 523 and the gate electrodes 526, sequentially deposited, are formed over the first and second wells 505 and 510. The first impurity region 530 is formed between the two gate structures 520 disposed over the first well 505, and the second impurity region 535 is formed between the two gate structures 520 disposed over the second well 510. A first insulation layer 545 is formed on the gate electrodes 526 and the first and second impurity regions 530 and 535, and first contact plugs 540 are formed in the first insulation layer 545. The first conductive layer including the first and second wirings 550a and 550b is formed on upper portions of the first insulation layer 545 and the first contact plugs 540.

Figure 20B:
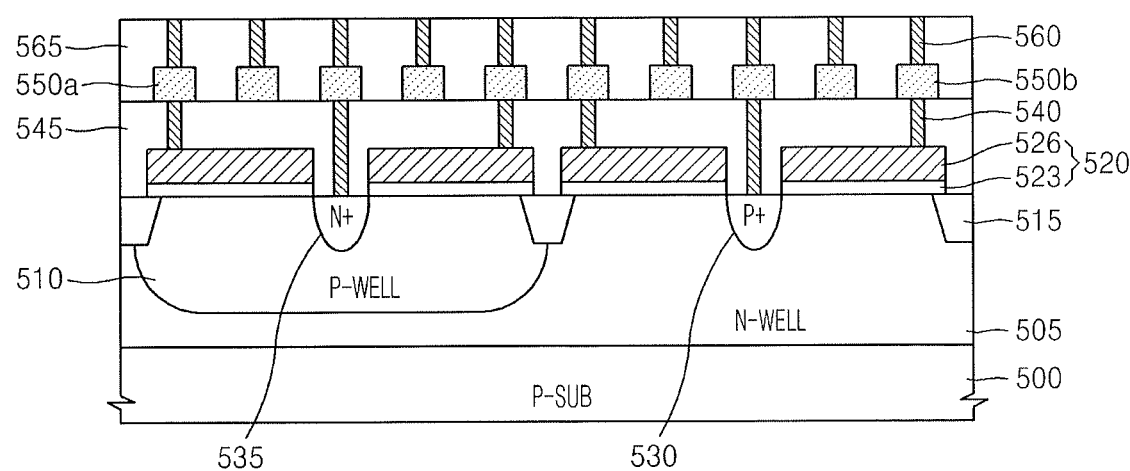

Referring to FIG. 20B, a second insulation layer 565 is formed on all parts of a surface of the resultant structure in which the first and second wirings 550a and 550b are formed. Thereafter, the second contact plugs 560 are formed in the second insulation layer 565 by forming first contact holes (not shown) through which the first and second wirings 550a and 550b are partially exposed, and burying the first contact holes by using a metal material. In this regard, the metal material may include, for example, tungsten (W).

Figure 20C:
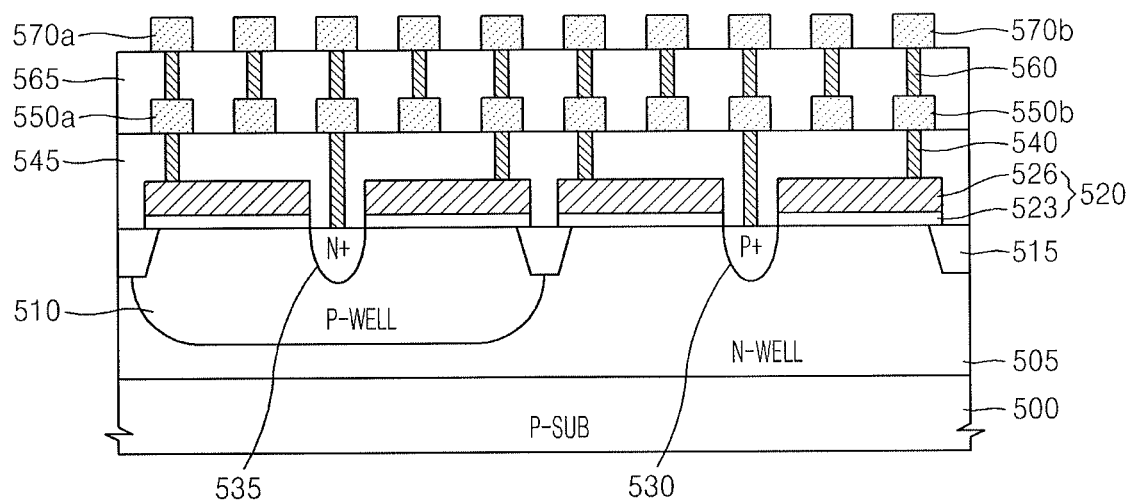

Referring to FIG. 20C, the second conductive layer including the third and fourth wirings 570a and 570b respectively connected to the second contact plugs 560 is formed on upper portions of the second insulation layer 565 and the second contact plugs 560.

Figure 20D:
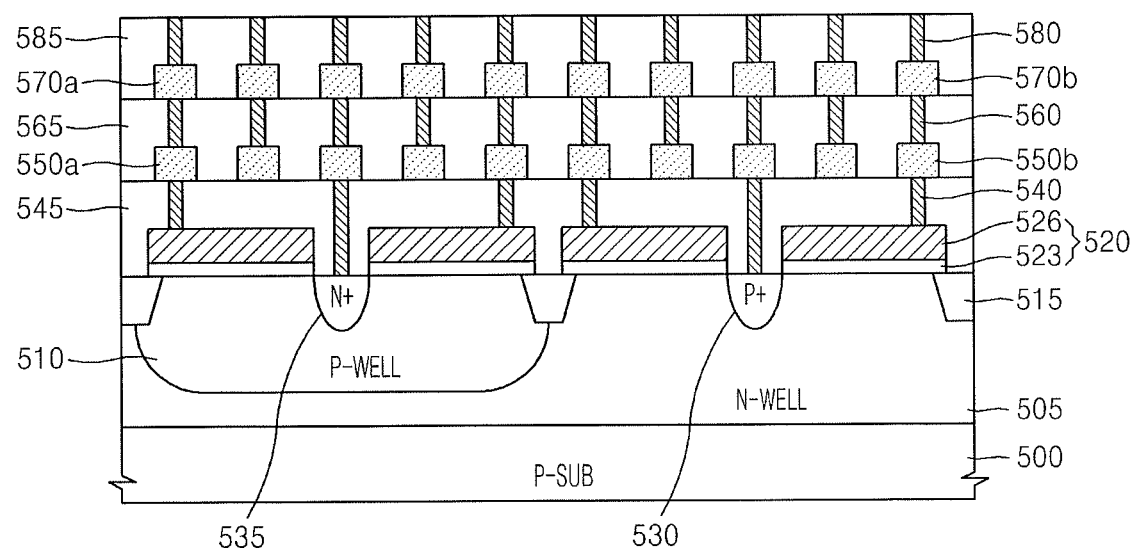
Figure 20E:
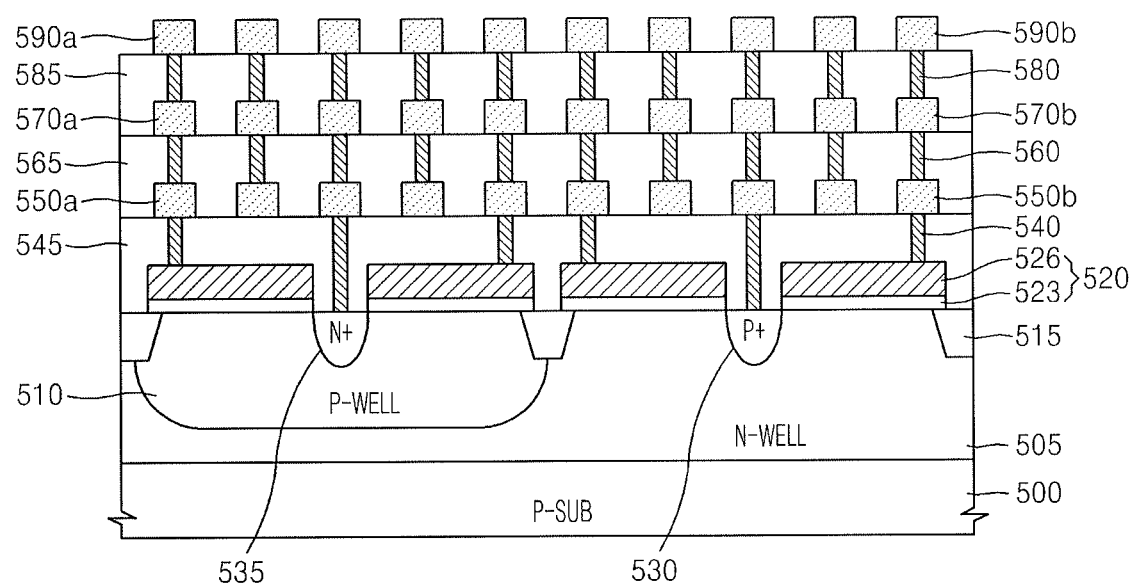

Referring to FIG. 20D, a third insulation layer 585 is formed on all parts of a surface of the resultant structure in which the third and fourth wirings 570a and 570b are formed. Thereafter, the third contact plugs 580 are formed in the third insulation layer 585 by forming second contact holes (not shown) through which the third and fourth wirings 570a and 570b are partially exposed, and burying the second contact holes by using a metal material. In this regard, the metal material may include, for example, tungsten (W).

Referring to FIG. 20D, the third conductive layer including the fifth and sixth wirings 590a and 590b respectively connected to the third contact plugs 580 is formed on upper portions of the third insulation layer 585 and the third contact plugs 580. In this regard, the negative voltage (−) may be applied to the fifth wirings 590a, and the positive voltage (+) may be applied to the sixth wirings 590b.

Figure 21:
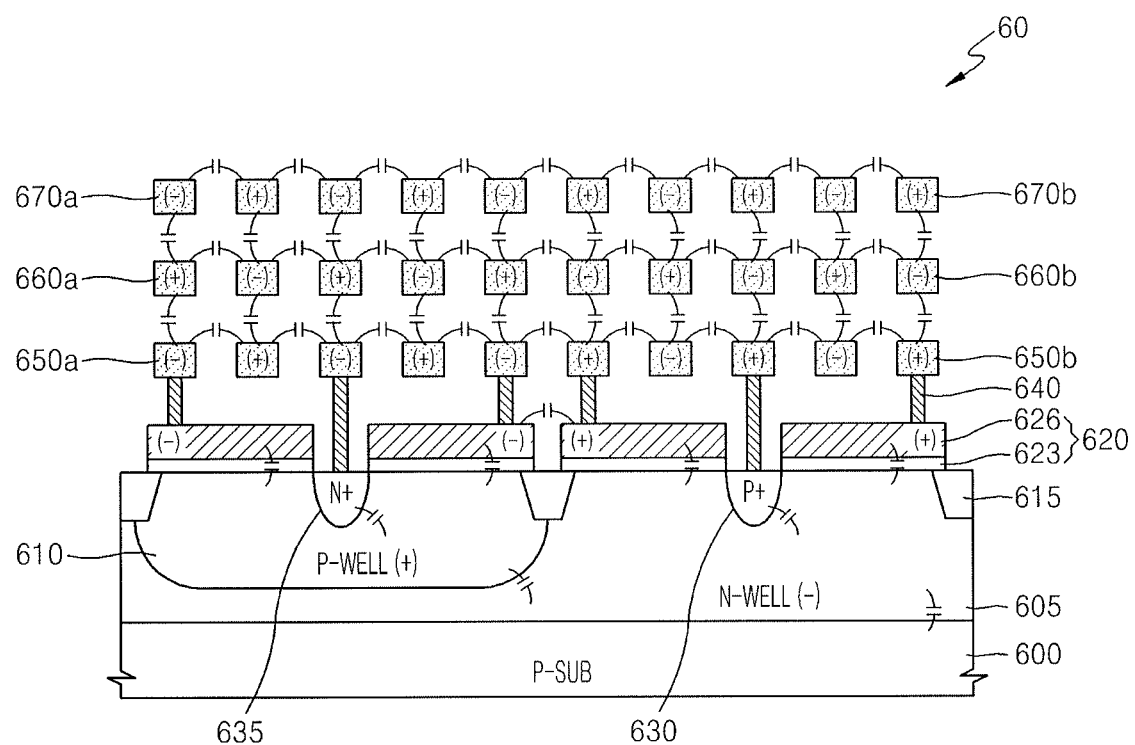
FIG. 21 illustrates a cross-sectional view of a capacitor device according to another example embodiment.
Figure 22:
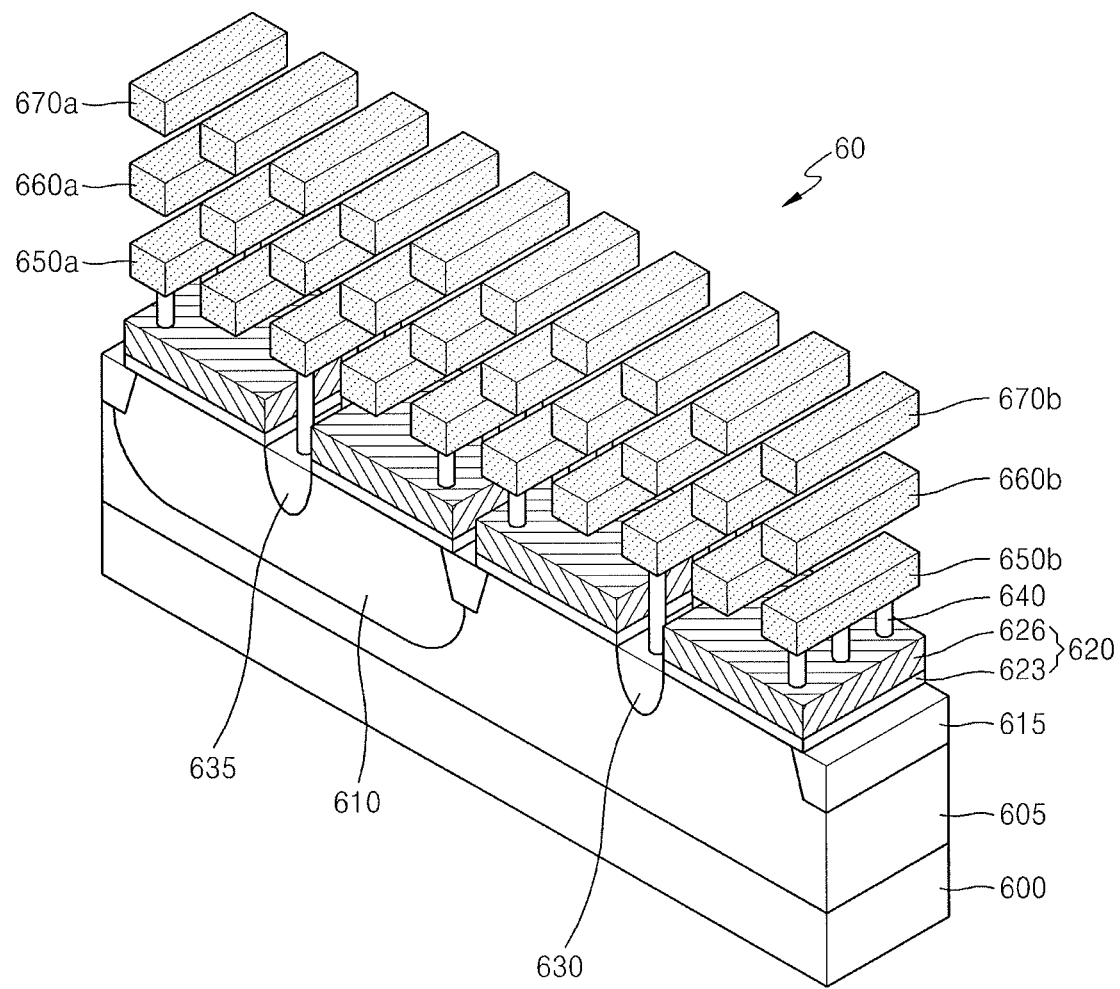
FIG. 22 illustrates a perspective view of the capacitor device of FIG. 21.

FIG. 21 illustrates a cross-sectional view of a capacitor device 60 according to another example embodiment. FIG. 22 illustrates a perspective view of the capacitor device 60 of FIG. 21.

Referring to FIGS. 21 and 22, the capacitor device 60 is a modification of the capacitor device 20 of FIG. 8, and thus the detailed descriptions of the elements corresponding to those shown in FIG. 2 will not be repeated here. For example, the capacitor device 60 of the present embodiment further includes second and third conductive layers disposed thereon in addition to a first conductive layer and the first through third conductive layers are electrically insulated from each other, compared to the capacitor device 20 of FIG. 8.

The first conductive layer includes first and second wirings 650a and 650b and may be disposed on upper portions of first and second wells 605 and 610. The first and second wirings 650a and 650b may be alternately disposed. The second conductive layer includes third and fourth wirings 660a and 660b and may be disposed on an upper portion of the first conductive layer including the first and second wirings 650a and 650b. The third and fourth wirings 660a and 660b may be alternately disposed, and may be respectively insulated from the first and second wirings 650a and 650b.

The third conductive layer includes fifth and sixth wirings 670a and 670b and may be disposed on an upper portion of the second conductive layer including the third and fourth wirings 660a and 660b. The fifth and sixth wirings 670a and 670b may be alternately disposed, and may be respectively insulated from the third and fourth wirings 660a and 660b.

In the present embodiment, a negative voltage (−) may be applied to the fifth wirings 670a, a positive voltage (+) may be applied to the sixth wiring 670b, the positive voltage (+) is applied to the third wiring 660a, the negative voltage (−) may be applied to the fourth wiring 660b, the negative voltage (−) may be applied to the first wirings 650a, and the positive voltage (+) may be applied to the second wirings 650b. Further, the negative voltage (−) may be applied to the first well 605, and the positive voltage (+) may be applied to the second well 610. The positive voltage (+) may be applied to a first impurity region 630, and the negative voltage (−) may be applied to a second impurity region 635. The positive voltage (+) may be applied to a plurality of gate electrodes 626 disposed over the first well 605, and the negative voltage (−) may be applied to another plurality of the gate electrodes 626 disposed over the second well 610.

Therefore, since different voltages may be applied to the first well 605 and the second well 610 adjacent to the first well 605, a first junction capacitor may be formed, and since different voltages may be applied to a substrate 600 and the first well 605 adjacent to the substrate 600, a second junction capacitor may be formed. Furthermore, since different voltages may be applied to the first impurity region 630 and the first well 605 adjacent to the first impurity region 630, a third junction capacitor may be formed, and since different voltages may be applied to the second impurity region 635 and the second well 610 adjacent to the second impurity region 635, a fourth junction capacitor may be formed.

Further, since different voltages may be applied to the first well 605 and the gate electrodes 626 disposed over an upper portion of the first well 605, and a plurality of gate insulation layers 623 are disposed therebetween, a first MOS capacitor may be formed. Further, since different voltages may be applied to the second well 610 and the gate electrodes 626 disposed over an upper portion of the second well 610, and another plurality of the gate insulation layers 623 are disposed therebetween, a second MOS capacitor may be formed.

Further, since different voltages may be applied to the gate electrode 626 disposed over the second well 610 and the gate electrode 626 disposed over the upper portion of the first well 605, and an insulation material may exist therebetween, a first MIM capacitor may be formed. Since different voltages may be applied to the first and second wirings 650a and 650b, and an insulation material may exist therebetween, a second MIM capacitor may be formed. Since different voltages may be applied to the third and fourth wirings 660a and 660b, and an insulation material may exist therebetween, a third MIM capacitor may be formed. Since different voltages may be applied to the fifth and sixth wirings 670a and 670b, and an insulation material may exist therebetween, a fourth MIM capacitor may be formed. Since different voltages may be applied to the third and fourth wirings 650a and 650b, which are adjacent above the first and second wirings 650a and 660a, and an insulation material may exist therebetween, a fifth MIM capacitor may be formed. Since different voltages may be applied to the fifth and sixth wirings 670a and 670b, which are adjacent above the third and fourth wirings 660a and 660b, and an insulation material may exist therebetween, a sixth MIM capacitor may be formed.

Therefore, the capacitance of the capacitor device 60 may include the sum of the capacitances of the first through fourth junction capacitors, the first and second MOS capacitors, and the first through sixth MIM capacitors. Compared to the capacitor device 20 of FIG. 8, the capacitor device 60 of the present embodiment further includes the second and third conductive layers, thereby further obtaining MIM capacitances between the wirings included in the second and third conductive layers. In addition, the first through third conductive layers are insulated from each other, thereby further obtaining MIM capacitances between the first through third conductive layers, which are adjacent above and below each other.

Although not shown, the capacitor device 60 may be embodied as a modification of the capacitor device 10 of FIG. 2, the capacitor device 10' of FIG. 6, the capacitor device 20' of FIG. 12, or the capacitor device 30 of FIG. 13.

FIGS. 23A through 23E illustrate cross-sectional views of stages in a method of fabricating the capacitor device of FIG. 21 according to another example embodiment.

Figure 23A:
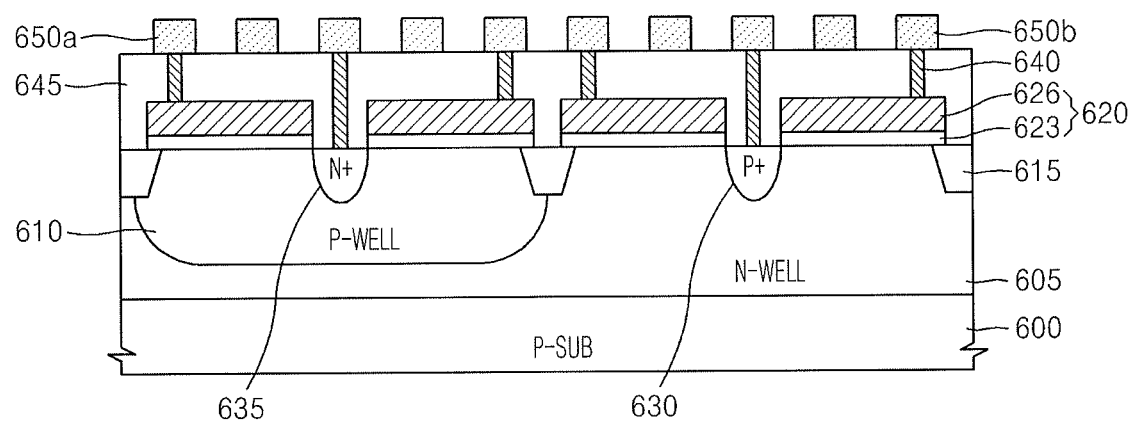
FIGS. 23A through 23E illustrate cross-sectional views of stages in a method of fabricating the capacitor device of FIG. 21 according to another example embodiment.

Referring to FIG. 23A, the first and second wells 605 and 610 having different conductivity types are formed in the substrate 600, and isolation layers 615 for defining active regions are formed in the substrate 600. Thereafter, gate structures 620 including the gate insulation layers 623 and the gate electrodes 626, sequentially deposited, are formed over the first and second wells 605 and 610. The first impurity region 630 is formed between the two gate structures 620 disposed over the first well 605, and the second impurity region 635 is formed between the two gate structures 620 disposed over the second well 610. A first insulation layer 645 is formed on the gate electrodes 626 and the first and second impurity regions 630 and 635, and first contact plugs 640 are formed in the first insulation layer 645. The first conductive layer including the first and second wirings 650a and 650b is formed on upper portions of the first insulation layer 645 and the first contact plugs 640.

Figure 23B:
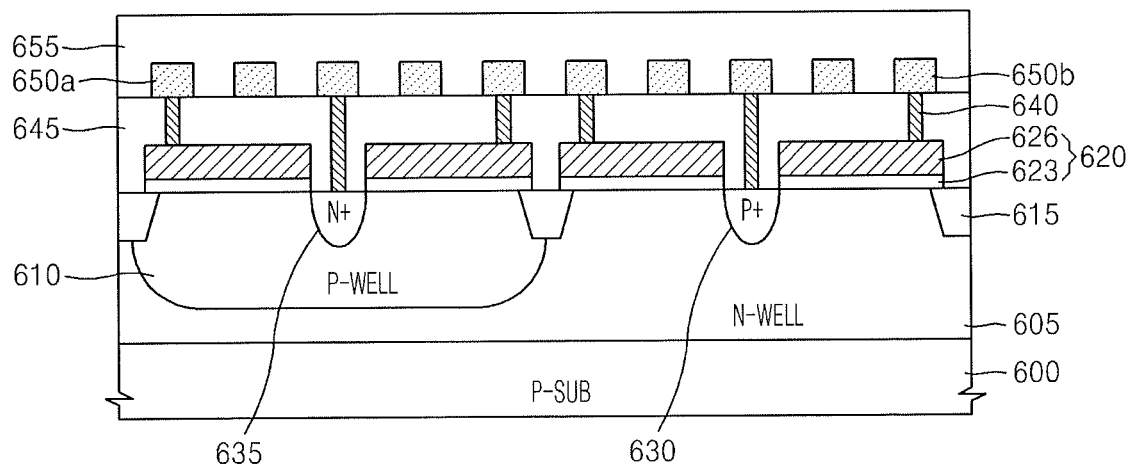

Referring to FIG. 23B, a second insulation layer 655 is formed on all parts of a surface of the resultant structure in which the first and second wirings 650a and 650b are formed.

Figure 23C:
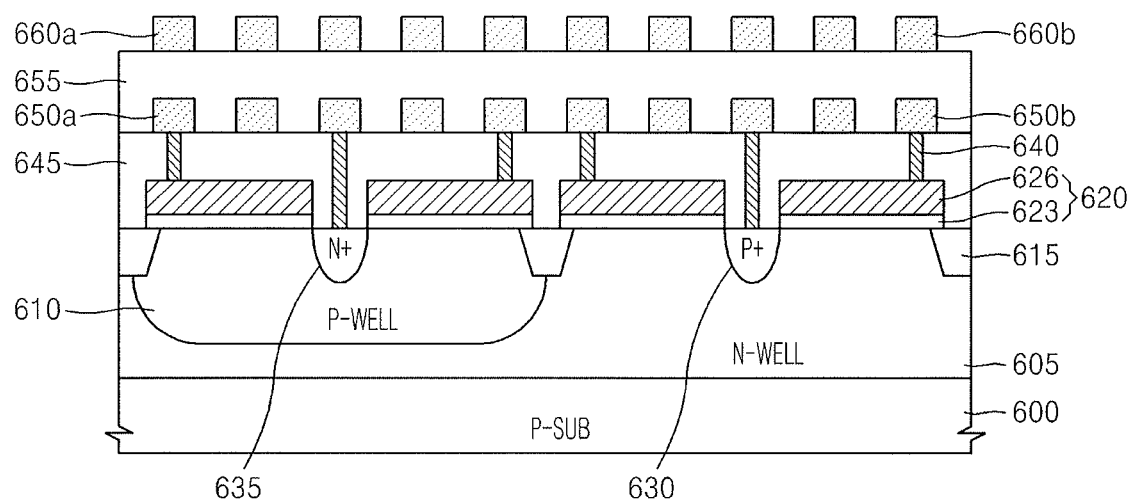

Referring to FIG. 23C, the second conductive layer including the third and fourth wirings 660a and 660b is formed on upper portions of the second insulation layer 655 including to the first and second wirings 650a and 650b. In this regard, the third and fourth wirings 660a and 660b are electrically insulated from the first and second wirings 650a and 650b.

Figure 23D:
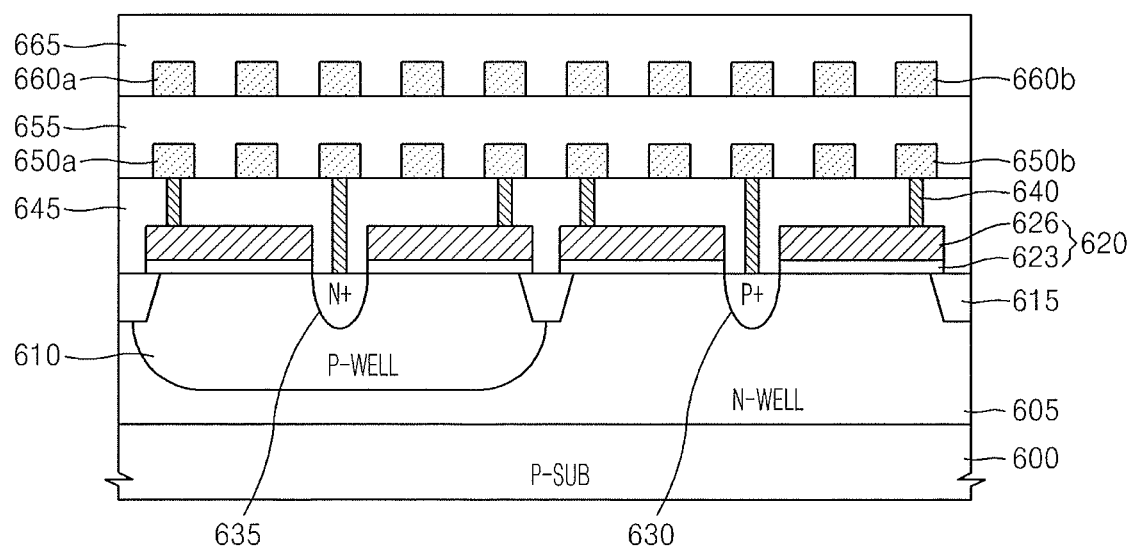

Referring to FIG. 23D, a third insulation layer 665 is formed on all parts of a surface of the resultant structure in which the third and fourth wirings 660a and 660b are formed.

Figure 23E:
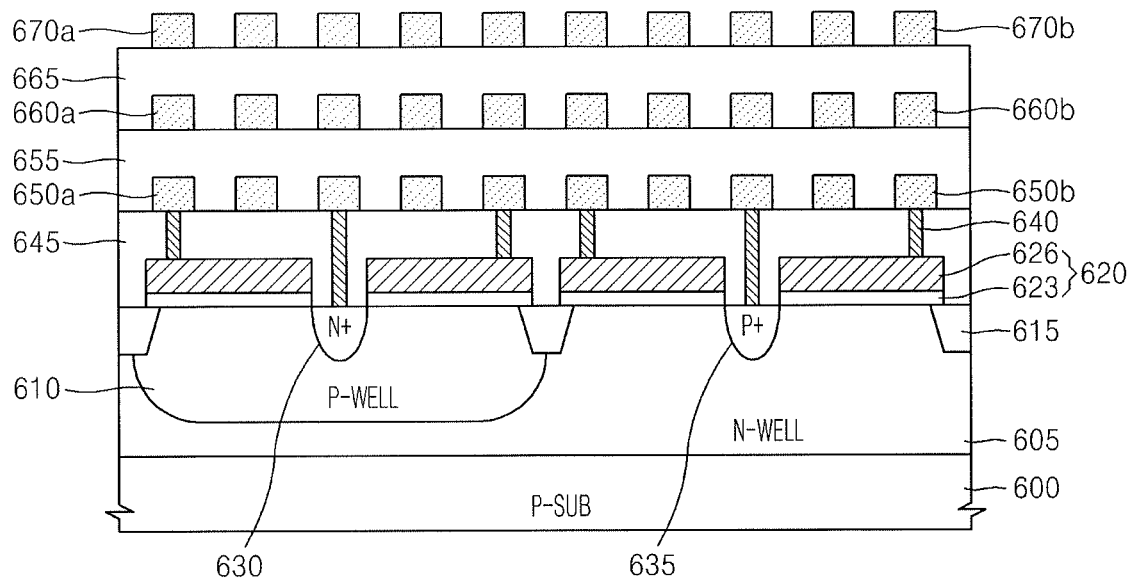

Referring to FIG. 23E, the third conductive layer including the fifth and sixth wirings 670a and 670b is formed on an upper portion of the third insulation layer 665 including to the third and fourth wirings 660a and 660b. In this regard, the fifth and sixth wirings 670a and 670b are electrically insulated from the third and fourth wirings 660a and 660b. The negative voltage (−) may be applied to the fifth wirings 670a, and the positive voltage (+) may be applied to the sixth wirings 670b.

Figure 24:
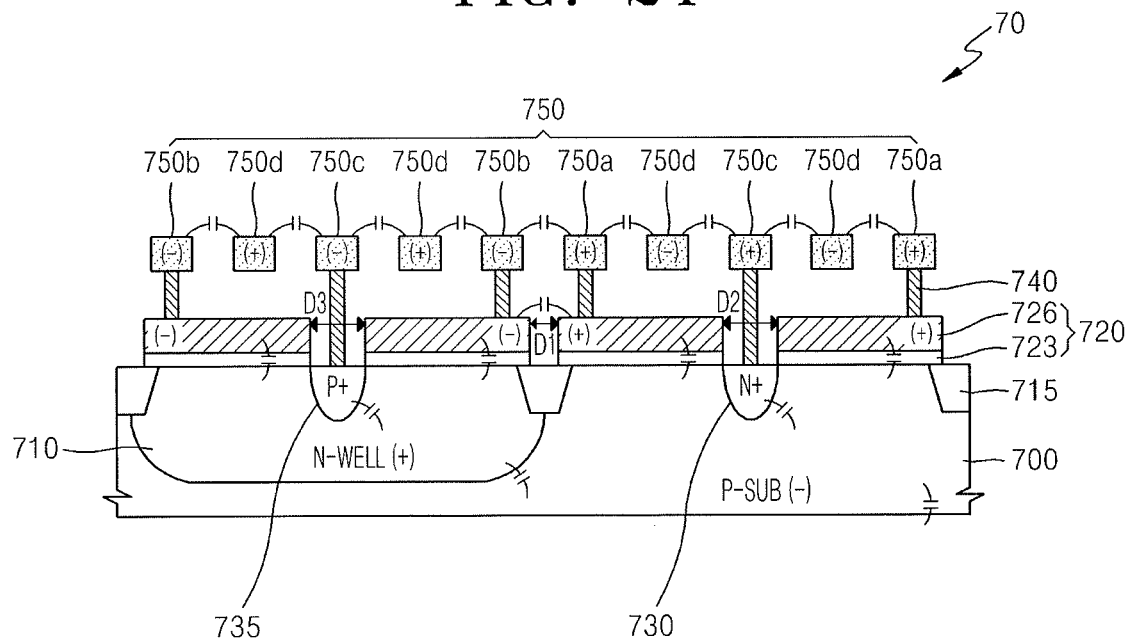
FIG. 24 illustrates a cross-sectional view of a capacitor device according to another example embodiment.
Figure 25:
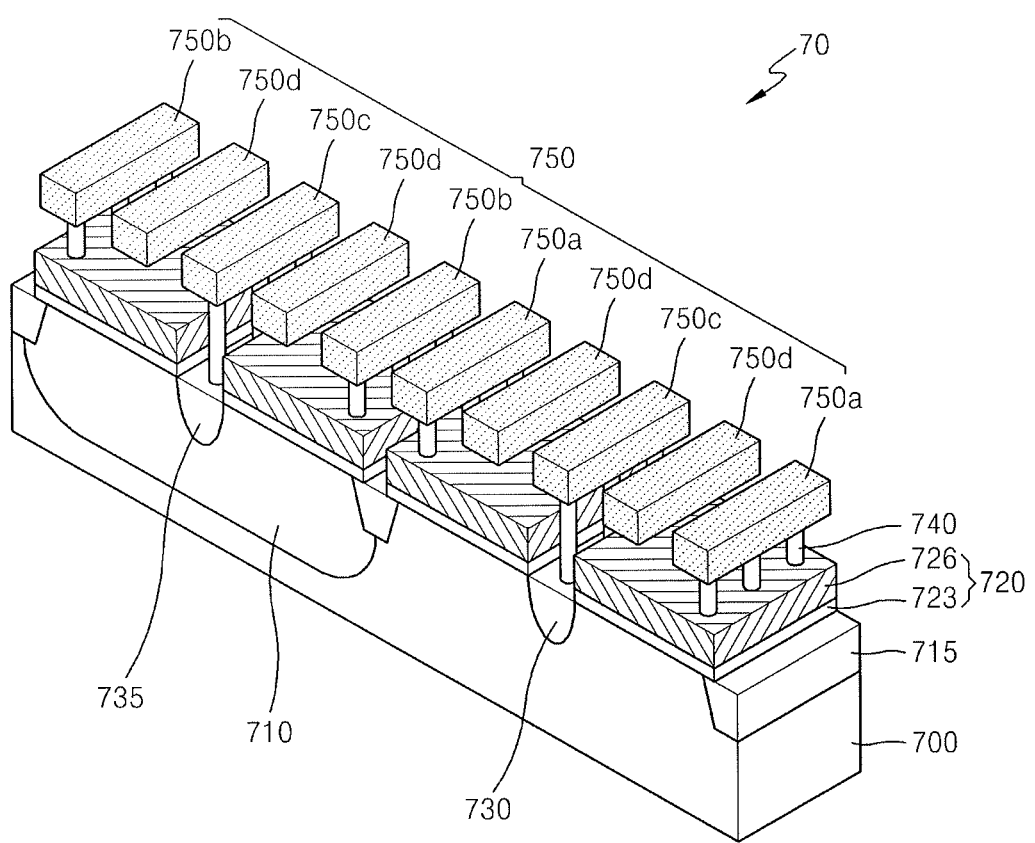
FIG. 25 illustrates a perspective view of the capacitor device of FIG. 24.

FIG. 24 illustrates a cross-sectional view of a capacitor device 70 according to another example embodiment. FIG. 25 illustrates a perspective view of the capacitor device 70 of FIG. 24.

Referring to FIGS. 24 and 25, a first well 710 is formed in a substrate 700. Isolation layers 715 may be disposed in the substrate 700 and may be used to define active regions. The substrate 700 may have a first conductivity type. The first well 710 may have a second conductivity type. In the present embodiment, the first conductivity type is a P type, and the second conductivity type is an N type. In this regard, the substrate 700 is a P type substrate P-SUB, and the first well 710 is an N well N-WELL. However, embodiments are not limited thereto. In according embodiment, the first conductivity type may be the N type, and the second conductivity type may be the P type. In this regard, the substrate 700 is an N type substrate, and the first well 710 is a P well.

A plurality of gate structures 720 may be disposed over the substrate 700 and the first well 710. The gate structures 720 may each include a gate insulation layer 723 and a gate electrode 726 that are sequentially formed.

In the present embodiment, a gap D1 between the gate electrode 726 disposed over the substrate 700 and the gate electrode 726 disposed over the first well 710 may be smaller than a gap D2 between the gate electrodes 726 disposed over the substrate 700. The gap D1 between the gate electrode 726 disposed over the substrate 700 and the gate electrode 726 disposed over the first well 710 may be smaller than a gap D3 between the gate electrodes 726 disposed over the first well 710. Furthermore, the gap D2 between the gate electrodes 726 disposed over the substrate 700 may be substantially the same as the gap D3 between the gate electrodes 726 disposed over the first well 710.

A first impurity region 730 may be disposed between the two gate electrodes 720 disposed over the substrate 700, and may include second conductivity type impurities. A second impurity region 735 may be disposed between the two gate electrodes 720 disposed over the first well 710, and may include first conductivity type impurities.

In the present embodiment, since the first conductivity type is the P type, and the second conductivity type is the N type, the first impurity region 730 may be an N type impurity region, and the second impurity region 735 may be a P type impurity region. Further, although one first impurity region 730 is disposed in the substrate 700 and one second impurity region 735 is disposed in the first well 710 in the present embodiment, embodiments are not limited thereto. For example, in another embodiment, two or more impurity regions may be disposed in the substrate 700 or the first well 710.

A first conductive layer 750 including first through fourth wirings 750a, 750b, 750c, and 750d may be disposed on upper portions of the gate electrodes 726 and upper portions of the first and second impurity regions 730 and 735. For example, the first wirings 750a, respectively, may be disposed on the upper portions of the gate electrodes 726 disposed over the substrate 700, the second wirings 750b, respectively, may be disposed on the upper portions of the gate electrodes 726 disposed over the first well 710, and the third wirings 750c, respectively, may be disposed on the upper portions of the first and second impurity regions 730 and 735. The first, second, and third wirings 750a, 750b, and 750c may be connected to the gate electrodes 726, the first impurity region 730, and the second impurity region 735 through first contact plugs 740. The fourth wirings 750d over the substrate 700 may be disposed between the first and third wirings 750a and 750c on an upper portion of the substrate 700, and the fourth wirings 750d over the first well 710 may be disposed between the second and third wirings 750b and 750c over an upper portion of the first well 710. In this regard, the fourth wirings 750d are not electrically connected to the gate electrodes 726. In the present embodiment, gaps between the first through fourth wirings 750a, 750b, 750c, and 750d may be substantially the same.

In the present embodiment, a first voltage may be applied to the first wirings 750a and the third wiring 750c disposed on the upper portion of the substrate 700 and the fourth wirings 750d disposed over the upper portion of the first well 710. A second voltage may be applied to the second wirings 750b and the third wiring 750c disposed over the first well 710 and the fourth wirings 750d disposed over the upper portion of the substrate 700. In the present embodiment, the first voltage may be a positive voltage (+), and the second voltage may be a negative voltage (−). Hereinafter, the first voltage is referred to as the positive voltage (+), and the second voltage is referred to as the negative voltage (−). However, embodiments are not limited thereto. For example, in another embodiment, the first voltage may be a negative voltage (−), and the second voltage may be a positive voltage (+).

Referring to FIG. 24, the negative voltage (−) may be applied to the substrate 700, and the positive voltage (+) may be applied to the first well 710. The positive voltage (+) may be applied to the first impurity region 730, and the negative voltage (−) may be applied to the second impurity region 735. The positive voltage (+) may be applied to the gate electrodes 726 disposed on the substrate 700, and the negative voltage (−) may be applied to the gate electrodes 726 disposed over the first well 710.

Therefore, since different voltages may be applied to the substrate 700 and the first well 710, a first junction capacitor may be formed. Furthermore, since different voltages may be applied to the first impurity region 730 and the substrate 700 adjacent to, a second junction capacitor may be formed, and since different voltages may be applied to the second impurity region 735 and the first well 710 adjacent to the second impurity region 735, a third junction capacitor may be formed.

Further, since different voltages may be applied to the substrate 700 and the gate electrodes 726 disposed over the substrate 700, and the gate insulation layers 723 are disposed therebetween, a first MOS capacitor may be formed. Further, since different voltages may be applied to the first well 710 and the gate electrodes 726 disposed over the first well 710, and the gate insulation layers 723 are disposed therebetween, a second MOS capacitor may be formed.

Since different voltages may be applied to the gate electrodes 726 disposed over the first well 710 and the gate electrodes 726 disposed over the substrate 700, and an insulation material may exist therebetween, a first MIM capacitor may be formed. Since different voltages may be applied to adjacent two wirings among the first through the fourth wirings 750a, 750b, 750c, and 750d, and an insulation material may exist therebetween, a second MIM capacitor may be formed.

Therefore, the capacitance of the capacitor device 70 may include the sum of the capacitances of the first through third junction capacitors, the first and second MOS capacitors, and the first and second MIM capacitors. Unlike the capacitor device 20 of FIG. 8, the capacitor device 70 of the present embodiment forms only the first well 710 in the substrate 700 and applies different voltages to the substrate 700 and the first well 710, thereby reducing a process of forming a well.

In another embodiment, the first conductive layer 750 of the capacitor device 70 may not include the fourth wiring 750d. In this regard, the capacitor device 70 may realize the MOS capacitors by using an accumulation mode or an inversion mode, and may adjust voltages applied to the third wirings 750c according to a mode.

In another embodiment, the gate structures 720 of the capacitor device 70 may each include at least two deposited gate electrodes. In this regard, the at least two gate electrodes may include upper gate electrodes and lower gate electrodes. Thus, the capacitor device 70 can further obtain capacitances between the upper gate electrodes and the lower gate electrodes and capacitances between adjacent upper gate electrodes in the same area without having to provide room for an additional capacitor.

In another embodiment, at least one MIM capacitor may be disposed on an upper portion of the first conductive layer 750 of the capacitor device 70. Thus, the capacitor device 70 can further obtain a capacitance of the MIM capacitor in the same area.

In another embodiment, at least one upper conductive layer that is electrically connected to the first conductive layer 750 may be further disposed on the upper portion of the first conductive layer 750 of the capacitor device 70. Thus, the capacitor device 70 can further obtain capacitances between wirings included in the upper conductive layer in the same area.

In another embodiment, at least one upper conductive layer that is electrically insulated from the first conductive layer 750 may be further disposed on the upper portion of the first conductive layer 750 of the capacitor device 70. Thus, the capacitor device 70 can further obtain capacitances between wirings included in the upper conductive layer and capacitances between wirings included in the upper conductive layer that are adjacent above and below each other included in the first conductive layer 750, in the same area.

By way of summation and review, electromagnetic interference (EMI) or variation of a power voltage, i.e., power noise, may occur, which seriously affects reliability of products. To solve such problems, a capacitor element may be inserted between a power wiring and a ground wiring. A metal-oxide-silicon (MOS) capacitor may be used as the capacitor element. The capacitor device according to embodiments may be included in a peripheral circuit and used as, for example, a power stabilization capacitor or an EMI improvement capacitor. Thus, the capacitor device can reduce EMI and power noise problems, thereby increasing reliability of products. A capacitor device according to embodiments may greatly increase capacitances obtained in the same area, and at a low cost.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A capacitor device having a plurality of capacitances, the capacitor device comprising:
    a substrate including a first well and a second well, the first well having a first conductivity type and having a first voltage applied thereto, and the second well having a second conductivity type and having a second voltage applied thereto; and
    a plurality of gate electrodes including at least one first gate electrode and at least one second electrode, the at least one first gate electrode disposed on an upper portion of the first well such that the at least one first gate electrode is insulated from the first well, and the at least second gate electrode disposed on an upper portion of the second well such that the at least one second gate electrode is insulated from the second well,
    wherein the plurality of capacitances includes a first capacitance, a second capacitance, and a third capacitance, the first capacitance being between the first well and the second well, the second capacitance being between the first well or the second well and the gate electrode, and the third capacitance being between the at least one first gate electrode and the at least one second gate electrode.

2. The capacitor device as claimed in claim 1, wherein the at least one first gate electrode has the second voltage applied thereto, and
    the at least one second gate electrode has the first voltage applied thereto.

3. The capacitor device as claimed in claim 1, wherein:
    the at least one first gate electrode includes at least two first gate electrodes, and the at least one second gate electrode includes at least two second gate electrodes, and
    a gap between the at least one second gate electrode and the at least one first gate electrode is smaller than a gap between the at least two first gate electrodes and is smaller than a gap between the at least two second gate electrodes.

4. The capacitor device as claimed in claim 1, further comprising a first conductive layer, the first conductive layer including at least one first wiring electrically connected to the at least one first gate electrode and at least one second wiring electrically connected to the at least one second gate electrode,
    wherein the plurality of capacitances includes the first through third capacitances and a fourth capacitance, the fourth capacitance being between the at least one first wiring and the at least one second wiring.

5. The capacitor device as claimed in claim 4, further comprising:
    a first impurity region disposed in the first well and having the second conductivity type; and
    a second impurity region disposed in the second well and having the first conductivity type.

6. The capacitor device as claimed in claim 5, wherein:
    the second voltage is applied to the first impurity region and the first voltage is applied to the second impurity region, and
    the plurality of capacitances includes the first through fourth capacitances and a fifth capacitance, the fifth capacitance being a sum of a capacitance between the first well and the first impurity region and a capacitance between the second well and the second impurity region.

7. The capacitor device as claimed in claim 6, wherein:
    the first conductive layer further includes a plurality of third wirings electrically connected to the first and second impurity regions, respectively, and
    a gap between the at least one second wiring and the at least one first wiring is smaller than a gap between the at least one first wiring or the at least one second wiring and one of the plurality of third wirings which is adjacent to the at least one first wiring or the at least one second wiring.

8. The capacitor device as claimed in claim 5, wherein:
    the first voltage is applied to the first impurity region and the second voltage is applied to the second impurity region, and
    the plurality of capacitances includes the first through fourth capacitances.

9. The capacitor device as claimed in claim 8, wherein:
    the first conductive layer further includes a plurality of third wirings electrically connected to the first and second impurity regions, respectively, and
    the plurality of capacitances includes the first through fourth capacitances, the fourth capacitance being a sum of the capacitance between the at least one first wiring and the at least one second wiring and a capacitance between the at least one first wiring or the at least one second wiring and the plurality of third wirings.

10. The capacitor device as claimed in claim 9, wherein a gap between the at least one second wiring and the at least one first wiring is substantially the same as a gap between the at least one first wiring or the at least one second wiring and one of the plurality of third wirings which is adjacent to the at least one first wiring or the at least one second wiring.

11. The capacitor device as claimed in claim 5, wherein the first conductive layer includes:
    a plurality of third wirings electrically connected to the first and second impurity regions, respectively; and
    a plurality of fourth wirings disposed on upper portions of the at least one first gate electrode and the at least one second gate electrode such that the plurality of fourth wirings is insulated from the at least one first gate electrode and the at least one second gate electrode.

12. The capacitor device as claimed in claim 11, wherein:
    the second voltage is applied to the first impurity region and the first voltage is applied to the second impurity region, and
    the plurality of capacitances includes the first through fourth capacitances and a fifth capacitance, the fourth capacitance being a sum of the capacitance between the at least one first wiring and the at least one second wiring and a capacitance between one of the at least one first wiring, the at least one second wiring, and the plurality of third wirings, and the plurality of fourth wirings, and the fifth capacitance being a sum of a capacitance between the first well and the first impurity region and a capacitance between the second well and the second impurity region.

13. The capacitor device as claimed in claim 11, wherein:
the first voltage is applied to the first impurity region and the second voltage is applied to the second impurity region, and
the plurality of capacitances includes the first through fourth capacitances, the fourth capacitance being a sum of the capacitance between the at least one first wiring and the at least one second wiring and a capacitance between the at least one first wiring or the at least one second wiring and the plurality of third wirings.

14. The capacitor device as claimed in claim 11, wherein gaps between adjacent two wirings among the at least one first wiring, the at least one second wiring, the plurality of third wirings, and the plurality of fourth wirings are substantially the same.

15. The capacitor device as claimed in claim 4, further comprising at least one metal-insulator-metal (MIM) capacitor disposed on an upper portion of the first conductive layer,
wherein the plurality of capacitances includes the first through fourth capacitances and a sixth capacitance, the sixth capacitance being a capacitance of the at least one MIM capacitor.

16. The capacitor device as claimed in claim 15, wherein the at least one MIM capacitor includes:
a plurality of lower metal lines electrically connected to the first conductive layer;
a plurality of insulation layers disposed on the plurality of lower metal lines; and
a plurality of upper metal lines disposed on the plurality of insulation layers.

17. The capacitor device as claimed in claim 16, wherein:
the at least one MIM capacitor includes two MIM capacitors, and
the plurality of capacitances includes the first through fourth capacitances, the sixth capacitance, and a seventh capacitance, the seventh capacitance being a sum of a capacitance between the plurality of lower metal lines included in each of the two MIM capacitors and a capacitance between the plurality of upper metal lines.

18. The capacitor device as claimed in claim 17, further comprising a plurality of third wirings disposed on upper portions of the two MIM capacitors and electrically connected to the plurality of lower metal lines and the plurality of upper metal lines, respectively,
wherein the plurality of capacitances includes the first through fourth capacitances, the sixth and seventh capacitances, and an eighth capacitance, the eighth capacitance being between the plurality of third wirings.

19. The capacitor device as claimed in claim 4, further comprising a second conductive layer disposed on an upper portion of the first conductive layer and including the plurality of third wirings electrically connected to the at least one first wiring and the at least one second wiring, respectively,
wherein the plurality of capacitances includes the first through fourth capacitances and a ninth capacitance, the ninth capacitance being between the plurality of third wirings.

20. The capacitor device as claimed in claim 4, further comprising a second conductive layer disposed on the first conductive layer and including the plurality of third wirings electrically insulated from the at least one first wiring and the at least one second wiring, respectively,
wherein the plurality of capacitances includes the first through fourth capacitances and a tenth capacitance, the tenth capacitance being a sum of a capacitance between the plurality of third wirings and a capacitance between the at least one first wiring or the at least one second wiring and one of the plurality of third wirings which is below and above the at least one first wiring or the at least one second wiring.

21. The capacitor device as claimed in claim 1, wherein:
the substrate has the second conductivity type, and the second well is disposed in the first well, and
the plurality of capacitances includes the first capacitance, the second capacitance, and a twelfth capacitance, the twelfth capacitance being between the substrate and the first well.

22. The capacitor device as claimed in claim 1, wherein the capacitor device is a power stabilization capacitor or an electromagnetic interference (EMI) improvement capacitor.

23. The capacitor device as claimed in claim 1, wherein:
the plurality of gate electrodes includes:
at least one first upper gate electrode disposed on an upper portion of the at least one first gate electrode and having the first voltage applied thereto; and
at least one second upper gate electrode disposed on an upper portion of the at least one second gate electrode and having the second voltage applied thereto, and
the plurality of capacitances includes the first through third capacitances and an eleventh capacitance, the eleventh capacitance being a sum of a capacitance between the at least one first gate electrode and the at least one first upper gate electrode and a capacitance between the at least one second gate electrode and the at least one second upper gate electrode.

24. A capacitor device having a plurality of capacitances, the capacitor device comprising:
a substrate, the substrate having a first conductivity type and having a first voltage applied thereto;
a first well disposed in the substrate, the first well having a second conductivity type and having a second voltage applied thereto; and
a plurality of gate electrodes including at least one first gate electrode and at least one second electrode, the at least one first gate electrode disposed on an upper portion of the substrate such that the at least one first gate electrode is insulated from the substrate, and the at least one second gate electrode disposed on an upper portion of the first well such that the at least one second gate electrode is insulated from the first well,
wherein the plurality of capacitances includes a first capacitance, a second capacitance, and a third capacitance, the first capacitance being between the substrate and the first well, the second capacitance being between the substrate or the first well and the gate electrode, and the third capacitance being between the at least one first gate electrode and the at least one second gate electrode.

25. The capacitor device as claimed in claim 24, wherein:
the at least one first gate electrode has the second voltage applied thereto, and
the at least one second gate electrode has the first voltage applied thereto.

26. The capacitor device as claimed in claim 24, wherein:
the at least one first gate electrode includes at least two first gate electrodes, and the at least one second gate electrode includes at least two second gate electrodes, and
a gap between the at least one second gate electrode and the at least one first gate electrode is smaller than a gap between the at least two first gate electrodes and is smaller than a gap between the at least two second gate electrodes.

27. The capacitor device as claimed in claim 24, further comprising a first conductive layer, the first conductive layer including at least one first wiring electrically connected to the at least one first gate electrode and at least one second wiring electrically connected to the at least one second gate electrode,
  wherein the plurality of capacitances includes the first through third capacitances and a fourth capacitance, the fourth capacitance being between the at least one first wiring and the at least one second wiring.

28. The capacitor device as claimed in claim 27, further comprising:
  a first impurity region disposed in the substrate and having the second conductivity type; and
  a second impurity region disposed in the first well and having the first conductivity type.

29. The capacitor device as claimed in claim 28, wherein:
  the second voltage is applied to the first impurity region and the first voltage is applied to the second impurity region, and
  the plurality of capacitances includes the first through fourth capacitances and a fifth capacitance, the fifth capacitance being a sum of a capacitance between the first well and the first impurity region and a capacitance between the first well and the second impurity region.

30. The capacitor device as claimed in claim 29, wherein:
  the first conductive layer further includes a plurality of third wirings electrically connected to the first and second impurity regions, respectively, and
  a gap between the at least one second wiring and the at least one first wiring is smaller than a gap between the at least one first wiring or the at least one second wiring and one of the plurality of third wirings which is adjacent to the at least one first wiring or the at least one second wiring.

31. The capacitor device as claimed in claim 28, wherein:
  the first voltage is applied to the first impurity region and the second voltage is applied to the second impurity region, and
  the plurality of capacitances includes the first through fourth capacitances.

32. The capacitor device as claimed in claim 31, wherein:
  the first conductive layer further includes a plurality of third wirings electrically connected to the first and second impurity regions, respectively, and
  the plurality of capacitances includes the first through fourth capacitances, the fourth capacitance being a sum of the capacitance between the at least one first wiring and the at least one second wiring and a capacitance between the at least one first wiring or the at least one second wiring and one of the plurality of third wirings which is adjacent to the at least one first wiring or the at least one second wiring.

33. The capacitor device as claimed in claim 32, wherein a gap between the at least one second wiring and the at least one first wiring is substantially the same as a gap between the at least one first wiring or the at least one second wiring and one of the plurality of third wirings which is adjacent to the at least one first wiring or the at least one second wiring.

34. The capacitor device as claimed in claim 28, wherein the first conductive layer includes:
  a plurality of third wirings electrically connected to the first and second impurity regions, respectively; and
  a plurality of fourth wirings disposed on upper portions of the at least one first gate electrode and the at least one second gate electrode in such a way that the plurality of fourth wirings is insulated from the at least one first gate electrode and the at least one second gate electrode.

35. The capacitor device as claimed in claim 34, wherein:
  the second voltage is applied to the first impurity region and the first voltage is applied to the second impurity region, and
  the plurality of capacitances includes the first through fourth capacitances and a fifth capacitance, the fourth capacitance being a sum of the capacitance between the at least one first wiring and the at least one second wiring and a capacitance between one of the at least one first wiring, the at least one second wiring, and the plurality of third wirings, and the plurality of fourth wirings, and the fifth capacitance being a sum of a capacitance between the substrate and the first impurity region and a capacitance between the first well and the second impurity region.

36. The capacitor device as claimed in claim 34, wherein:
  the first voltage is applied to the first impurity region and the second voltage is applied to the second impurity region, and
  the plurality of capacitances includes the first through fourth capacitances, the fourth capacitance being a sum of the capacitance between the at least one first wiring and the at least one second wiring and a capacitance between the at least one first wiring or the at least one second wiring and one of the plurality of third wirings which is adjacent to the at least one first wiring or the at least one second wiring.

37. The capacitor device as claimed in claim 34, wherein gaps between adjacent two wirings among the at least one first wiring, the at least one second wiring, the plurality of third wirings, and the plurality of fourth wirings are substantially the same.

38. The capacitor device as claimed in claim 27, further comprising at least one metal-insulator-metal (MIM) capacitor disposed on an upper portion of the first conductive layer,
  wherein the plurality of capacitances includes the first through fourth capacitances and a sixth capacitance, the sixth capacitance being a capacitance of the at least one MIM capacitor.

39. The capacitor device as claimed in claim 38, wherein the at least one MIM capacitor includes:
  a plurality of lower metal lines electrically connected to the first conductive layer;
  a plurality of insulation layers disposed on the plurality of lower metal lines; and
  a plurality of upper metal lines disposed on the plurality of insulation layers.

40. The capacitor device as claimed in claim 39, wherein:
  the at least one MIM capacitor includes two MIM capacitors, and
  the plurality of capacitances includes the first through fourth capacitances, the sixth capacitance, and a seventh capacitance, the seventh capacitance being a sum of a capacitance between the plurality of lower metal lines included in each of the two MIM capacitors and a capacitance between the plurality of upper metal lines.

41. The capacitor device as claimed in claim 40, further comprising a plurality of third wirings disposed on upper portions of the two MIM capacitors and electrically connected to the plurality of lower metal lines and the plurality of upper metal lines, respectively,
  wherein the plurality of capacitances includes the first through fourth capacitances, the sixth and seventh capacitances, and an eighth capacitance, the eighth capacitance being between the plurality of third wirings.

42. The capacitor device as claimed in claim 27, further comprising a second conductive layer disposed on the first conductive layer and including the plurality of third wirings electrically connected to the at least one first wiring and the at least one second wiring, respectively, wherein the plurality of capacitances includes the first through fourth capacitances and a ninth capacitance, the ninth capacitance being between the plurality of third wirings.

43. The capacitor device as claimed in claim 27, further comprising a second conductive layer disposed on the first conductive layer and including the plurality of third wirings electrically insulated from the at least one first wiring and the at least one second wiring, respectively, wherein the plurality of capacitances includes the first through fourth capacitances and a tenth capacitance, the tenth capacitance being a sum of a capacitance between the plurality of third wirings and a capacitance between the at least one first wiring or the at least one second wiring and one of the plurality of third wirings which is below and above the at least one first wiring or the at least one second wiring.

44. The capacitor device as claimed in claim 24, wherein the capacitor device is a power stabilization capacitor or an EMI improvement capacitor.

45. The capacitor device as claimed in claim 24, wherein:
the plurality of gate electrodes includes:
at least one first upper gate electrode disposed on an upper portion of the at least one first gate electrode and having the first voltage applied thereto; and
at least one second upper gate electrode disposed on an upper portion of the at least one second gate electrode and having the second voltage applied thereto, and
the plurality of capacitances includes the first through third capacitances and an eleventh capacitance, the eleventh capacitance being a sum of a capacitance between the at least one first gate electrode and the at least one first upper gate electrode and a capacitance between the at least one second gate electrode and the at least one second upper gate electrode.

46. A method of fabricating a capacitor device having a plurality of capacitances, the method comprising:
forming a first well and a second well in a substrate, the first well having a first conductivity type and the second well having a second conductivity type;
forming first and second gate electrodes on an upper portion of the first well and an upper portion of the second well, respectively, such that the first and second gate electrodes are insulated from the first well and the second well, respectively; and
forming connections for a first voltage to be applied to the first well, and forming connections for a second voltage to be applied to the second well,
wherein the plurality of capacitances includes a first capacitance, a second capacitance, and a third capacitance, the first capacitance being between the first well and the second well, the second capacitance being a sum of a capacitance between the first well and the first gate electrode and a capacitance between the second well and the second gate electrodes, and the third capacitance being between the first gate electrodes and the second gate electrodes.

47. The method as claimed in claim 46, further comprising forming a first conductive layer, the first conductive layer including a plurality of first wirings electrically connected to the first gate electrodes and a plurality of second wirings electrically connected to the second gate electrodes, wherein the plurality of capacitances includes the first through third capacitances and a fourth capacitance, the fourth capacitance being between the plurality of first wirings and the plurality of second wirings.

48. The method as claimed in claim 47, further comprising:
forming a first impurity region having the second conductivity type in the first well; and
forming a second impurity region having the first conductivity type in the second well.

49. The method as claimed in claim 48, further comprising forming a connection for the second voltage to be applied to the first impurity region, and a connection for the first voltage to be applied to the second impurity region, wherein the plurality of capacitances includes the first through fourth capacitances and a fifth capacitance, the fifth capacitance being a sum of a capacitance between the first well and the first impurity region and a capacitance between the second well and the second impurity region.

50. The method as claimed in claim 48, further comprising forming a connection for the first voltage to be applied to the first impurity region, and a connection for the second voltage to be applied to the second impurity region, wherein the plurality of capacitances includes the first through fourth capacitances.

51. The method as claimed in claim 48, wherein the forming of the first conductive layer includes forming a plurality of third wirings electrically connected to the plurality of first and second wirings and the first and second impurity regions, respectively, and forming a plurality of fourth wirings in upper portions of the first gate electrodes and the second gate electrodes in such a way that the plurality of fourth wirings is insulated from the first gate electrodes and the second gate electrodes.

52. The method as claimed in claim 47, further comprising forming at least one metal-insulator-metal (MIM) capacitor on an upper portion of the first conductive layer, wherein the plurality of capacitances includes the first through fourth capacitances and a sixth capacitance, the sixth capacitance being a capacitance of the at least one MIM capacitor.

53. The method as claimed in claim 47, further comprising forming a second conductive layer on an upper portion of the first conductive layer, the second conductive layer including the plurality of third wirings electrically connected to the plurality of first wirings and the plurality of second wirings, respectively, wherein the plurality of capacitances includes the first through fourth capacitances and a seventh capacitance, the seventh capacitance being between the plurality of third wirings.

54. The method as claimed in claim 47, further comprising forming a second conductive layer on the upper portion of the first conductive layer, the second conductive layer including the plurality of third wirings electrically insulated from the plurality of first wirings and the plurality of second wirings, respectively, wherein the plurality of capacitances includes the first through fourth capacitances and an eighth capacitance, the eighth capacitance being a sum of a capacitance between the plurality of third wirings and a capacitance between the at least one first wiring or the at least one second wiring and one of the plurality of third wirings which is below and above the plurality of first wirings or the plurality of second wirings.

55. The method as claimed in claim 46, wherein:
the substrate has the second conductivity type, and the second well is disposed in the first well, and the plurality of capacitances includes the first through third capacitances and a tenth capacitance, the tenth capacitance being between the substrate and the first well.

56. The method as claimed in claim 46, further comprising:
forming a plurality of first upper gate electrodes on upper portions of the plurality of first gate electrodes;
forming a plurality of second upper gate electrodes on upper portions of the plurality of second gate electrodes; and
forming connections for the first voltage to be applied to the plurality of first upper gate electrodes, and forming connections for the second voltage to be applied to the plurality of second upper gate electrodes,
wherein the plurality of capacitances includes the first through third capacitances and a ninth capacitance, the ninth capacitance being a sum of a capacitance between the plurality of first gate electrodes and the plurality of first upper gate electrodes and a capacitance between the plurality of second gate electrodes and the plurality of second upper gate electrodes.

57. A method of fabricating a capacitor device having a plurality of capacitances, the method comprising:
providing a substrate having a first conductivity type;
forming a first well having a second conductivity type in the substrate;
forming a plurality of first and second gate electrodes on an upper portion of the substrate and on an upper portion of the first well in such a way that the plurality of first and second gate electrodes are insulated from the substrate and the first well; and
forming connections for a first voltage to be applied to the substrate, and forming connections for a second voltage to be applied to the first well,
wherein the plurality of capacitances includes a first capacitance, a second capacitance, and a third capacitance, the first capacitance being between the substrate and the first well, the second capacitance being a sum of a capacitance between the substrate and the plurality of first gate electrodes and a capacitance between the first well and the plurality of second gate electrodes, and the third capacitance being between the plurality of first and second gate electrodes.

58. The method as claimed in claim 57, further comprising forming a first conductive layer, the first conductive layer including a plurality of first wirings electrically connected to the plurality of first gate electrodes and a plurality of second wirings electrically connected to the plurality of second gate electrodes,
wherein the plurality of capacitances includes the first through third capacitances and a fourth capacitance, the fourth capacitance being between the plurality of first wirings and the plurality of second wirings.

59. The method as claimed in claim 58, further comprising:
forming a first impurity region having the second conductivity type in the first well; and
forming a second impurity region having the first conductivity type in the second well.

60. A semiconductor device, comprising:
a first power line configured to provide a first voltage;
a second power line configured to provide a second voltage different from the first voltage, the first power line and the second power line having a capacitance therebetween provided by a capacitor structure, the capacitor structure being configured to receive the first and second voltages from the first power line and the second power line, respectively, the capacitor structure including:
a first junction capacitor formed between a first well and a second well, the first well being disposed in a semiconductor substrate and the second well being disposed in the first well, the first well being a first conductivity type, the semiconductor substrate being a second conductivity type opposite to the first conductivity type, and the second well being the second conductivity type, the first well receiving the first voltage and the second well receiving the second voltage;
a second junction capacitor formed between the semiconductor substrate and the first well, the semiconductor substrate receiving the second voltage;
a third junction capacitor formed between a first impurity region and the first well, the first impurity region being the second conductivity type and being disposed in the first well, the first impurity region receiving the second voltage;
a fourth junction capacitor formed between a second impurity region and the second well, the second impurity region being the first conductivity type and being disposed in the second well, the second impurity region receiving the first voltage;
a first MOS capacitor formed between the first well and a first gate electrode disposed on the first well, the first MOS capacitor including an insulation layer interposed between the first well and the first gate electrode so as to insulate therebetween; and
a second MOS capacitor formed between the second well and a second gate electrode disposed on the second well, the second MOS capacitor including an insulation layer interposed between the second well and the second gate electrode so as to insulate therebetween,
wherein the capacitance includes the sum of capacitances of the first junction capacitor, the second junction capacitor, the third junction capacitor, the fourth junction capacitor, the first MOS capacitor, and the second MOS capacitor, and
wherein:
the capacitor structure further includes a first MIM capacitor, the first MIM capacitor being formed between the first gate electrode and the second gate electrode, an insulation layer being interposed between the first gate electrode and the second gate electrode so as to insulate therebetween, and
the capacitance includes the sum of capacitances of the first junction capacitor, the second junction capacitor, the third junction capacitor, the fourth junction capacitor, the first MOS capacitor, the second MOS capacitor, and the first MIM capacitor.

61. The semiconductor device as claimed in claim 60, wherein:
the capacitor structure further includes a second MIM capacitor, the second MIM capacitor being formed between a first wiring and a second wiring, the first wiring being disposed on a layer above the first gate electrode, the first wiring being electrically connected to the first gate electrode and receiving the second voltage, the second wiring being disposed on a layer above the second gate electrode, the second wiring being electrically connected to the second gate electrode and receiving the first voltage, and
the capacitance includes the sum of capacitances of the first junction capacitor, the second junction capacitor, the third junction capacitor, the fourth junction capacitor, the first MOS capacitor, the second MOS capacitor, the first MIM capacitor, and the second MIM capacitor.

* * * * *